(12) United States Patent
Kang et al.

(10) Patent No.: US 9,721,808 B2
(45) Date of Patent: Aug. 1, 2017

(54) METHODS OF FORMING SEMICONDUCTOR DEVICES INCLUDING CONTACT HOLES

(71) Applicants: Dae-Yong Kang, Suwon-si (KR); Eunsung Kim, Seoul (KR); Byungjun Jeon, Anyang-si (KR); Joonsoo Park, Seongnam-si (KR); Soonmok Ha, Hwaseong-si (KR)

(72) Inventors: Dae-Yong Kang, Suwon-si (KR); Eunsung Kim, Seoul (KR); Byungjun Jeon, Anyang-si (KR); Joonsoo Park, Seongnam-si (KR); Soonmok Ha, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/049,989

(22) Filed: Feb. 22, 2016

(65) Prior Publication Data
US 2016/0260632 A1    Sep. 8, 2016

(30) Foreign Application Priority Data
Mar. 2, 2015    (KR) .................. 10-2015-0029265

(51) Int. Cl.
*H01L 21/311*        (2006.01)
*H01L 21/033*        (2006.01)
(Continued)

(52) U.S. Cl.
CPC .... *H01L 21/31144* (2013.01); *H01L 21/0337* (2013.01); *H01L 21/76816* (2013.01);
(Continued)

(58) Field of Classification Search
CPC .......................... H01L 21/02; H01L 21/02356
See application file for complete search history.

(56) References Cited

U.S. PATENT DOCUMENTS

| | | |
|---|---|---|
| 8,486,611 B2 | 7/2013 | Millward et al. |
| 8,986,554 B2 | 3/2015 | Kim et al. |
| (Continued) | | |

FOREIGN PATENT DOCUMENTS

| | | |
|---|---|---|
| JP | 2012-108369 | 6/2012 |
| KR | 1020130124861 | 11/2013 |
| (Continued) | | |

*Primary Examiner* — Zandra Smith
*Assistant Examiner* — Andre' C Stevenson
(74) *Attorney, Agent, or Firm* — Myers Bigel, P.A.

(57) ABSTRACT

Methods of fabricating a semiconductor device are provided. The methods may include forming a stopper layer on a target layer including a cell area and an edge area, forming a hard mask including first upper openings and dam trench on the stopper layer, forming opening spacers on inner walls of the first upper openings and a dam pattern in the dam trench, removing the stopper layer exposed in the first upper openings to form first lower openings, forming pillar patterns in the first lower openings and the first upper openings and an eaves pattern on the dam pattern, removing the hard mask in the cell area, forming a first polymer block between the pillar patterns including second upper openings, etching the stopper layer exposed in the second upper openings to form second lower openings, and removing the first polymer block, the pillar patterns, the dam pattern and the eaves pattern.

20 Claims, 68 Drawing Sheets

(51) Int. Cl.
*H01L 21/768* (2006.01)
*H01L 27/11556* (2017.01)
*H01L 27/11582* (2017.01)
*H01L 27/108* (2006.01)

(52) U.S. Cl.
CPC ... *H01L 27/10847* (2013.01); *H01L 27/11556* (2013.01); *H01L 27/11582* (2013.01)

(56) References Cited

U.S. PATENT DOCUMENTS

| | | | |
|---|---|---|---|
| 2009/0092931 A1* | 4/2009 | Kang | G03F 7/038 430/323 |
| 2012/0127454 A1 | 5/2012 | Nakamura et al. | |
| 2015/0104946 A1 | 4/2015 | Park et al. | |
| 2016/0042965 A1 | 2/2016 | Ha et al. | |

FOREIGN PATENT DOCUMENTS

| | | |
|---|---|---|
| KR | 1020150042378 | 4/2015 |
| KR | 1020160019979 | 2/2016 |

\* cited by examiner

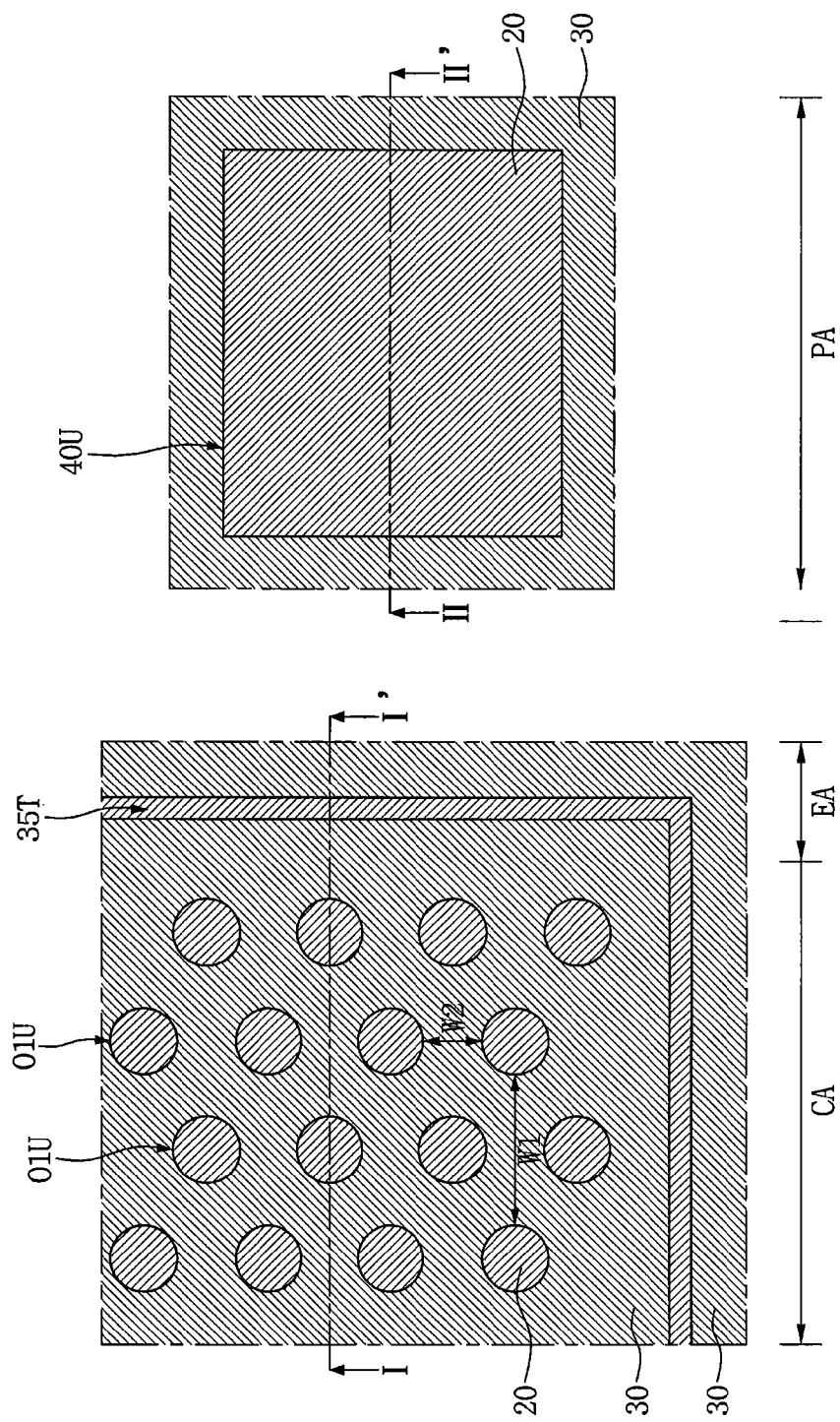

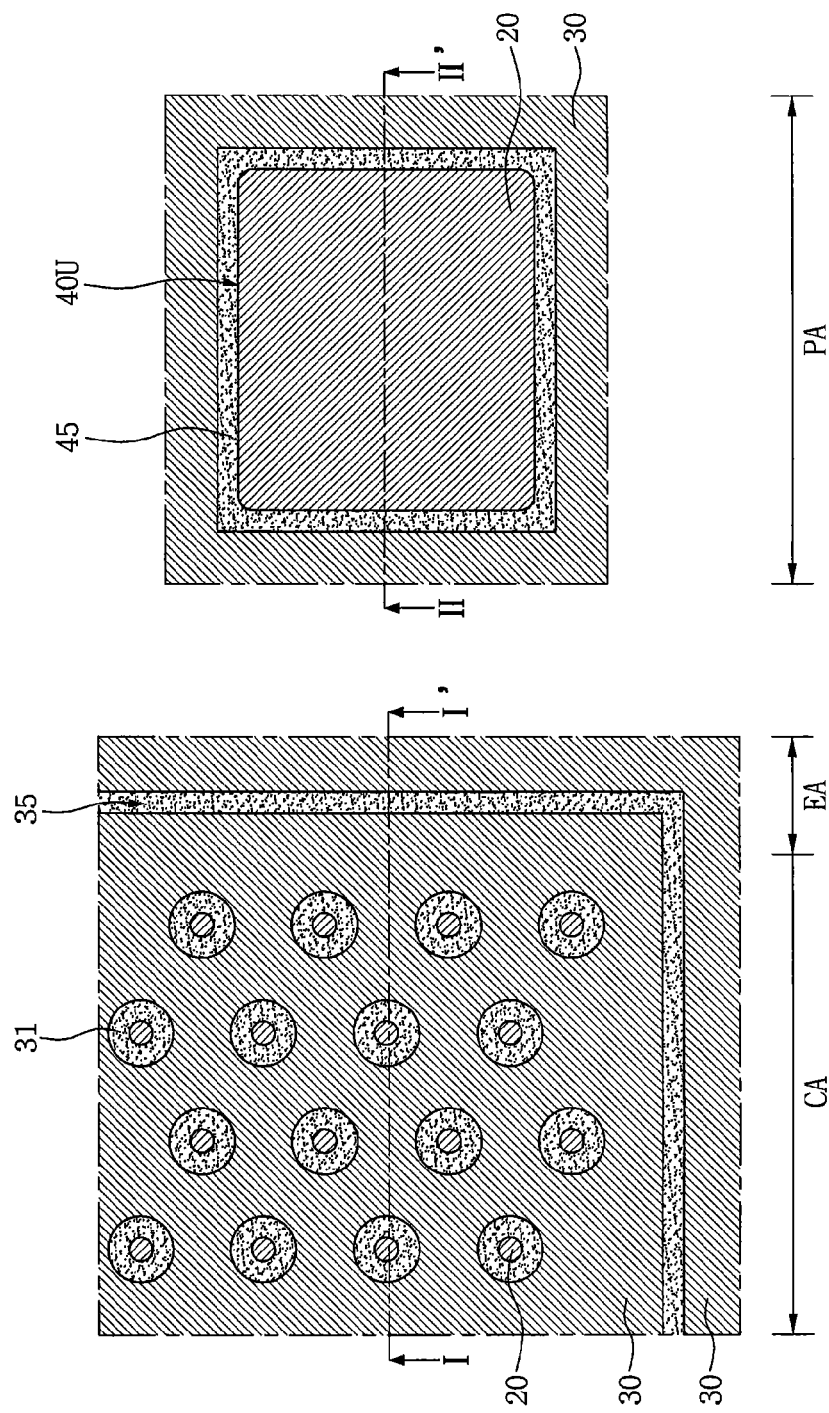

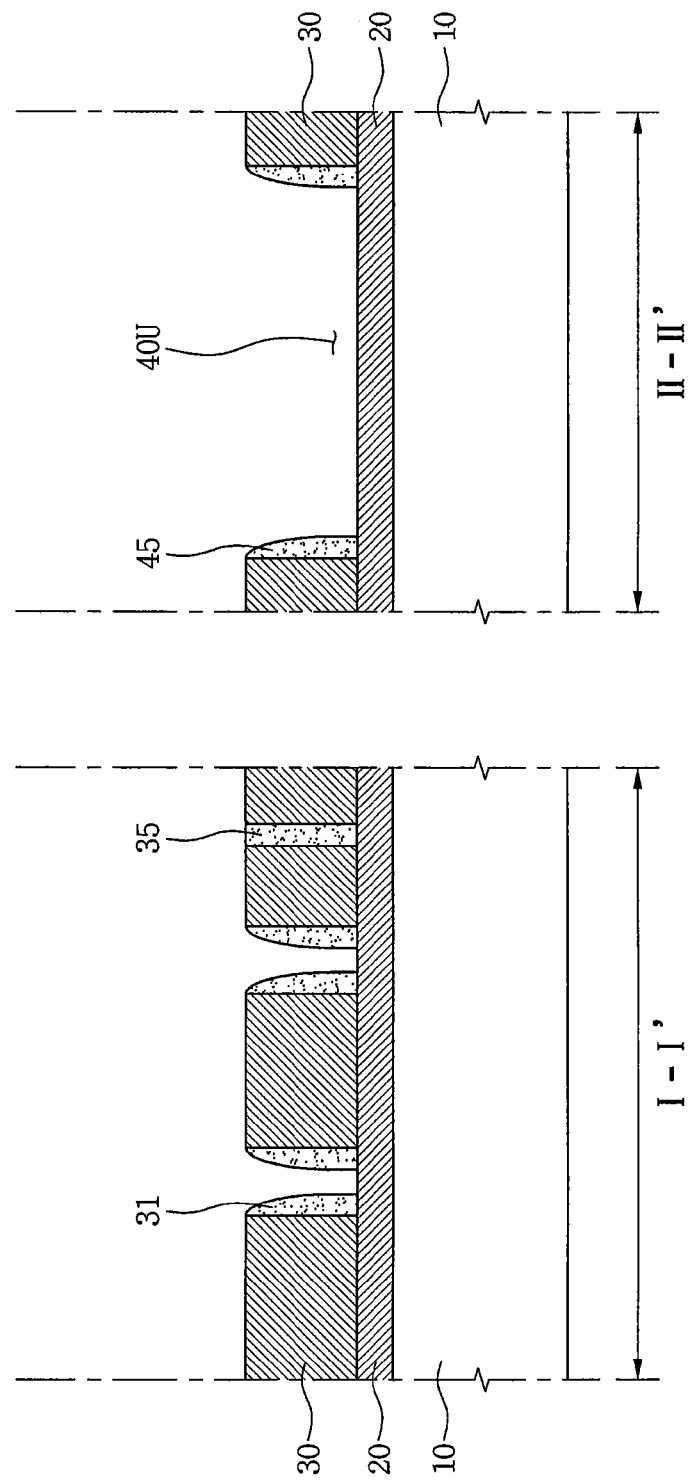

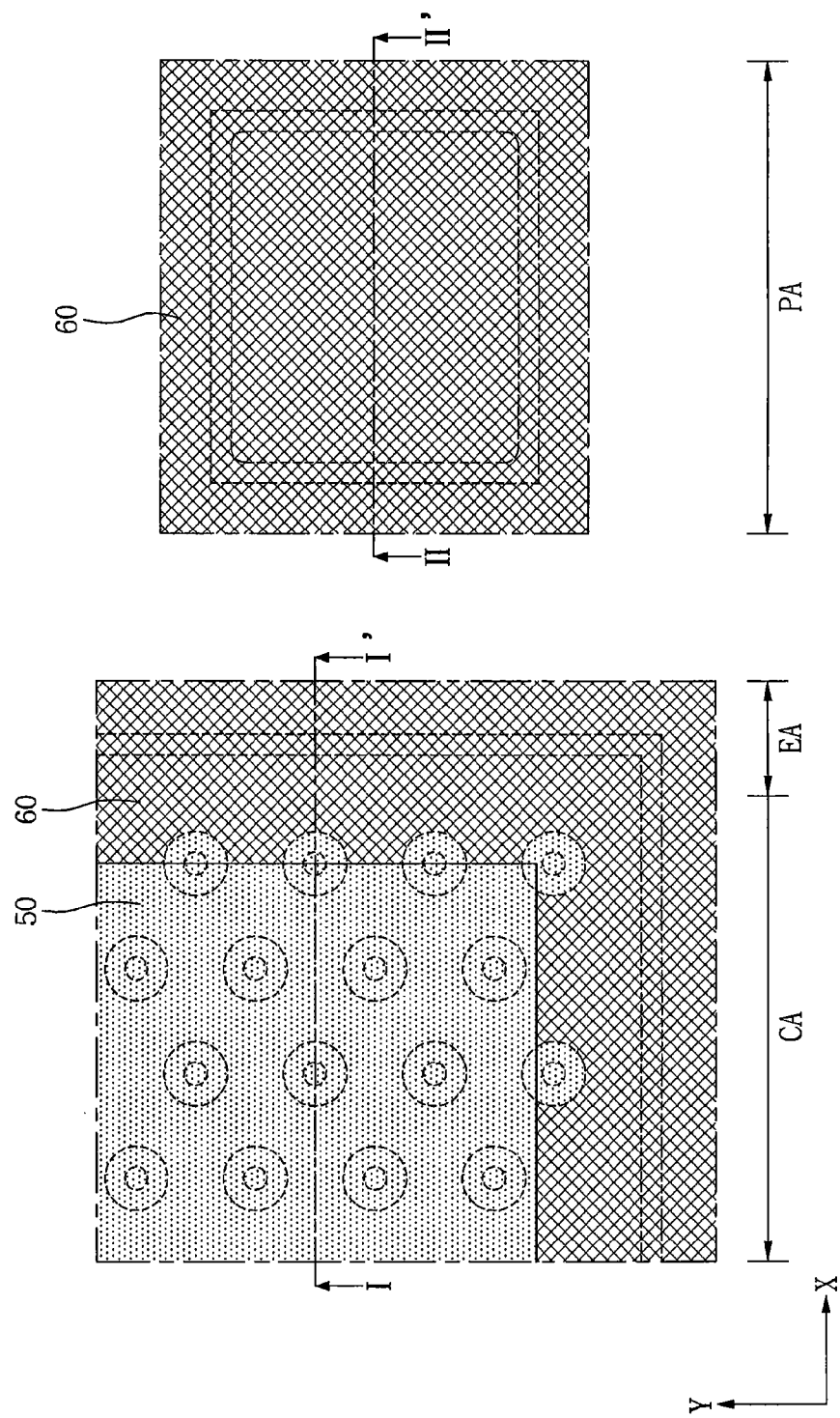

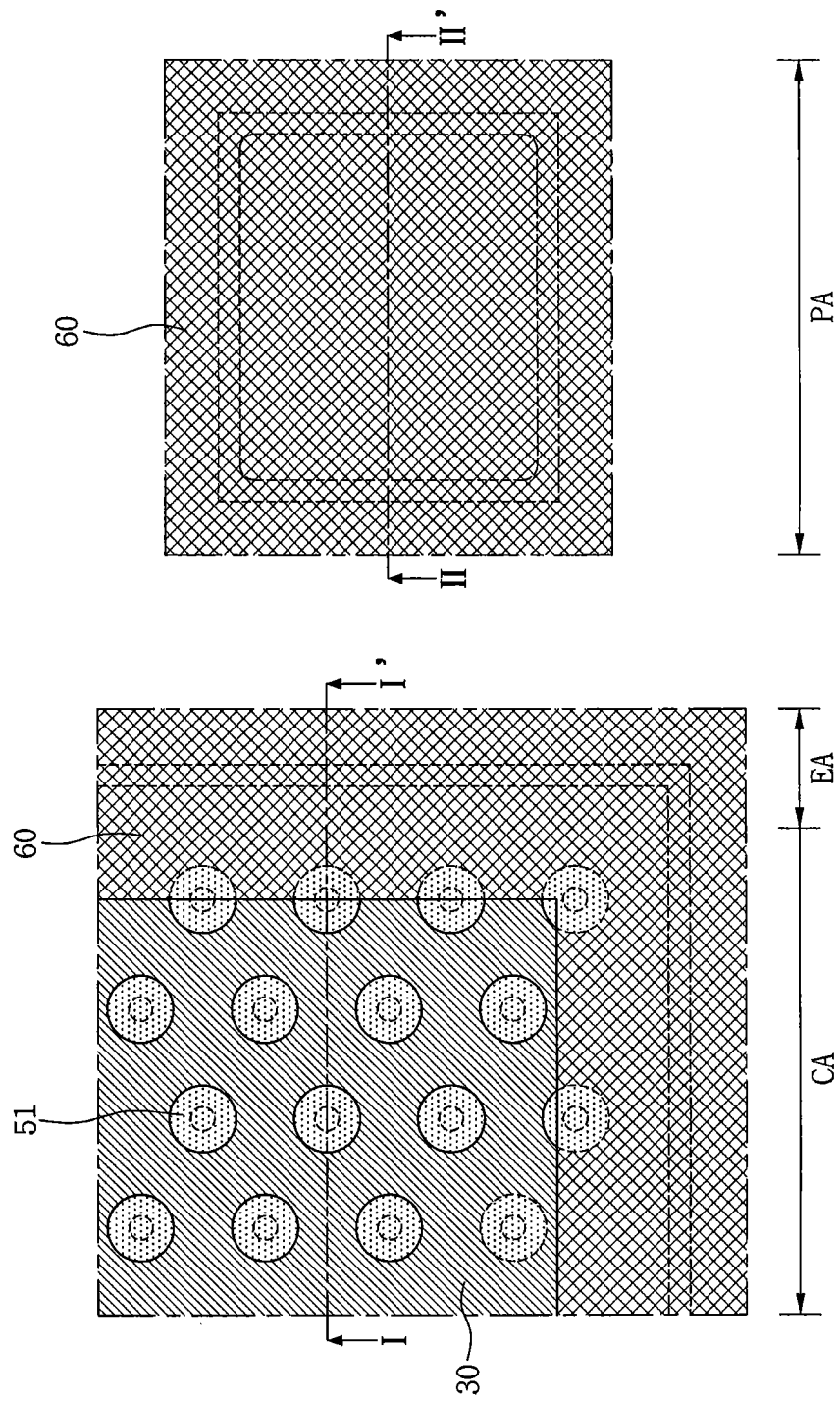

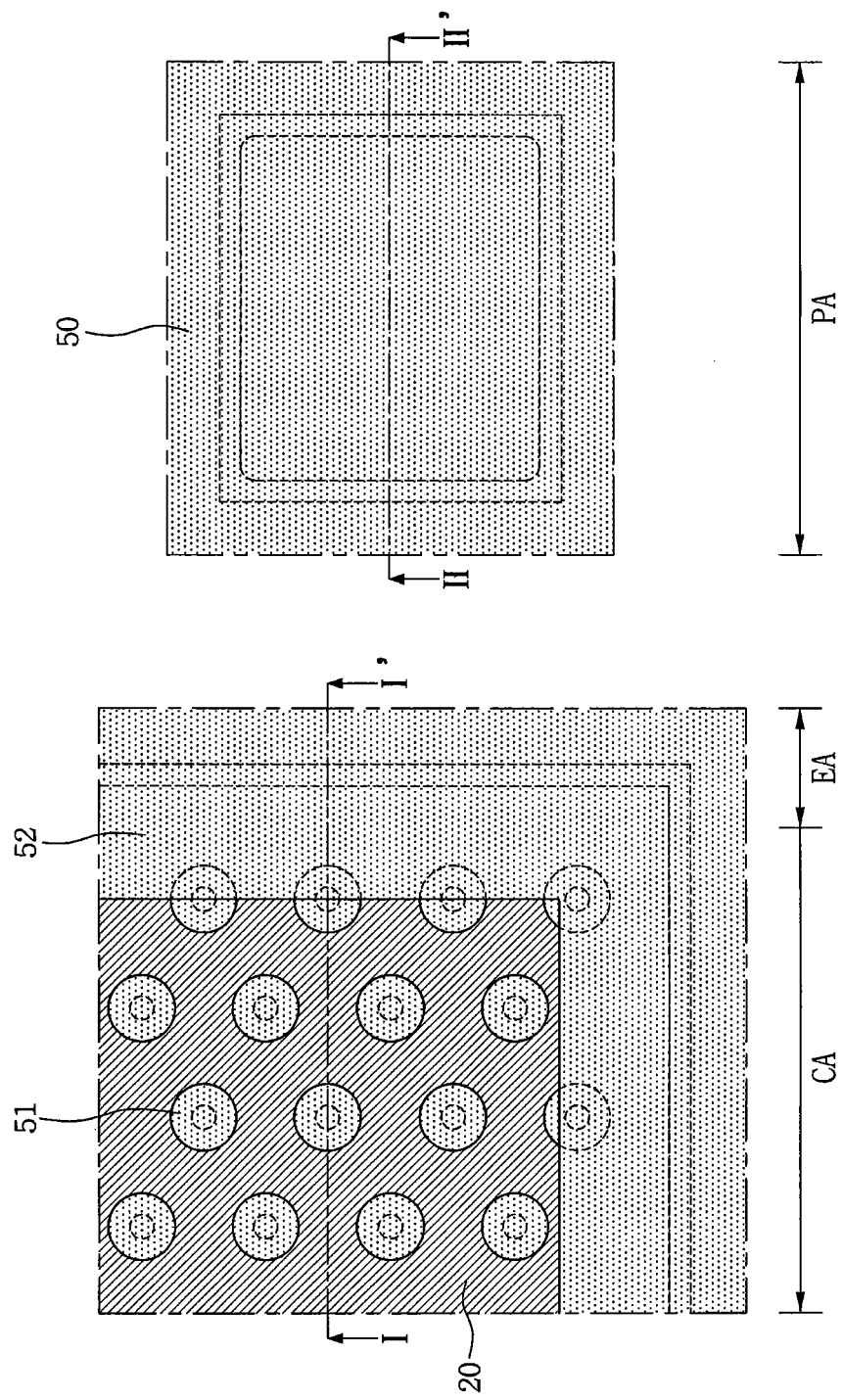

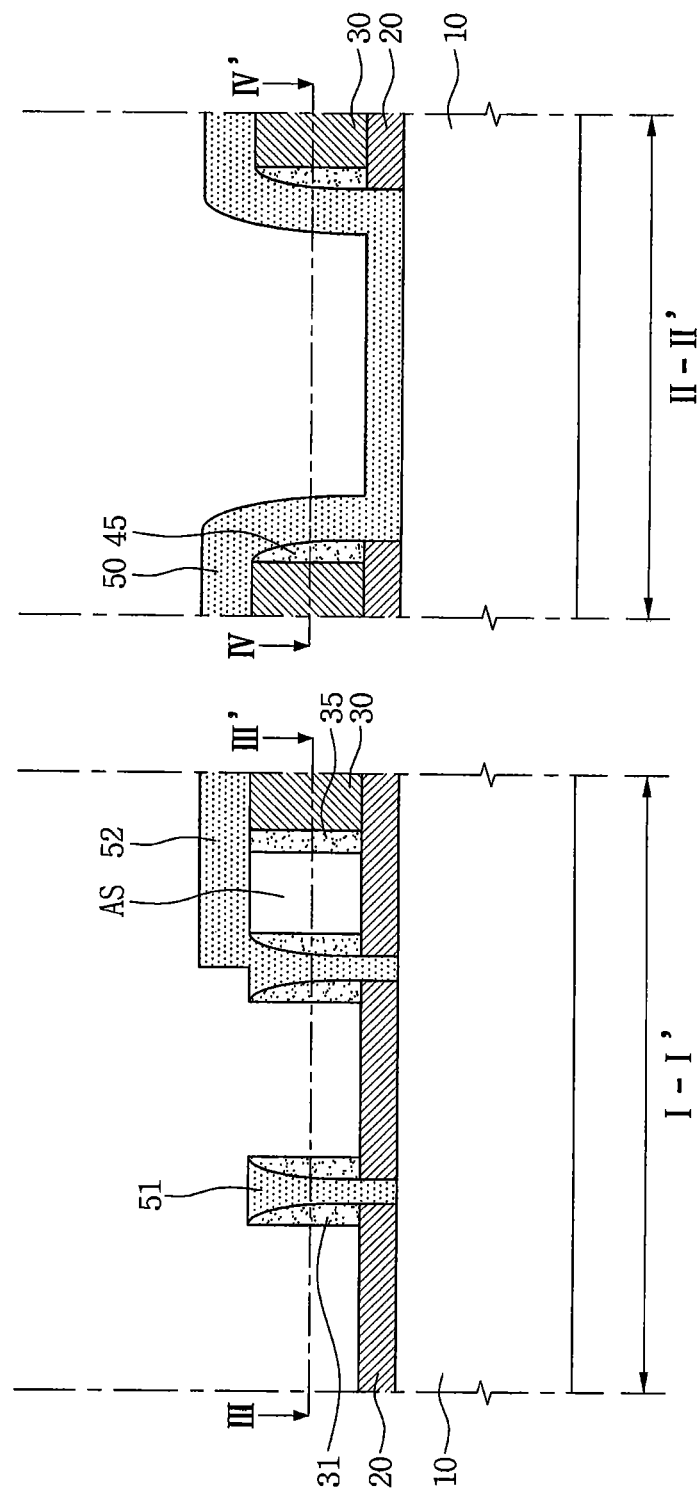

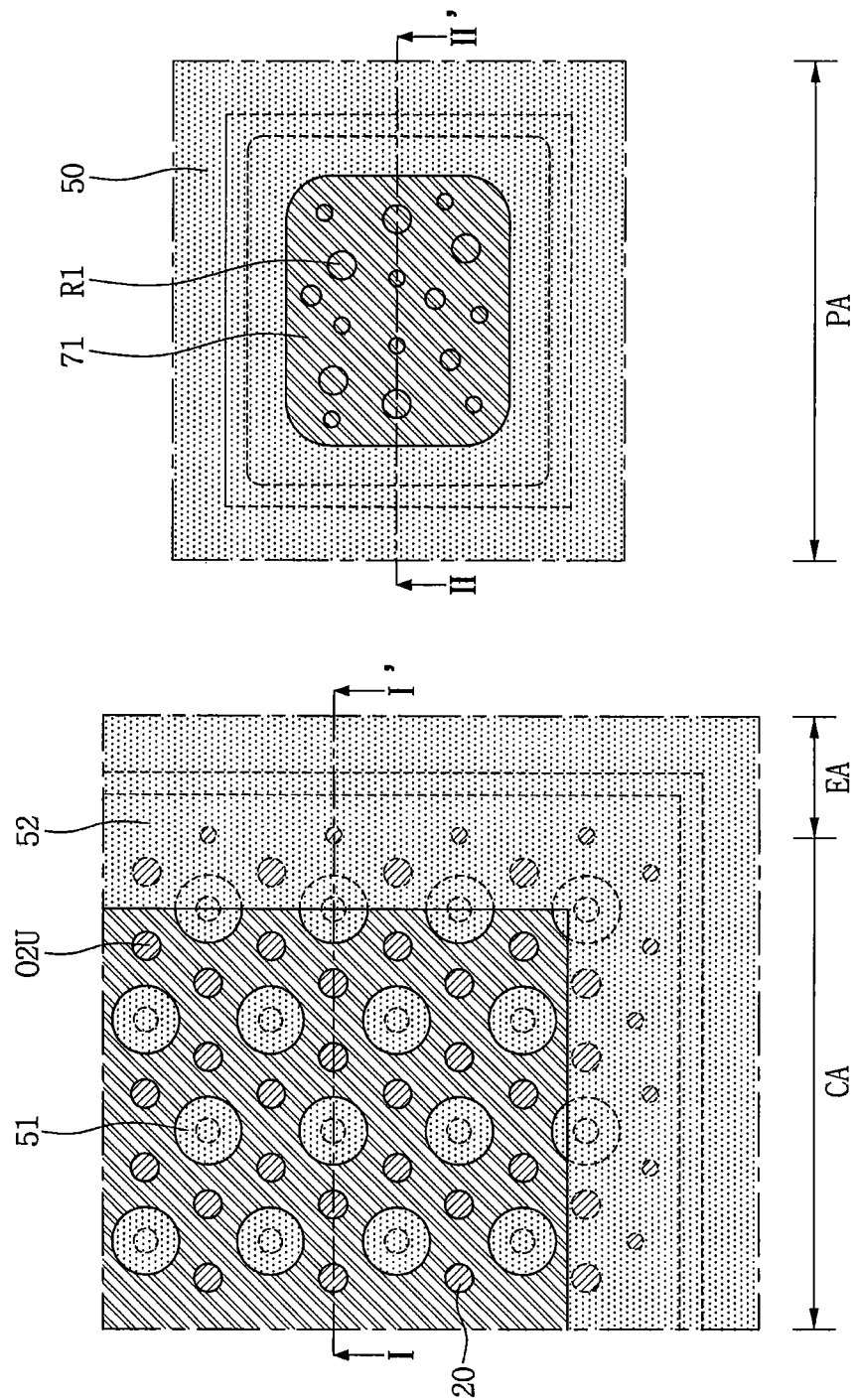

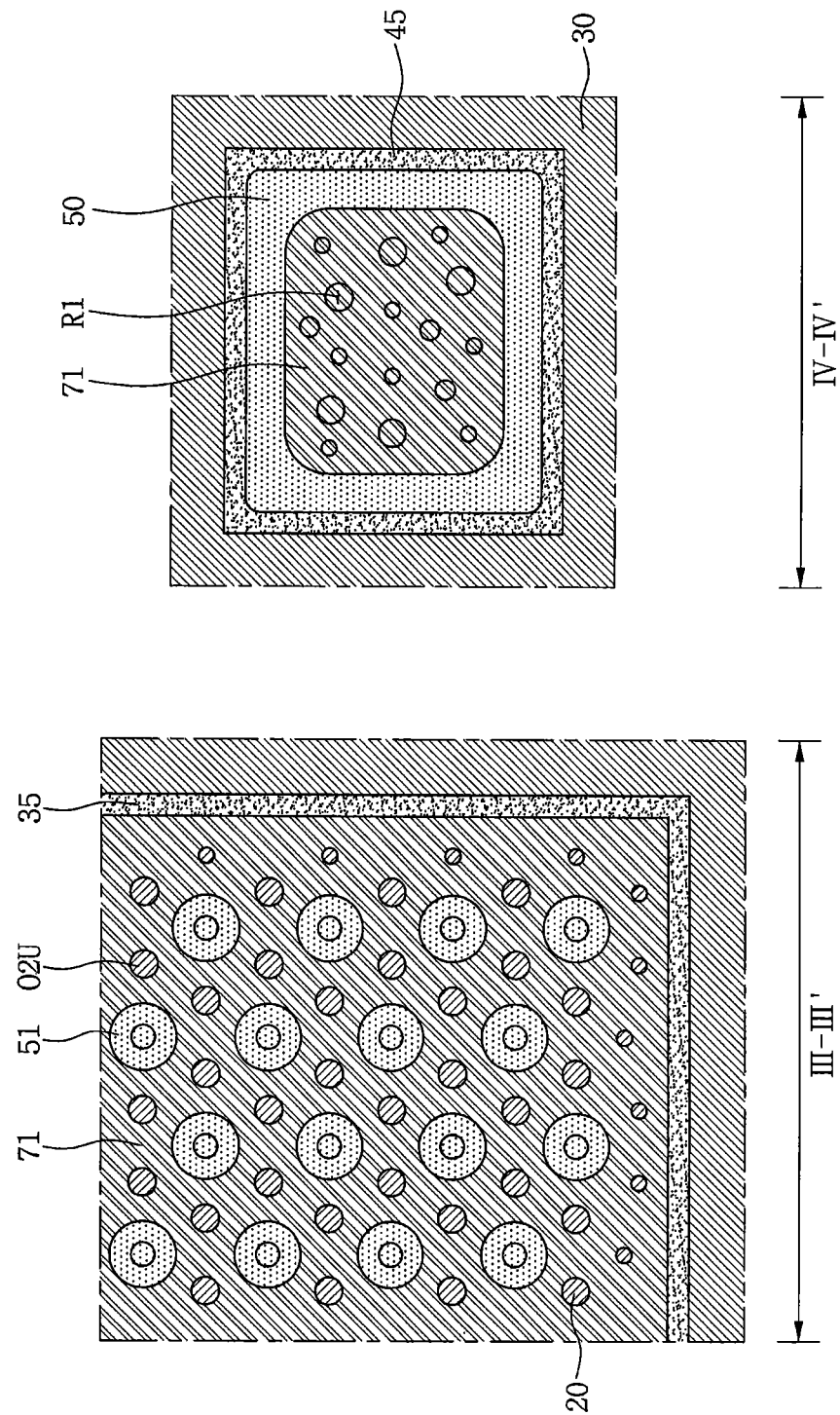

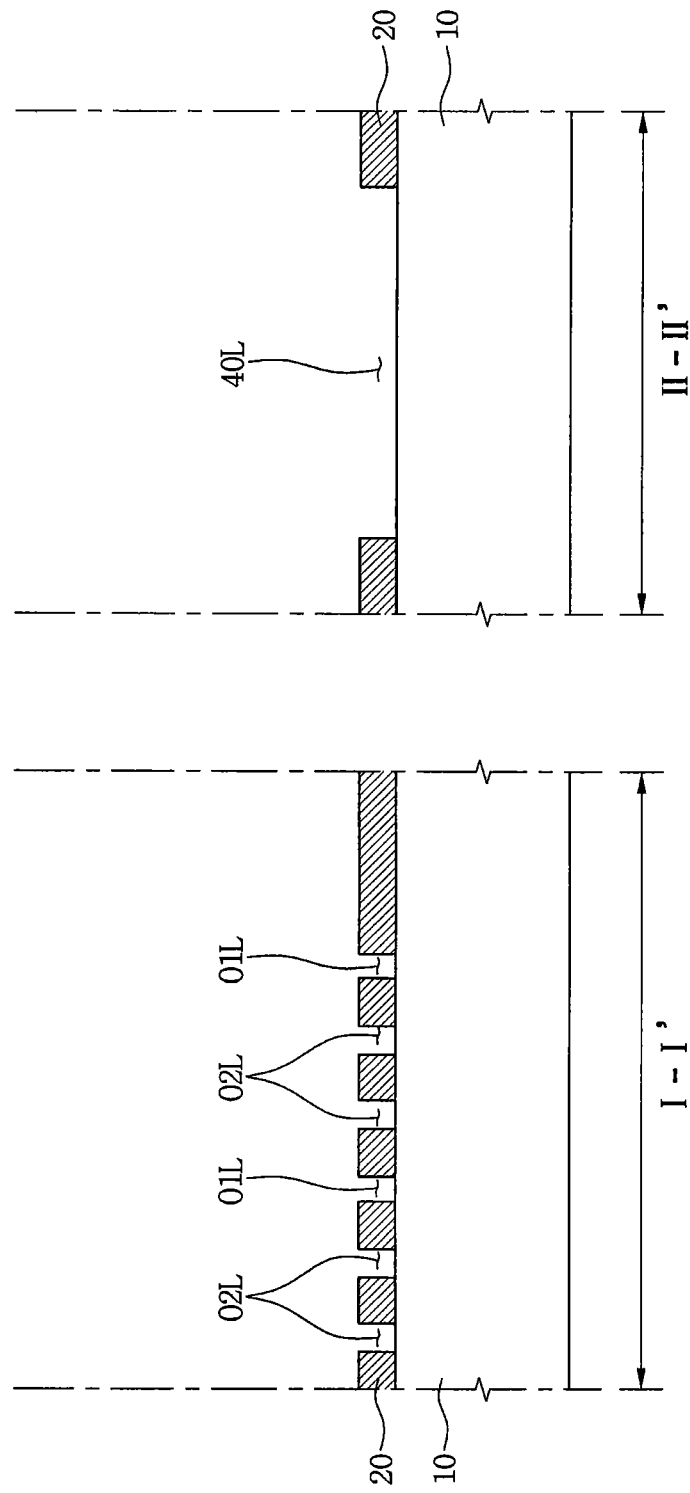

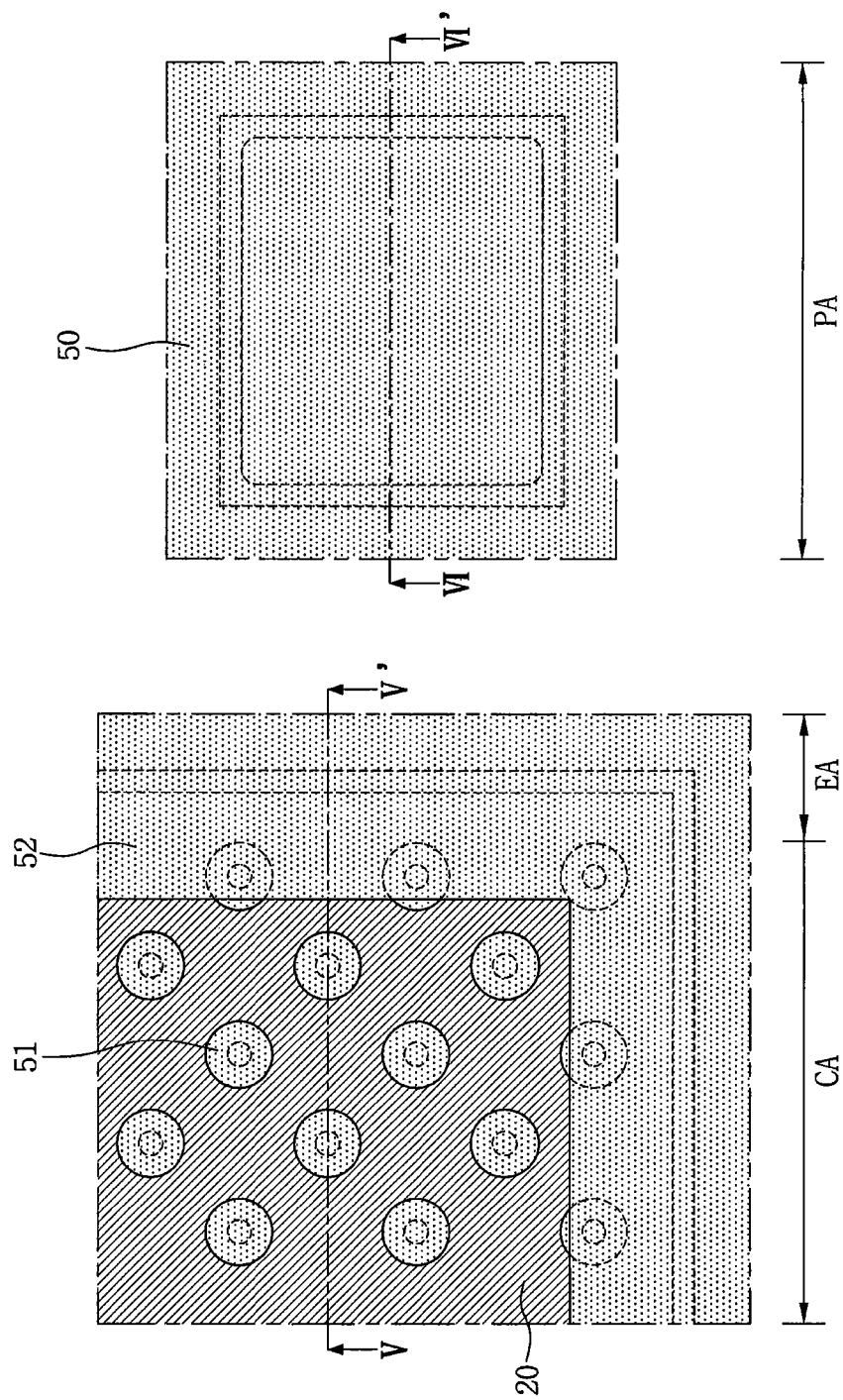

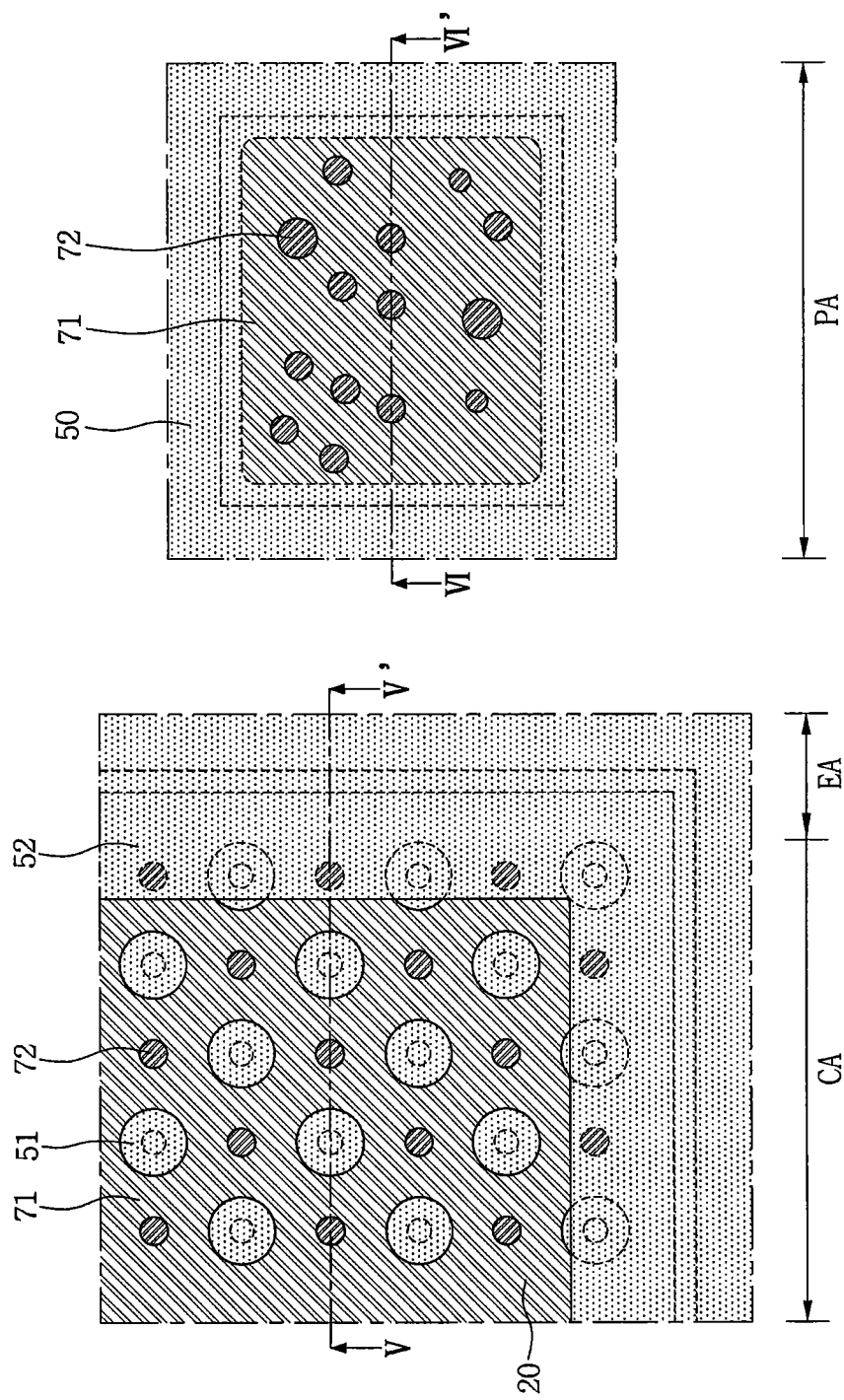

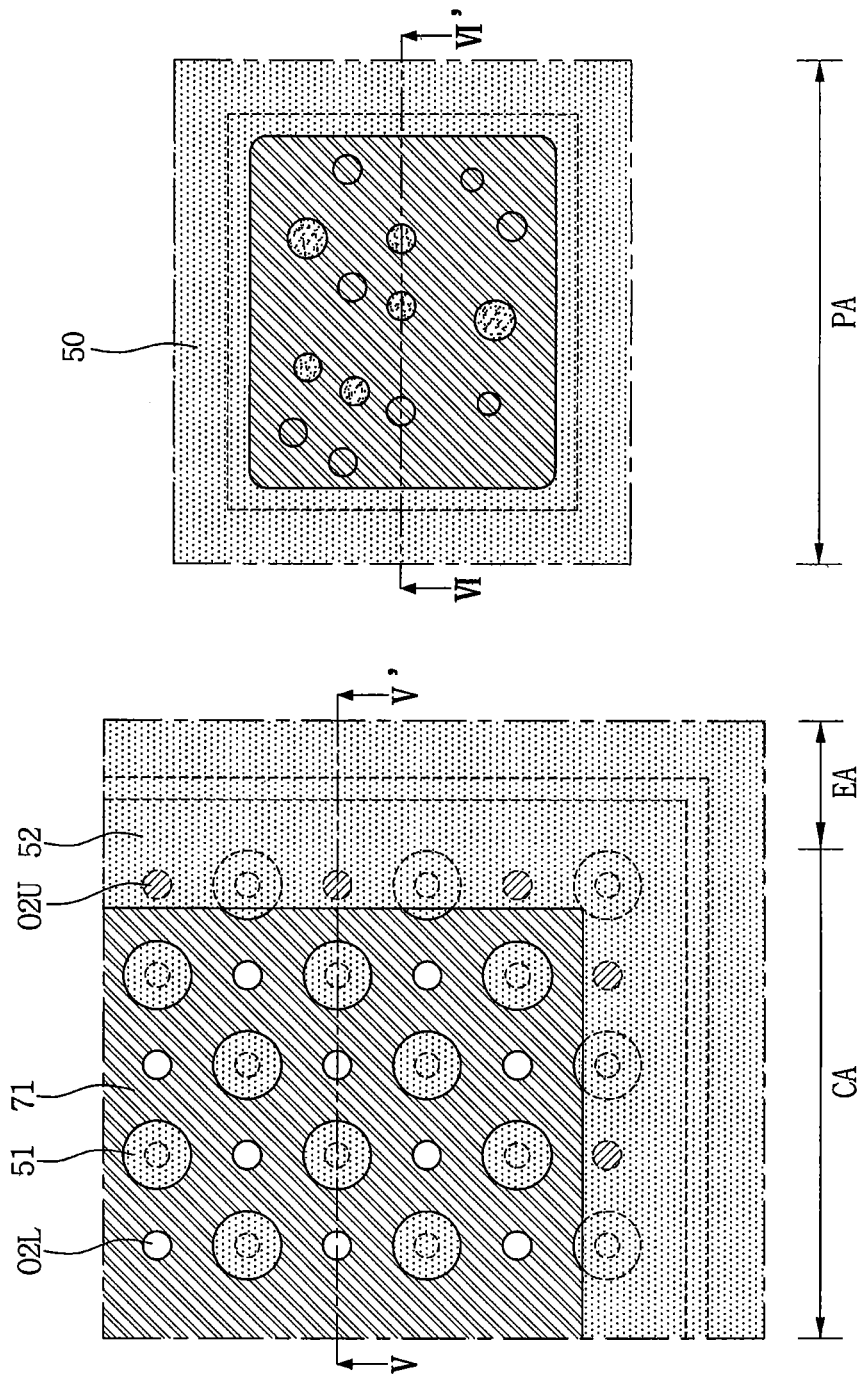

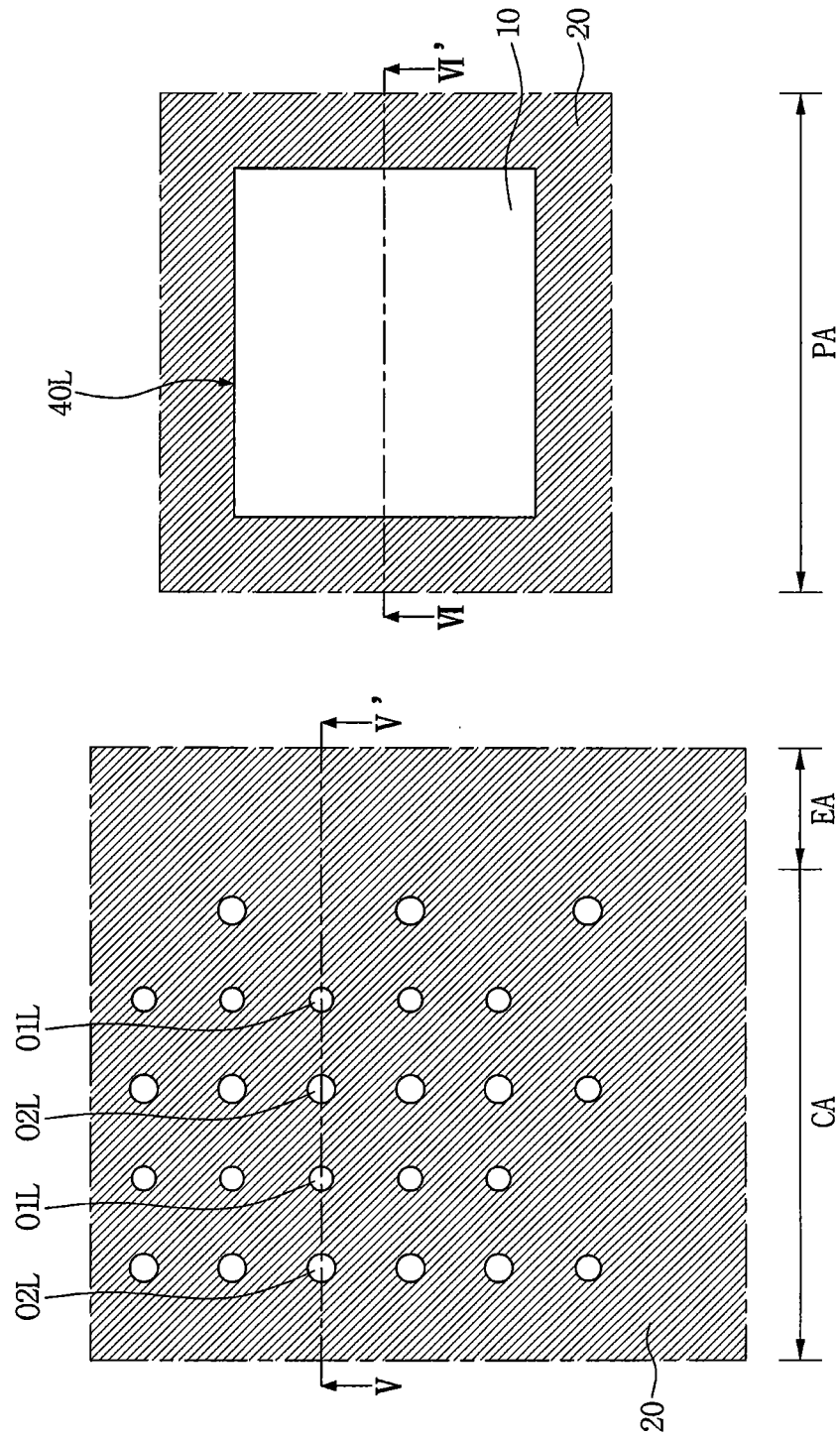

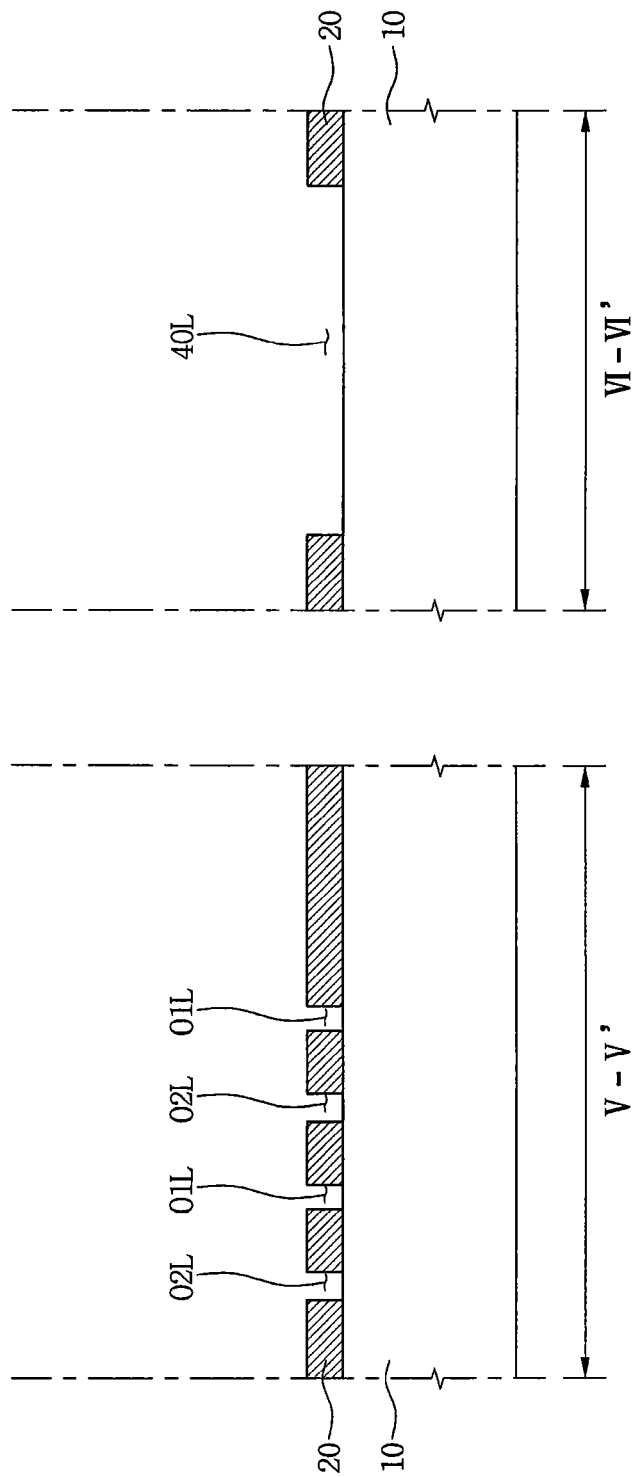

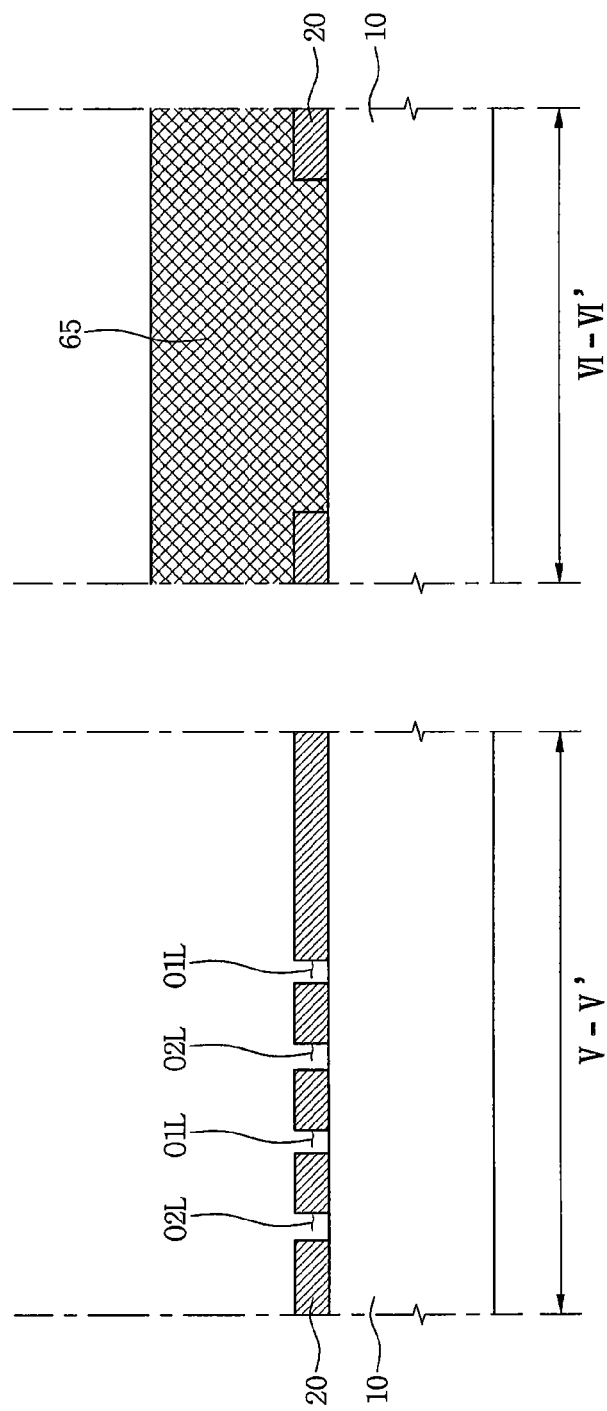

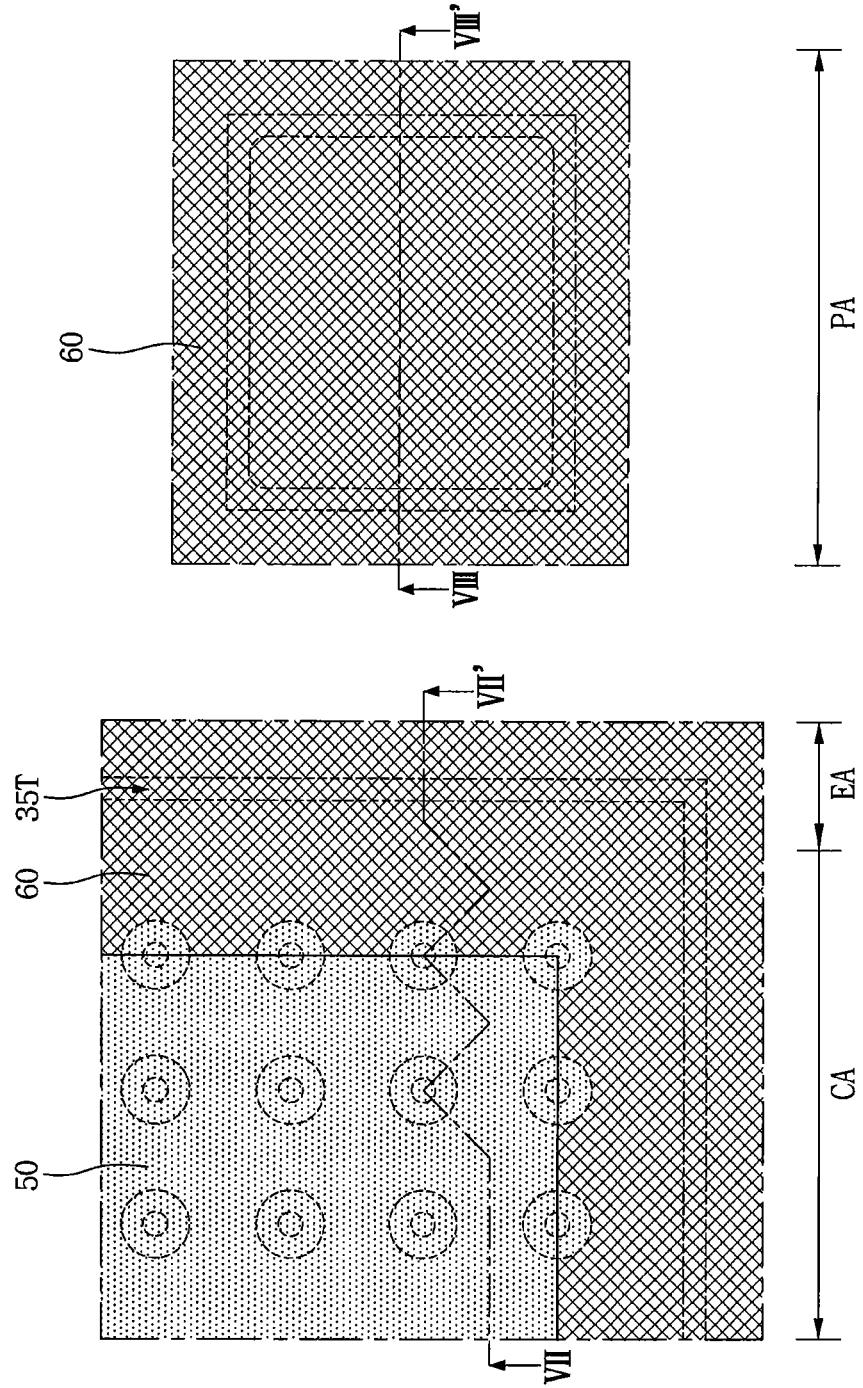

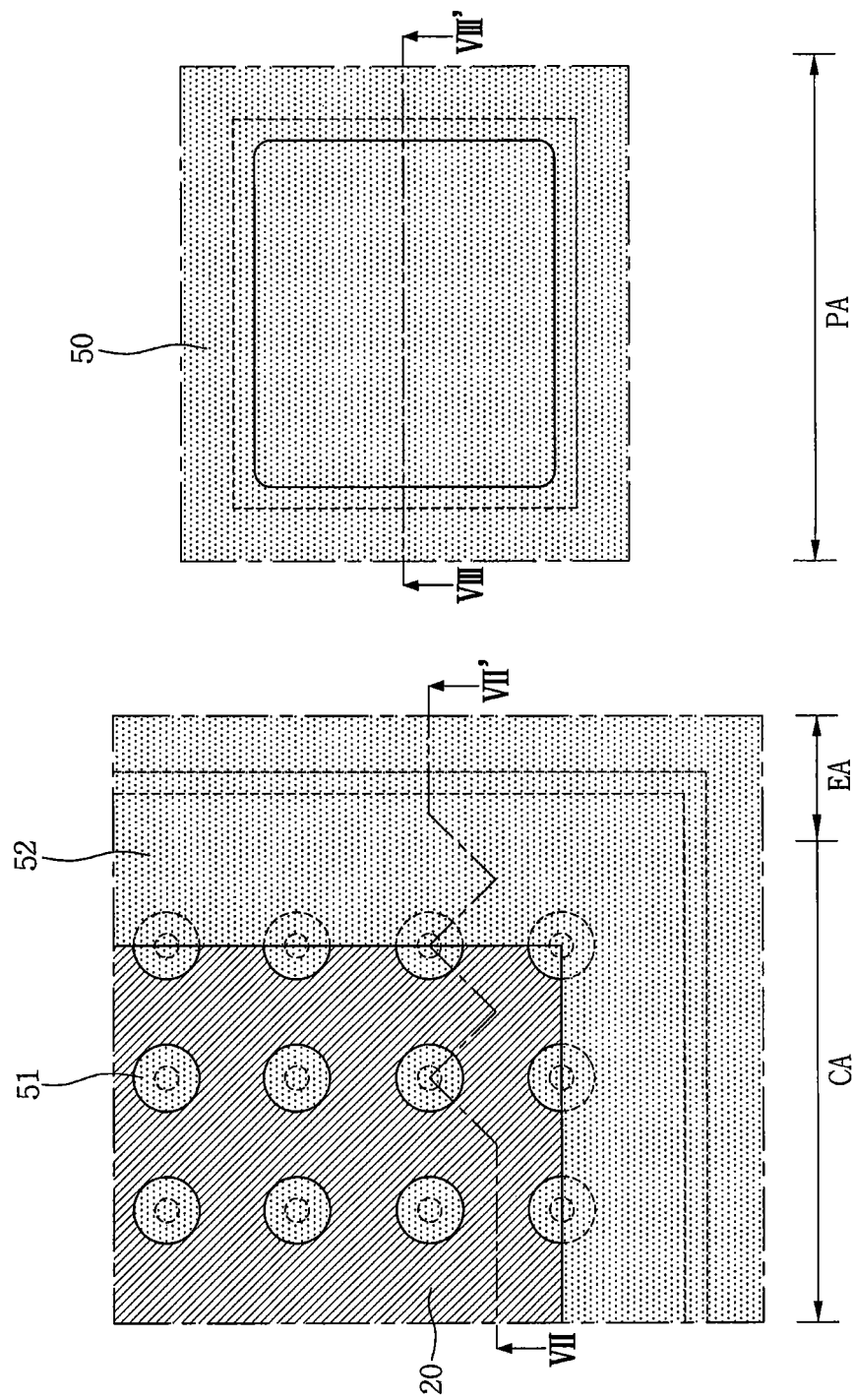

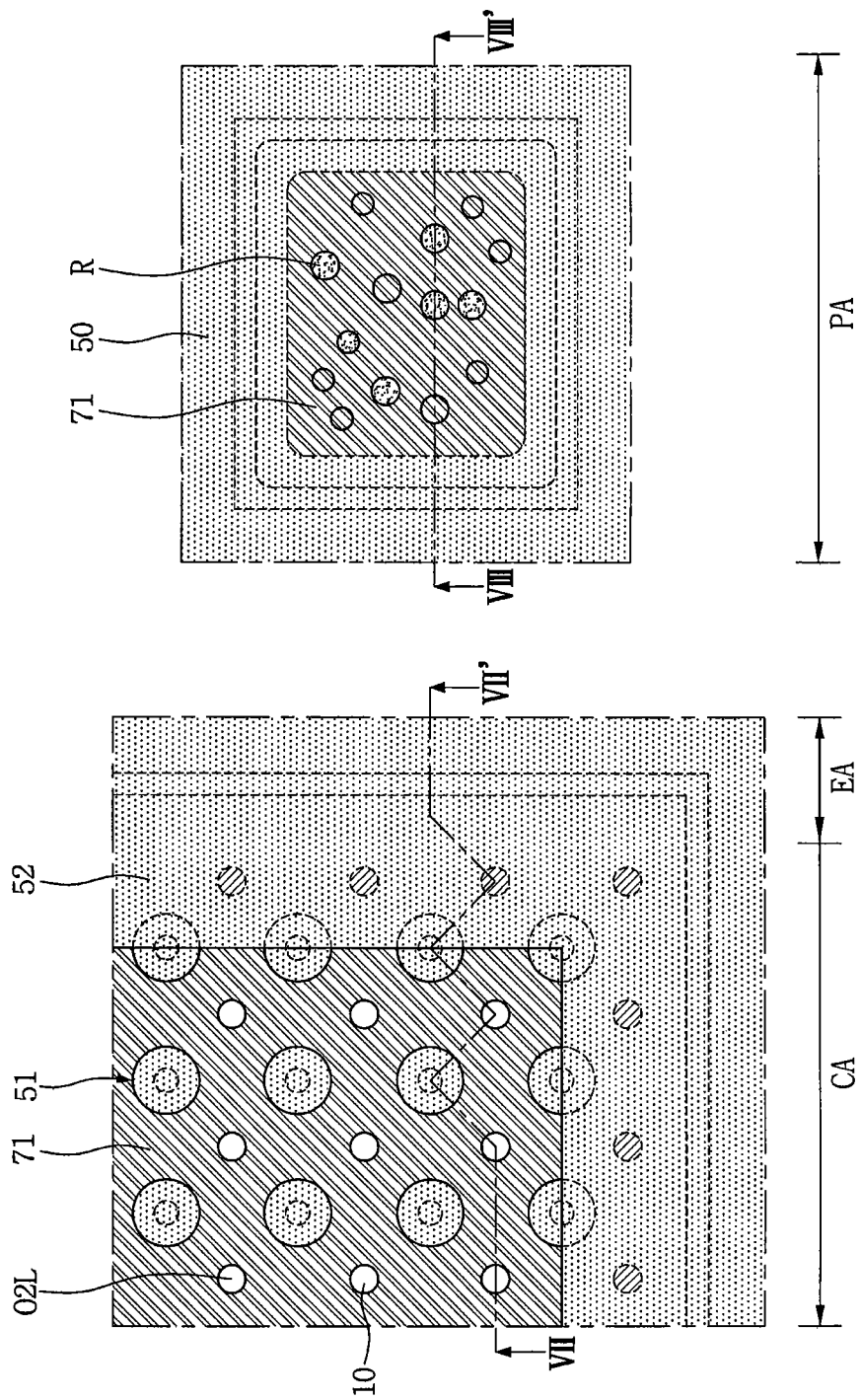

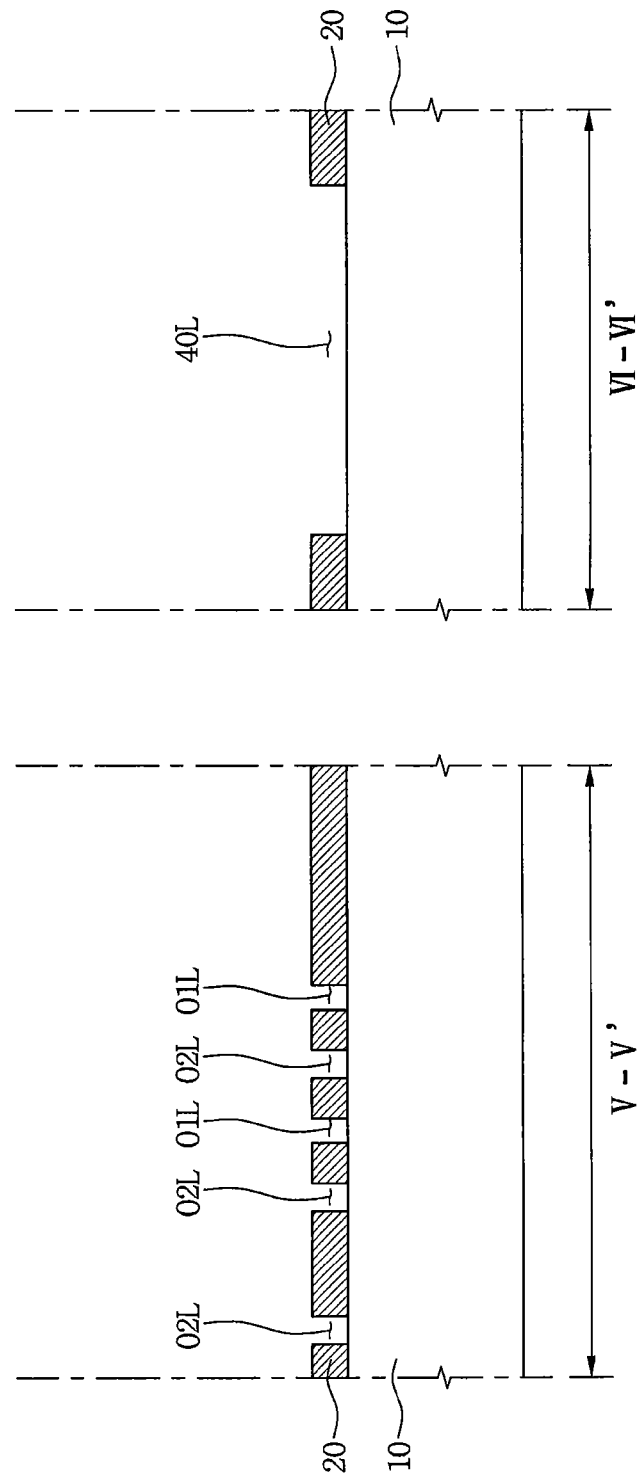

METHODS OF FORMING SEMICONDUCTOR DEVICES INCLUDING CONTACT HOLES

CROSS-REFERENCE TO RELATED APPLICATION

This application claims priority under 35 U.S.C. §119 to Korean Patent Application No. 10-2015-0029265 filed on Mar. 2, 2015, the disclosure of which is hereby incorporated by reference in its entirety.

BACKGROUND

Embodiments of the inventive concepts provide methods of forming contact holes of semiconductor devices.

Since semiconductor devices include small and fine elements, spaces between contact holes are narrower. Thus, forming contact holes having very narrow spaces, widths, or diameters may be very difficult if those are formed using conventional photolithography processes. Accordingly, various techniques for forming fine patterns using double patterning processes, quadruple patterning processes, and direct self-assembly (DSA) processes have been suggested. These processes may be good for forming the fine patterns in the cell area; however, unnecessary patterns may be formed in the edge area and/or the peripheral area. Accordingly, a method which forms the fine patterns only in the cell area and does not form the unnecessary patterns in the edge area and/or the peripheral area may be required.

SUMMARY

Embodiments of the inventive concepts provide methods of forming contact holes.

Embodiments of the inventive concepts provide methods of forming contact holes only in a cell area and not forming contact holes in an edge area and/or a peripheral area.

Embodiments of the inventive concepts provide methods that do not form contact holes in an edge area and/or a peripheral area when the contact holes are formed using a direct self-assembly (DSA) process.

The technical objectives and embodiments of the inventive concepts are not limited to the above disclosure; other objectives and embodiments may become apparent to those of ordinary skill in the art based on the following descriptions.

A method of fabricating a semiconductor device according to various embodiments may include forming a target layer including a cell area and an edge area on a side of the cell area, forming a stopper layer on the target layer, forming a hard mask including first upper openings and a dam trench on the stopper layer, forming opening spacers on respective inner walls of the first upper openings and forming a dam pattern in the dam trench and removing the stopper layer exposed in the first upper openings to form first lower openings in the stopper layer. The first lower openings may expose the target layer. The method may also include forming pillar patterns in the first lower openings and the first upper openings and forming an eaves pattern on the dam pattern, removing the hard mask in the cell area, forming a first polymer block and second polymer blocks between the pillar patterns, removing the second polymer blocks to form second upper openings, etching the stopper layer exposed in the second upper openings to form second lower openings in the stopper layer and removing the first polymer block, the pillar patterns, the dam pattern, and the eaves pattern.

In various embodiments, the first upper openings may be formed in the cell area, and the dam trench may be formed in the edge area.

According to various embodiments, the first upper openings may be vertically aligned with the respective first lower openings, and the second upper openings may be vertically aligned with the respective second lower openings.

In various embodiments, the opening spacers, the pillar patterns, the dam pattern and the eaves pattern may include the same material.

In various embodiments, the dam pattern may include a first side facing the cell area and a second side that is opposite the first side, and removing the hard mask in the cell area may leave the hard mask formed on the second side of the dam pattern.

According to various embodiments, the method may include removing the hard mask in the edge area after removing the dam pattern.

In various embodiments, the eaves pattern may extend from the dam pattern to the cell area.

According to various embodiments, the second lower openings may not be formed in the stopper layer below the eaves pattern.

According to various embodiments, the first upper openings may be formed between the dam pattern and the pillar patterns.

According to various embodiments, the second lower openings may not be formed between the dam pattern and the pillar patterns.

A method of forming contact holes according to various embodiments may include forming a target layer including a cell area and an edge area on a side of the cell area, forming a stopper layer on the target layer and forming a hard mask on the stopper layer. The hard mask may include first upper openings in the cell area and a dam trench in the edge area. The method may also include removing the stopper layer exposed in the first upper openings to form first lower openings in the stopper layer that expose the target layer, forming pillar patterns in the first upper openings and the first lower openings, removing the hard mask in the cell area, forming a dam pattern in the dam trench and forming a polymer block between the pillar patterns and between the pillar patterns and the dam pattern. The polymer block may include second upper openings exposing the stopper layer. The method may further include selectively removing the stopper layer to form second lower openings in the stopper layer that expose the target layer and removing the polymer block, the dam pattern, and the pillar patterns.

In various embodiments, the method may further include forming an eaves pattern on spaces between the dam pattern and the pillar patterns and on the dam pattern.

According to various embodiments, the eaves pattern and the pillar patterns may include the same material.

According to various embodiments, the eaves pattern may surround the cell area in a plan view and may extend from the dam pattern to the pillar patterns near the dam pattern in a cross-sectional view.

According to various embodiments, the second lower openings may not be formed in the stopper layer below the eaves pattern.

In various embodiments, the pillar patterns may include opening spacers on respective inner walls of the first upper openings.

A method of forming contact holes according to various embodiments may include forming a target layer including a cell area, an edge area on a side of the cell area and a peripheral area spaced apart from the edge area, forming a stopper layer on the target layer and forming a hard mask on the stopper layer. The hard mask may include first upper openings exposing the stopper layer in the cell area, a dam trench in the edge area, and an upper peripheral trench in the peripheral area. The method may also include etching the stopper layer exposed in the first upper openings to form first lower openings in the stopper layer, forming pillar patterns in the first upper openings and the first lower openings, forming a dam pattern in the dam trench and forming a pillar material layer in the upper peripheral trench, removing the hard mask in the cell area to expose the stopper layer, forming a block copolymer layer on the stopper layer between the pillar patterns and between the dam pattern and the pillar patterns and on the pillar material layer in the upper peripheral trench, annealing the block copolymer layer to form a first polymer block and second polymer blocks, removing the second polymer blocks to form second upper openings in the first polymer block, etching the stopper layer using the first polymer block and the pillar patterns as an etch mask to form second lower openings in the stopper layer and removing the first polymer block, the pillar patterns, the dam pattern, the pillar material layer and the hard mask.

In various embodiments, the upper peripheral trench may be wider than the dam trench.

In various embodiments, the pillar pattern, the dam pattern, and the pillar material layer may include the same material.

In various embodiments, the second polymer blocks may be regularly spaced between the pillar patterns in the cell area and irregularly spaced on the pillar material layer in the upper peripheral trench.

According to various embodiments, the second polymer blocks may have uniform depths between the pillar patterns in the cell area and may have non-uniform depths on the pillar material layer in the upper peripheral trench.

According to various embodiments, forming the first lower openings may include forming opening spacers on respective inner walls of the first upper openings and performing an etching process using the opening spacers as an etch mask to selectively etch the stopper layer.

According to various embodiments, the method may further include etching the target layer using the stopper layer including the first lower openings and the second lower openings as an etch mask.

In various embodiments, removing the second polymer blocks may further include forming an upper recess in the first polymer block on the pillar material layer in the upper peripheral trench in the peripheral area.

According to various embodiments, removing the second polymer blocks may further include forming a lower recess in the pillar material layer in the upper peripheral trench, and the lower recess may be vertically aligned with the upper recess.

A method of forming a semiconductor device according to various embodiments may include forming a target layer and forming a stopper layer on the target layer. The stopper layer may include a first portion and a second portion adjacent the first portion. The method may also include forming pillar patterns on the first portion of the stopper layer, forming a mask layer on the second portion of the stopper layer and forming a polymer block between the pillar patterns. The polymer block may include polymer block openings that expose the stopper layer. The method may further include etching the stopper layer using the pillar patterns, the polymer block and the mask layer as an etch mask to form stopper openings in the first portion of the stopper layer, removing the pillar patterns, the polymer block and the mask layer and etching the target layer using the stopper layer including the stopper openings to form opening in the target layer.

In various embodiments, the pillar patterns and the mask layer may be formed concurrently and may include a same material.

According to various embodiments, forming the polymer block may include forming a block copolymer layer between the pillar patterns, separating the block copolymer layer into the polymer block and a plurality of polymer block patterns and removing the plurality of polymer block patterns to form the polymer block openings in the polymer block.

In various embodiments, the mask layer may include a first mask layer, and the stopper openings may include first stopper openings. Forming the pillar patterns and forming the first mask layer may include forming a second mask layer on the stopper layer that may include mask openings exposing the stopper layer, forming spacers on respective sides of the mask openings, etching the stopper layer using the second mask layer and the spacers as an etch mask to form second stopper openings in the stopper layer, forming a pillar material layer in the mask openings and the second stopper openings, forming a third mask layer on the pillar material layer that is formed on the second portion of the stopper layer, etching the pillar material layer until the second mask layer is exposed using the third mask as an etch mask to form the pillar patterns in the mask openings and to form the first mask layer on the second portion of the stopper layer and removing the second mask layer.

According to various embodiments, the method may further include removing the spacers before etching the target layer. The openings may include first openings, and etching the target layer may include etching the target pattern using the stopper layer including the first and second stopper openings to form the first openings and second openings in the target layer.

According to various embodiments, the second mask layer may further include a dam trench that is disposed on and exposes the second portion of the stopper layer. The method may further include forming a dam pattern in the dam trench concurrently with forming the spacers, and the dam pattern may include a first side facing the first portion of the stopper layer and a second side opposite the first side. The first mask layer may be formed on the dam pattern, and removing the second mask layer may include removing the second mask layer formed on the first side of the dam pattern and leaving the second mask layer formed on the second side of the dam pattern.

In various embodiments, removing the second mask layer formed on the first side of the dam pattern may include forming a space defined by the dam pattern and the first mask layer, and the polymer block may be formed in the space defined by the dam pattern and the first mask layer.

According to various embodiments, the stopper layer may include a third portion that is different from the first and second portions of the stopper layer. The second mask layer may include an upper trench that is disposed on and exposes the third portion of the stopper layer. The method may further include forming a trench spacer on a side of the upper trench concurrently with forming the spacers and etching the stopper layer using the second mask layer and the trench spacer as an etch mask to form a lower trench in the third portion of the stopper layer concurrently with forming the second stopper openings in the stopper layer. Forming the pillar material layer may include forming the pillar material layer in the lower trench, and forming the polymer block may include forming the polymer block on the pillar material layer formed in the lower trench such that the pillar material layer may be between the polymer block and the target layer.

BRIEF DESCRIPTION OF THE DRAWINGS

The foregoing and other features and advantages of the inventive concepts will be apparent from the description of some embodiments of the inventive concepts. The drawings are not necessarily to scale, emphasis instead being placed upon illustrating the principles of the inventive concepts. In the drawings:

FIGS. 1A, 2A, 3A, 4A, 5A, 6A, 6C, 7A, 8A, SC, 9A, 9C, 10A, 10C, 11A and 12A are plan views and FIGS. 1B, 2B, 3B, 4B, 5B, 6B, 7B, 7C, 8B, 8D, 9B, 10B, 11B, 11C, 12B and 12C are cross-sectional views illustrating a method of forming contact holes of semiconductor devices in accordance with some embodiments of the inventive concepts;

FIGS. 13A, 14A, 15A, 16A, 17A, 18A and 19A are plan views and FIGS. 13B, 14B, 15B, 16B, 17B, 18B, 18C, 19B and 19C are cross-sectional views illustrating a method of forming contact holes of semiconductor devices in accordance with some embodiments of the inventive concepts;

FIGS. 20A, 21A, 22A, 23A, 24A, 25A and 26A are plan views and FIGS. 20B, 21B, 22B, 23B, 24B, 25B, 25C, 26B and 26C are cross-sectional views illustrating a method of forming contact holes of semiconductor devices in accordance with some embodiments of the inventive concepts;

DETAILED DESCRIPTION OF THE EMBODIMENTS

Figure 1B:
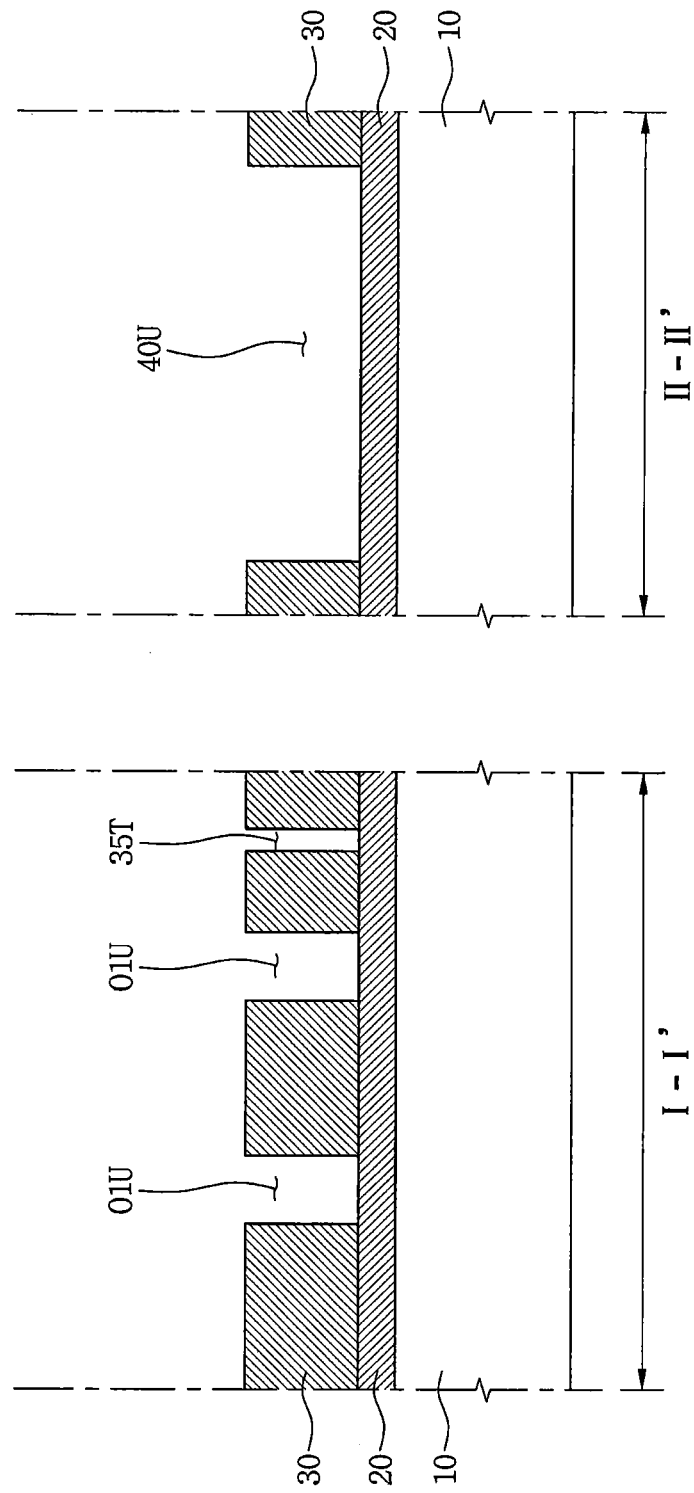

Various embodiments will now be described more fully with reference to the accompanying drawings. The inventive concepts may, however, be embodied in different forms and should not be construed as limited to the embodiments set forth herein. Rather, these embodiments are provided so that this disclosure is thorough and complete and fully conveys the inventive concepts to those skilled in the art.

The terminology used herein to describe embodiments is not intended to limit the scope of the inventive concepts. The articles "a," "an," and "the" are singular in that they have a single referent; however, the use of the singular form in the specification should not preclude the presence of more than one referent. In other words, an element referred to in the singular form may be one of elements unless the context clearly indicates otherwise. It will be further understood that the terms "comprises," "comprising," "includes," and "including," when used herein, specify the presence of stated features, steps, operations, elements, and/or components, but do not preclude the presence or addition of one or more other features, steps, operations, elements, components, and/or groups thereof.

It will be understood that when an element or layer is referred to as being "on," "connected to," or "coupled to" another element or layer, it can be directly on, connected to, or coupled to the other element or layer or intervening elements or layers may be present. In contrast, when an element is referred to as being "directly on," "directly connected to," or "directly coupled to" another element or layer, there are no intervening elements or layers present.

Spatially relative terms, such as "beneath," "below," "lower," "above," "upper," and the like may be used herein to describe the relationship of one element or feature to another, as illustrated in the drawings. It will be understood that such descriptions are intended to encompass different orientations in use or operation in addition to orientations depicted in the drawings. For example, if a device is turned over, elements described as "below" or "beneath" other elements or features would then be oriented "above" the other elements or features. Thus, the term "below" is intended to mean both above and below, depending upon overall device orientation.

Embodiments are described herein with reference to cross-sectional and/or plan views that are schematic illustrations of idealized embodiments and intermediate structures. In the drawings, the sizes and relative sizes of layers and regions may be exaggerated for clarity. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. Thus, the regions illustrated in the drawings are schematic in nature and their shapes are not intended to illustrate the actual shape of a region of a device and are not intended to limit the scope of the present inventive concepts.

Like numerals refer to like elements throughout the specification. Accordingly, the same numerals and similar numerals can be described with reference to other drawings, even if not specifically described in a corresponding drawing. Further, when a numeral is not marked in a drawing, the numeral can be described with reference to other drawings.

As used herein the term "and/or" includes any and all combinations of one or more of the associated listed items. It will be understood that "formed concurrently" (or similar language) refers to formed in a same fabrication step, at approximately (but not necessarily exactly) the same time.

Figure 4B:
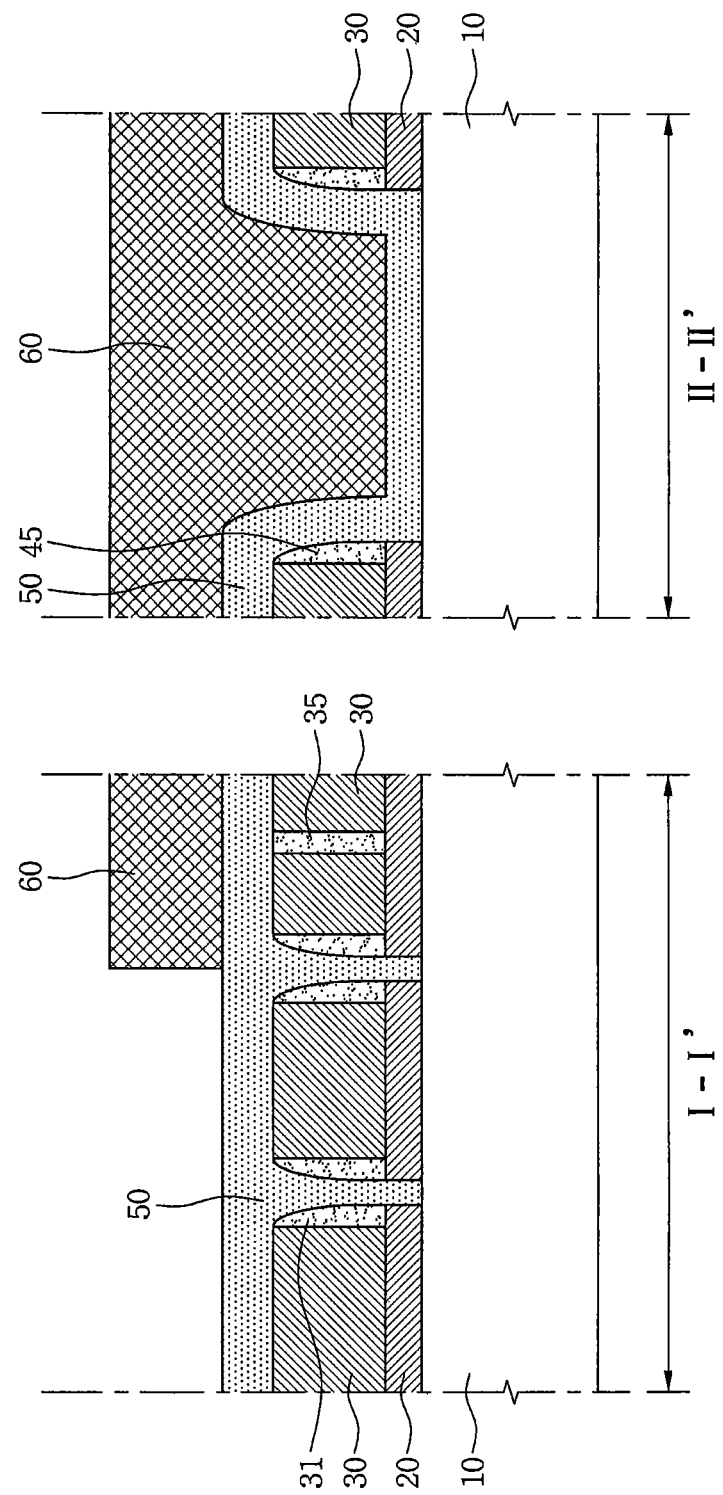
Figure 5B:
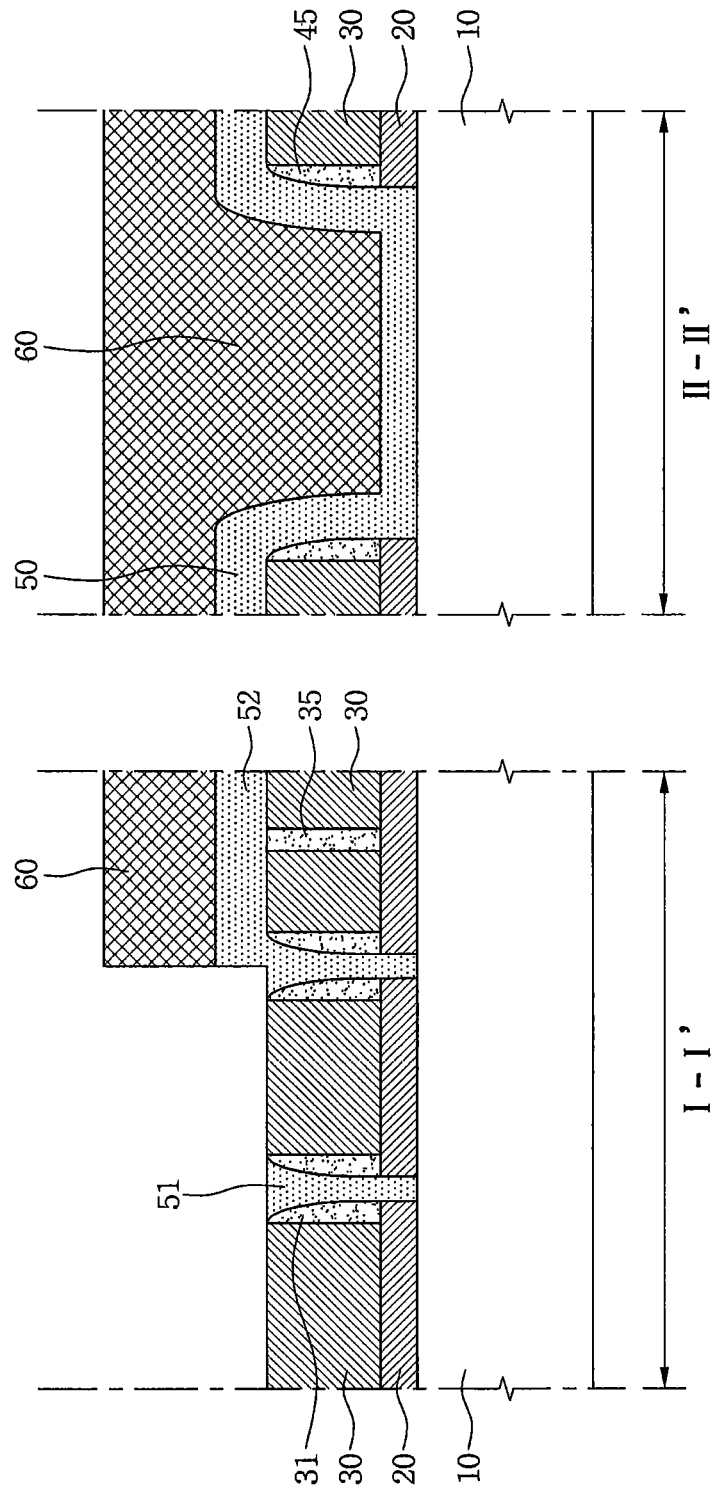
Figure 6C:
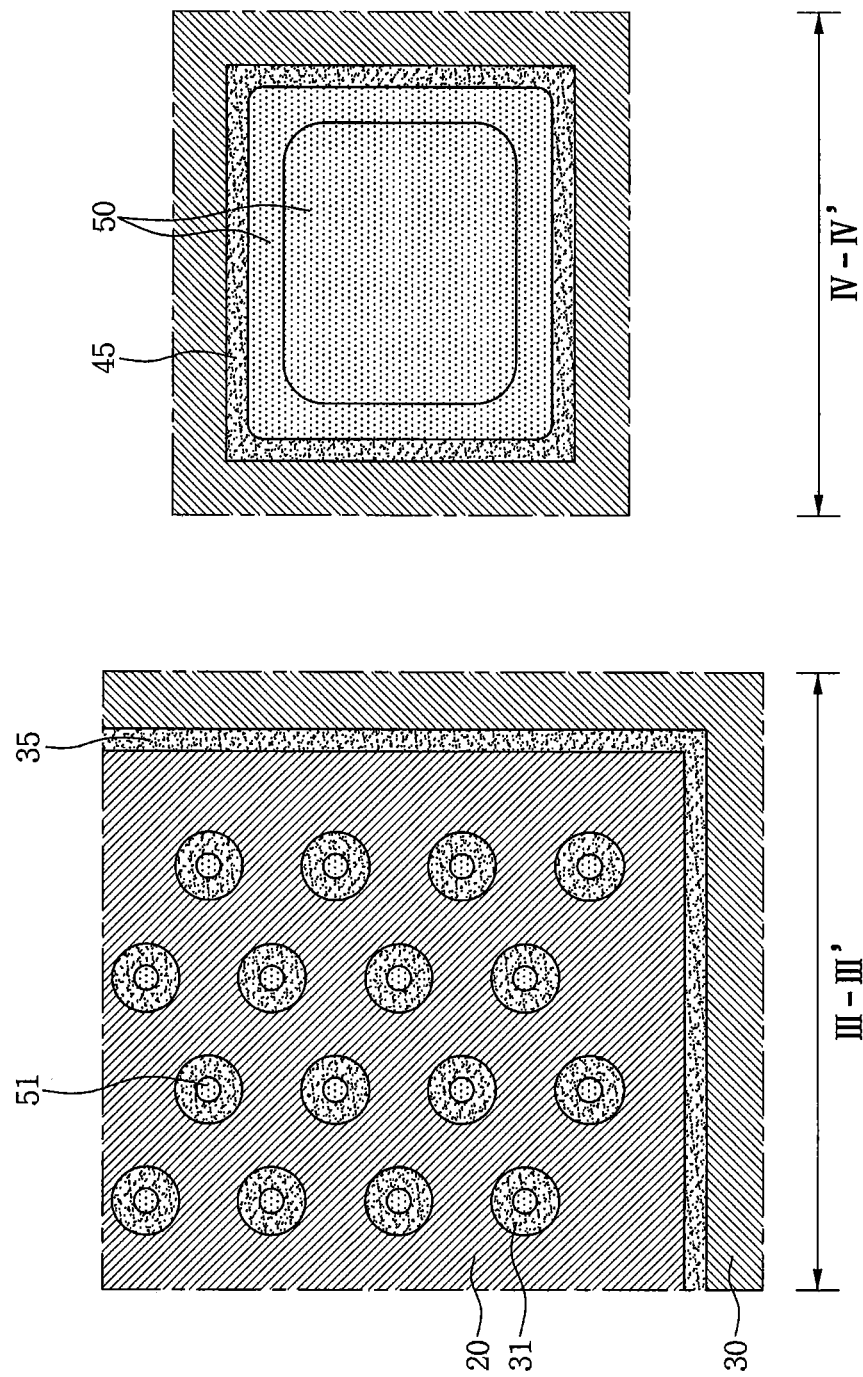

FIGS. 1A, 2A, 3A, 4A, 5A, 6A, 7A, 8A, 9A, 10A, 11A and 12A are plan views, FIGS. 1B, 2B, 3B, 4B, 5B, 6B, 7B, 7C, 8B, 8D, 9B, 10B, 11B, 11C, 12B and 12C are cross-sectional views taken along the lines I-I' and II-II' of FIG. 1A and FIGS. 6C, 8C, 9C and 10C are cross-sectional views taken along the lines III-III' and IV-IV' of FIG. 6B illustrating a method of forming contact holes of semiconductor devices in accordance with some embodiments of the inventive concepts.

Referring to FIGS. 1A and 1B, the method of forming contact holes of a semiconductor device in accordance with some embodiments of the inventive concepts may include forming a stopper layer 20 on a target layer 10, and forming a hard mask (e.g., second mask layer) 30 including first upper openings (e.g., mask openings) O1U, a dam trench 35T, and an upper peripheral trench 40U on the stopper layer 20.

The target layer 10 may include, for example, at least one of silicon oxide ($SiO_2$), silicon nitride (SiN), silicon oxynitride (SiON), silicon carbon nitride (SiCN), SOH (spin on hard mask) and poly-crystalline silicon. For example, the target layer 10 may include a mold insulating layer (e.g., silicon oxide) of a DRAM device.

The stopper layer 20 may have an etch selectivity with respect to the target layer 10. The stopper layer 20 may include, for example, at least one of silicon oxide ($SiO_2$), silicon nitride (SiN), silicon oxynitride (SiON), silicon carbonic nitride (SiCN), SOH (spin on hard mask) and poly-crystalline silicon. In some embodiments, the stopper layer 20 may include silicon nitride (SiN).

The hard mask 30 may have an etch selectivity with respect to the stopper layer 20. The hard mask 30 may include, for example, at least one of silicon oxide ($SiO_2$), silicon nitride (SiN), silicon oxynitride (SiON), silicon carbonic nitride (SiCN), SOH (spin on hard mask) and poly-crystalline silicon. In some embodiments, the hard mask 30 may include silicon oxide ($SiO_2$).

The first upper openings O1U may be arranged in a zigzag pattern in a cell area CA. In some embodiments, a transverse interval W1 between the first upper openings O1U may be greater than a longitudinal interval W2 between the first upper openings O1U as illustrated in FIG. 1A.

The dam trench 35T may be formed in an edge area EA which may be on a side of the cell area CA. In some embodiments, the edge area EA may surround the cell area CA as illustrated in FIG. 1A.

The upper peripheral trench 40U may be formed in a peripheral area PA that may be spaced apart from the cell area CA and the edge area EA. For example, the upper peripheral trench 40U may include at least one of an align key area, an overlay key area, a test pattern area, and a logic area. The dam trench 35T may isolate the cell area CA from the peripheral area PA.

The first upper openings O1U, the dam trench 35T, and the upper peripheral trench 40U may expose a top surface of the stopper layer 20.

Referring to FIGS. 2A and 2B, the method may include forming opening spacers 31 on inner walls of the first upper openings O1U, forming a dam pattern 35 in the dam trench 35T, and forming a trench spacer 45 on an inner wall of the upper peripheral trench 40U.

The opening spacers 31, the dam pattern 35, and the trench spacer 45 may include, for example, at least one of silicon oxide ($SiO_2$), silicon nitride (SiN), silicon oxynitride (SiON), silicon carbonic nitride (SiCN), SOH (spin on hard mask) and poly-crystalline silicon. In some embodiments, the opening spacers 31, the dam pattern 35, and the trench spacer 45 may include SOH.

Figure 3A:
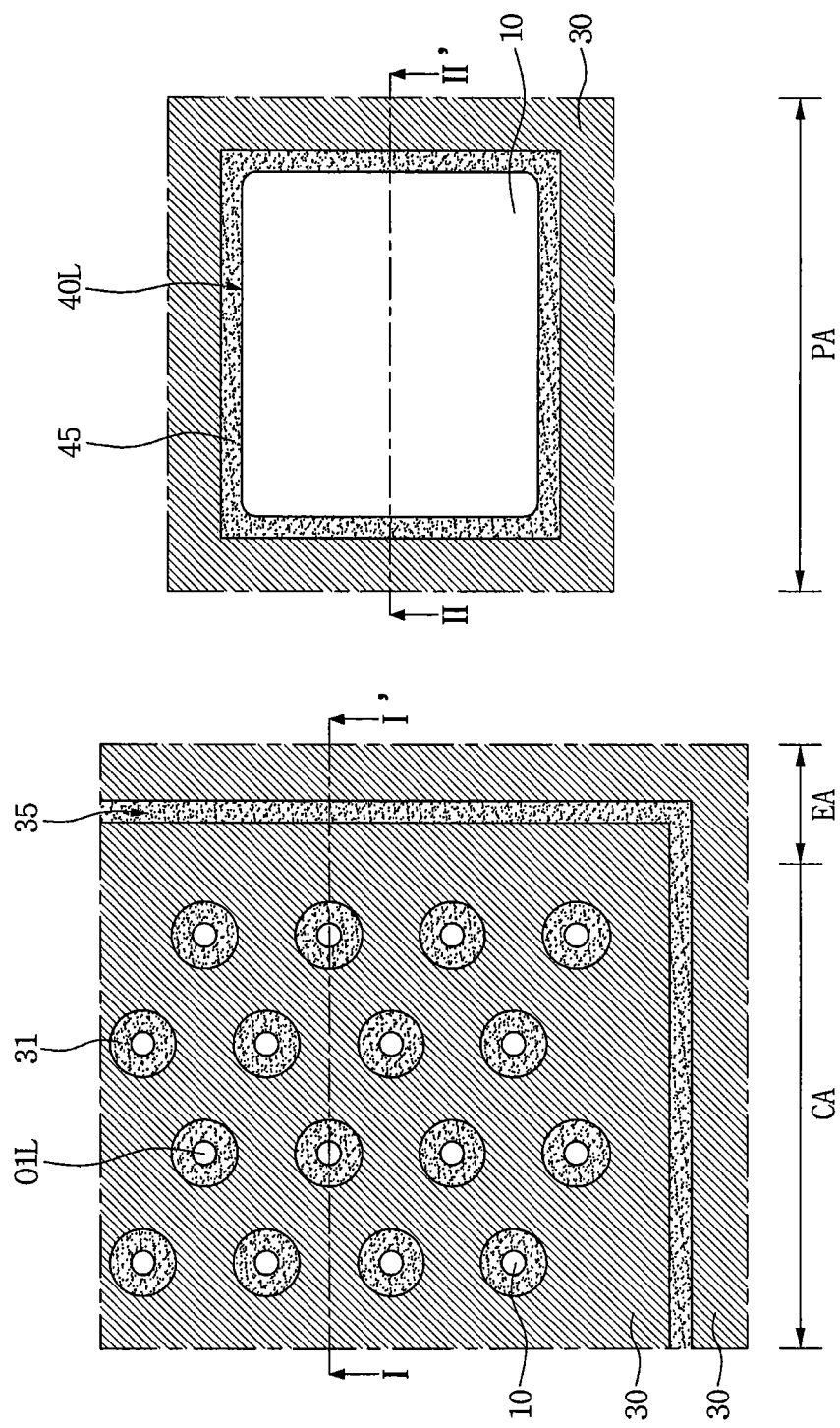
Figure 3B:
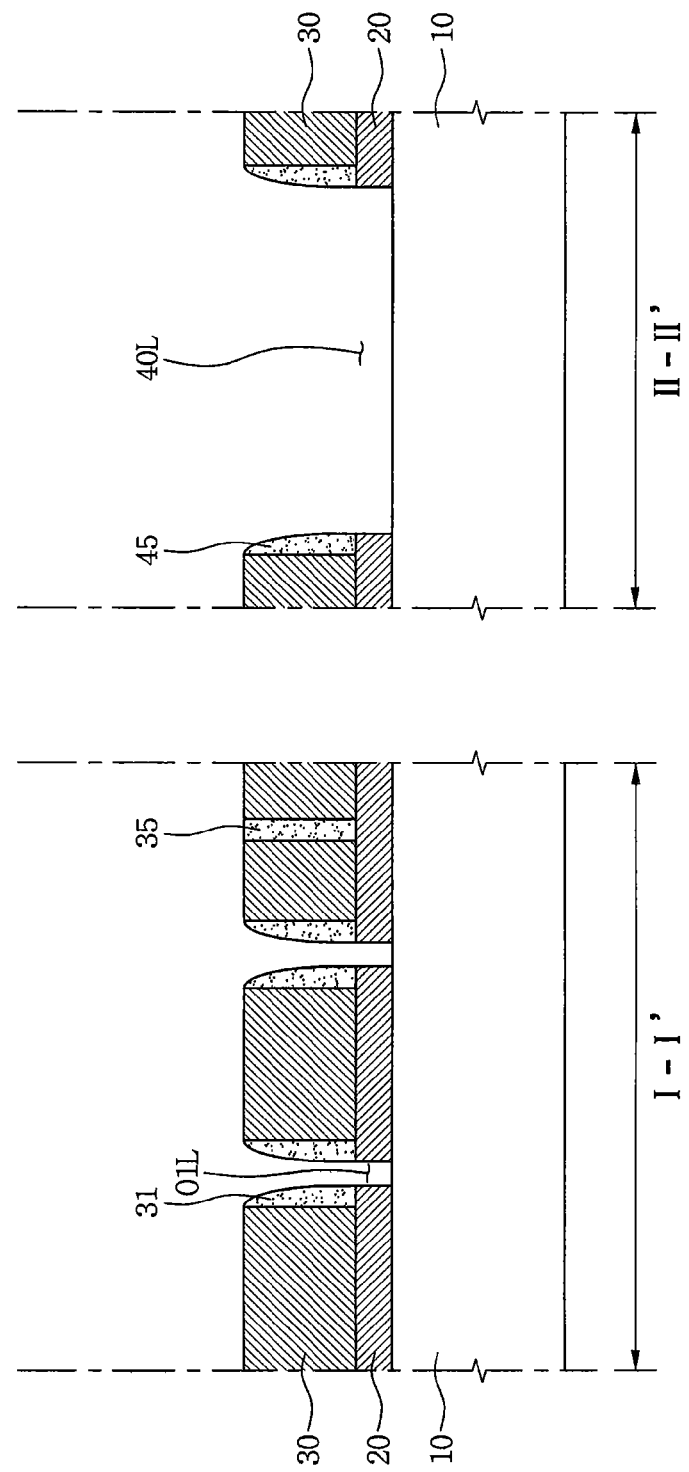

Referring to FIGS. 3A and 3B, the method may include selectively etching the stopper layer 20 to form first lower openings (e.g., second stopper openings) O1L and a lower peripheral trench 40L using the hard mask 30, the opening spacers 31, the dam pattern 35 and the trench spacer 45 as an etch mask.

The first lower openings O1L and the lower peripheral trench 40L may expose a surface of the target layer 10.

Referring to FIGS. 4A and 4B, the method may include forming a pillar material layer 50 in the first upper openings O1U and the first lower openings O1L, on the trench spacer 45 and in the lower peripheral trench 40L. In some embodiments, the pillar material layer 50 may fill the first upper openings O1U and the first lower openings O1L as illustrated in FIG. 4B. The method may further include forming a trimming mask (e.g., third mask layer) 60 on the edge area EA and the peripheral area PA. The trimming mask 60 may expose the pillar material layer 50 in the cell area CA.

Referring to FIG. 4A, an inner perimeter of the trimming mask 60 may cross the first upper openings O1U and/or the first lower openings O1L located at the rightmost portion in a direction X. In some embodiments, the inner perimeter of the trimming mask 60 may also cross the first upper openings O1U and/or the first lower openings O1L located at the leftmost portion in the direction X. The inner perimeter of the trimming mask 60 may cross portions of the first upper openings O1U but may not cross the first lower openings O1L located at the lowermost portion in a direction Y as illustrated in FIG. 4A. In some embodiments, the inner perimeter of the trimming mask 60 may also cross portions of the first upper openings O1U but may not cross the first lower openings O1L located at the uppermost portion in the direction Y. For example, the inner perimeter of the trimming mask 60 may cross the first upper opening spacers 31 located at the lowermost portion in direction Y.

The pillar material layer 50 may include, for example, at least one of silicon oxide ($SiO_2$), silicon nitride (SiN), silicon oxynitride (SiON), silicon carbon nitride (SiCN), SOH (spin on hard mask) and poly-crystalline silicon. In some embodiments, the pillar material layer 50 may include SOH. Accordingly, in some embodiments, the pillar material layer 50, the first upper opening spacers 31, the dam pattern 35, and the trench spacer 45 may include the same material. The trimming mask 60 may include a photoresist.

Referring to FIGS. 5A and 5B, the method may include removing an upper portion of the pillar material layer 50 in the cell area CA using the trimming mask 60 as an etch mask to form pillar patterns 51 in the cell area CA and to form an eaves pattern (e.g., first mask layer) 52 in the edge area EA. In the cell area CA, an upper surface of the hard mask 30 may be exposed. Then, the pillar patterns 51 may be isolated each other and may be arranged in a zigzag pattern. For example, the pillar patterns 51 may be arranged in the pattern same as the first upper openings O1U are arranged. The eaves pattern 52 may have a frame shape surrounding the cell area CA in a plan view, and a bridge shape connecting the dam pattern 35 to the pillar patterns 51 near the dam pattern 35 in a cross-sectional view.

FIG. 6C illustrates cross sectional views taken along the lines III-III' and IV-IV' of FIG. 6B. Referring to FIGS. 6A, 6B, and 6C, the method may include removing the trimming mask 60, and the hard mask 30 exposed in the cell area CA.

The stopper layer 20 between the pillar patterns 51 may be exposed in the cell area CA, and an air space AS may be formed beneath the eaves pattern 52 in the edge area EA. The dam pattern 35 may possibly prevent expansion of the air space AS to an outside of the edge area EA. Accordingly, the hard mask 30 may remain in the outside of the dam pattern 35 in the edge area EA and in the peripheral area PA. Stated in other words, the dam pattern 35 may include a first side facing the cell area CA and a second side opposite the first side, and the hard mask 30 formed on the second side of the dam pattern 35 may not be removed when the hard mask 30 in the cell area CA is removed because of the dam pattern 35. The hard mask 30 formed on the first side of the dam pattern 35 may be removed such that the air space AS is formed.

Figure 7A:
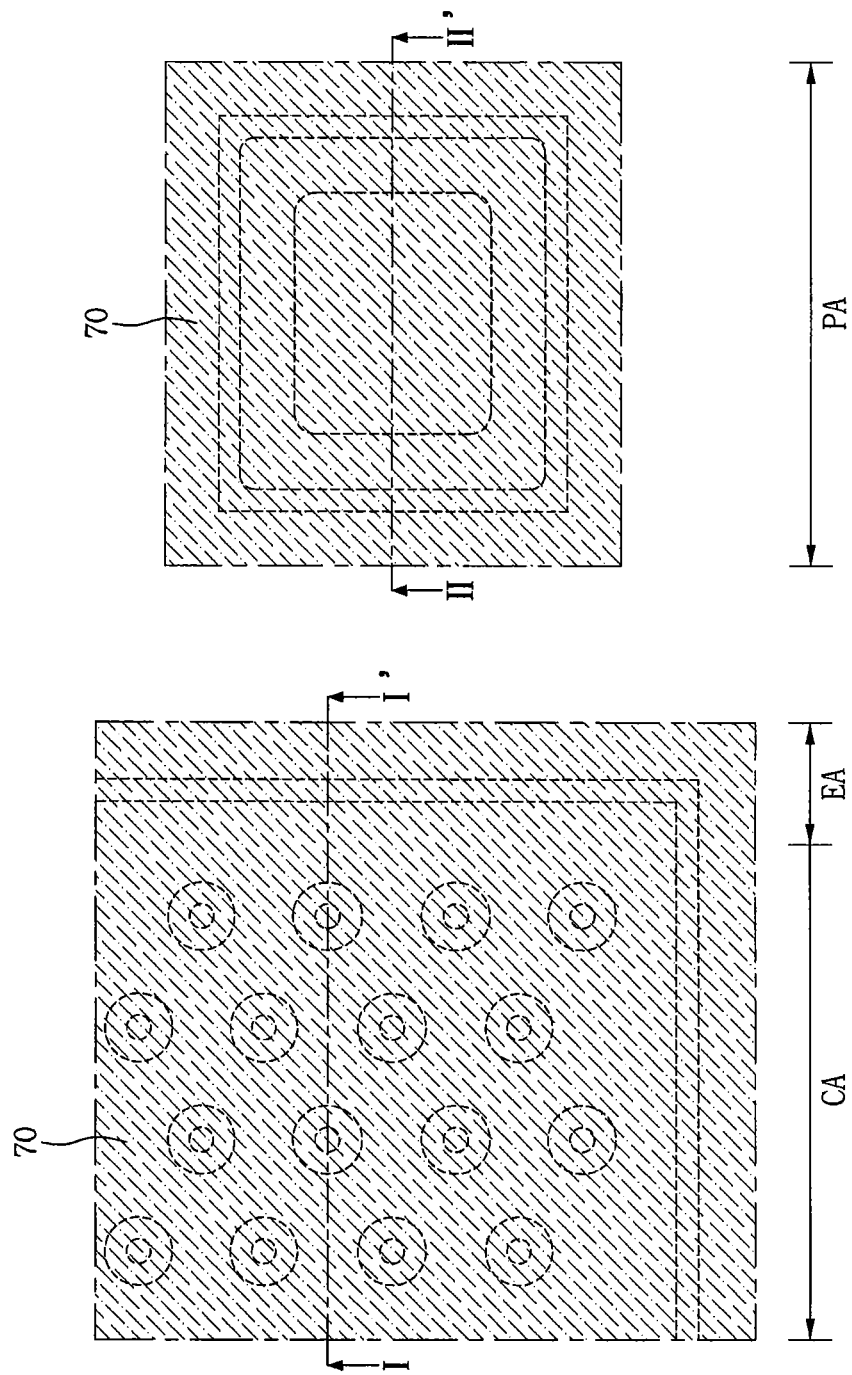
Figure 7B:
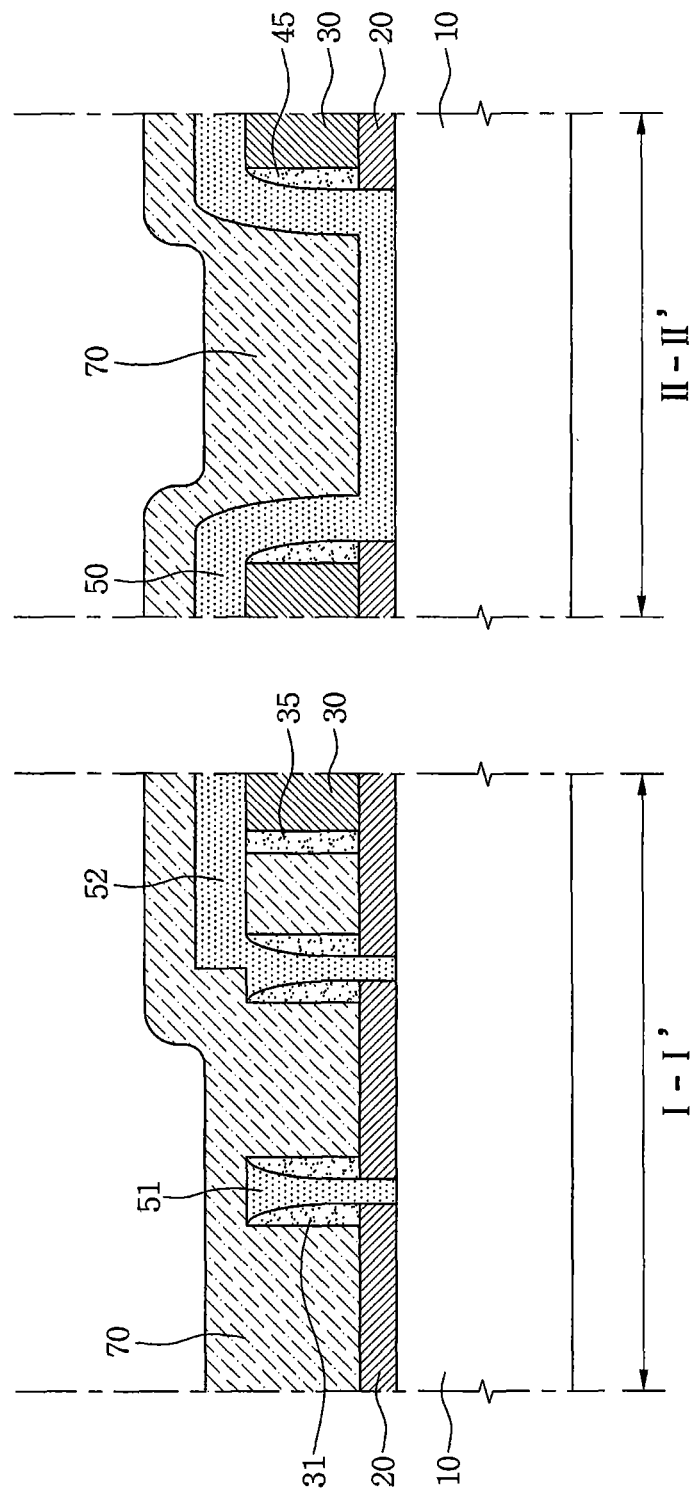

Referring to FIGS. 7A and 7B, the method may include forming a block copolymer layer 70 on the cell area CA, the edge area EA and the peripheral area PA. The block copolymer layer 70 may include at least two polymers. For example, the block copolymer layer 70 may include polystyrene (PS) and polymethylmethacrylate (PMMA). The method may include coating the block copolymer layer 70 and performing a soft bake process. For example, the soft bake process may be performed at about 100° C. During the soft bake process, solvent components in the block copolymer layer 70 may be removed.

Figure 7C:
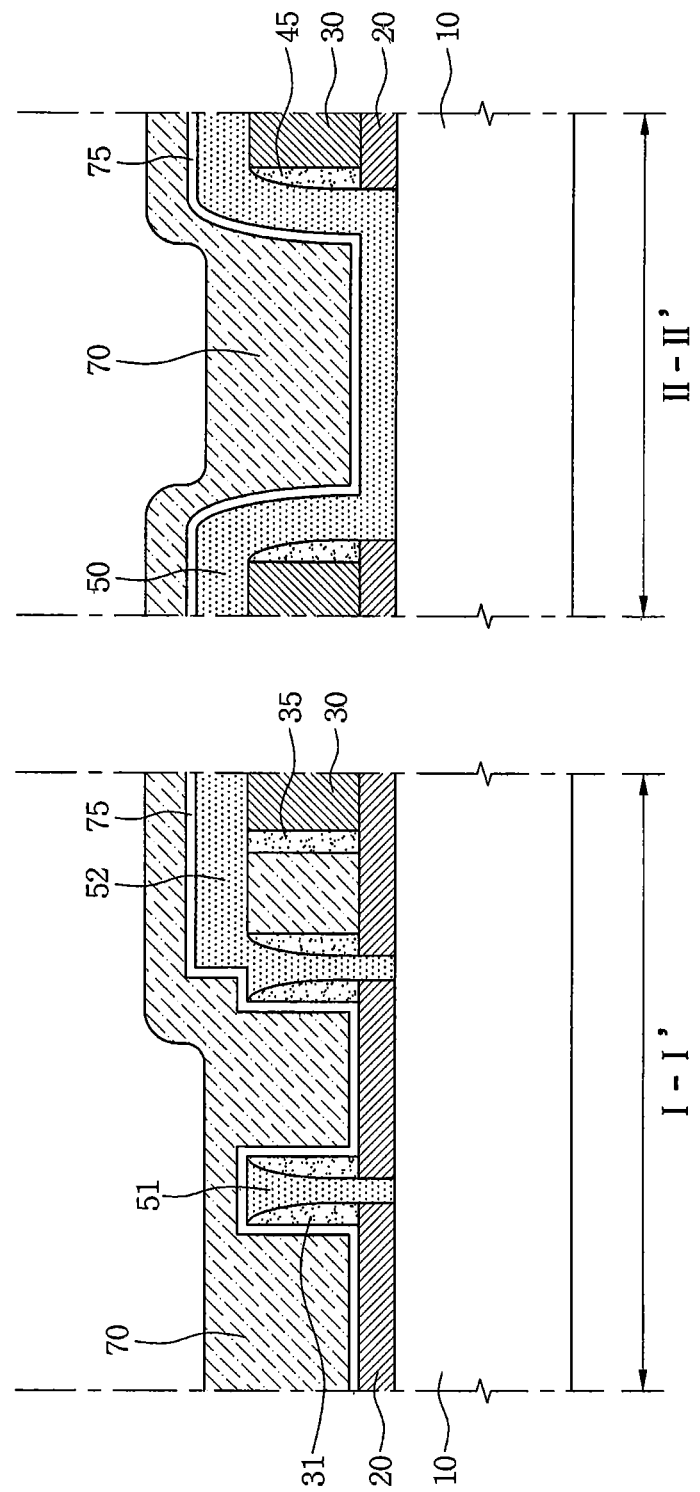

Referring to FIG. 7C, in some embodiments, the method may include conformally forming a neutralizing layer 75 on the cell area CA, the edge area EA and the peripheral area PA prior to forming the block copolymer layer 70. The neutralizing layer 75 may include, for example, at least one of polystyrene (PS), polymethylmethacrylate (PMMA) and other polymers. The neutralizing layer 75 may possibly prevent the block copolymer layer 70 from adhering to the pillar pattern 51 or the pillar material layer 50, or the stopper layer 20, and make removing of the block copolymer layer 70 easy.

Figure 8A:
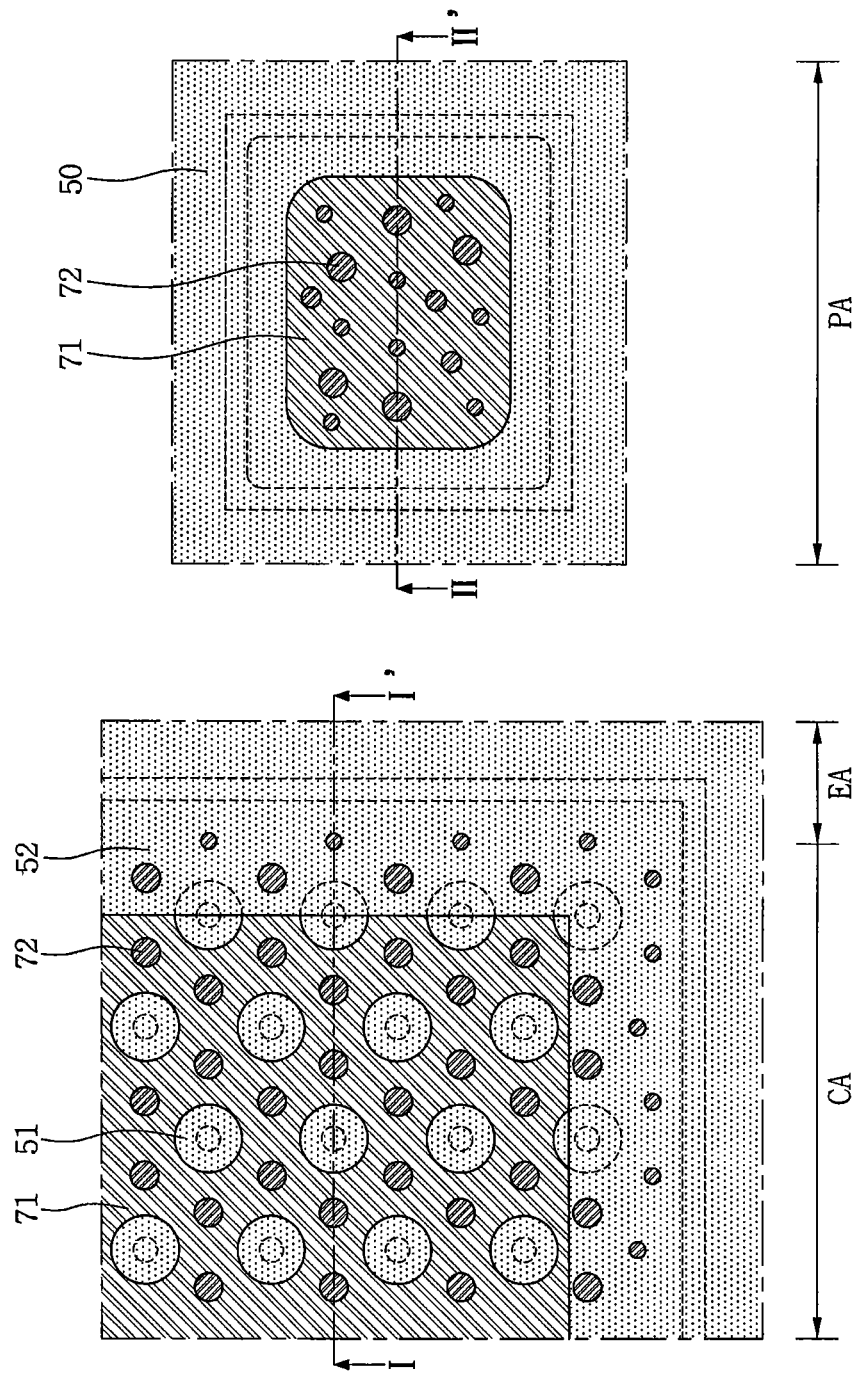
Figure 8B:
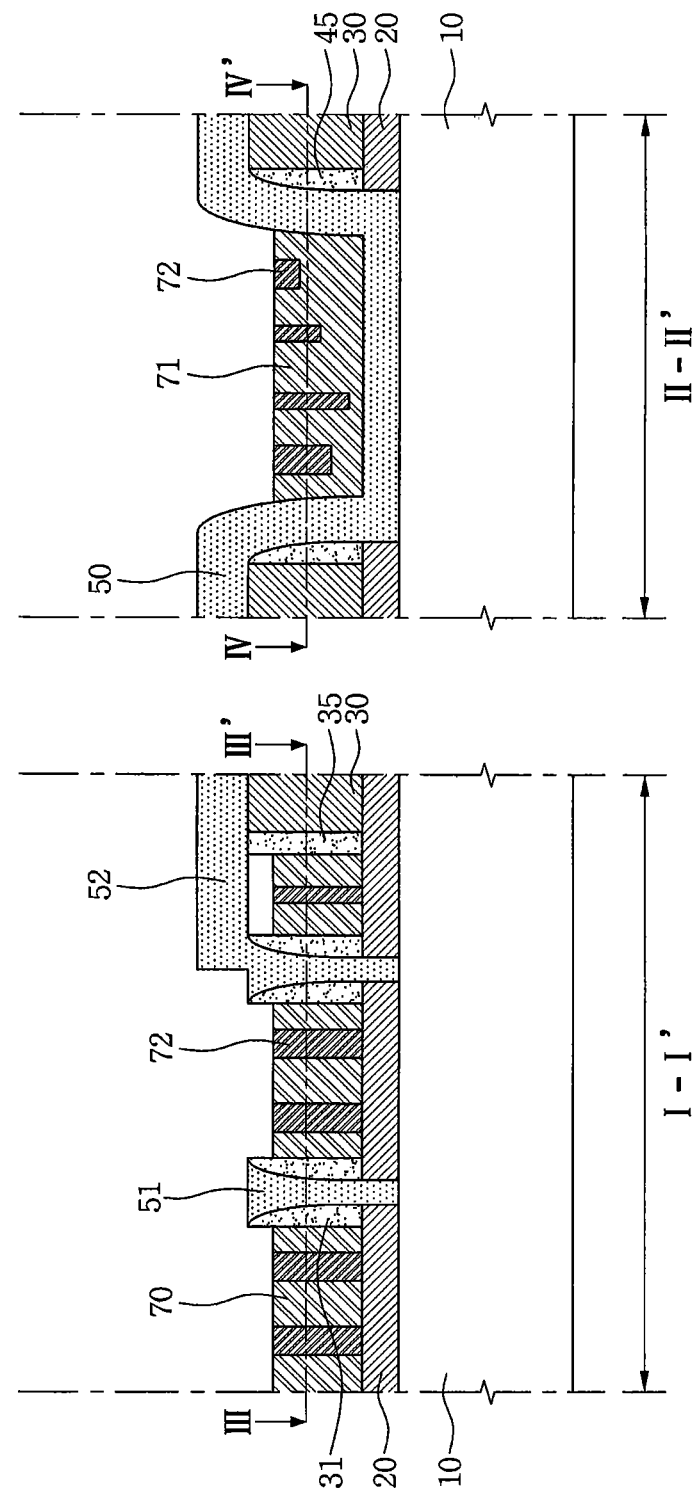
Figure 8C:
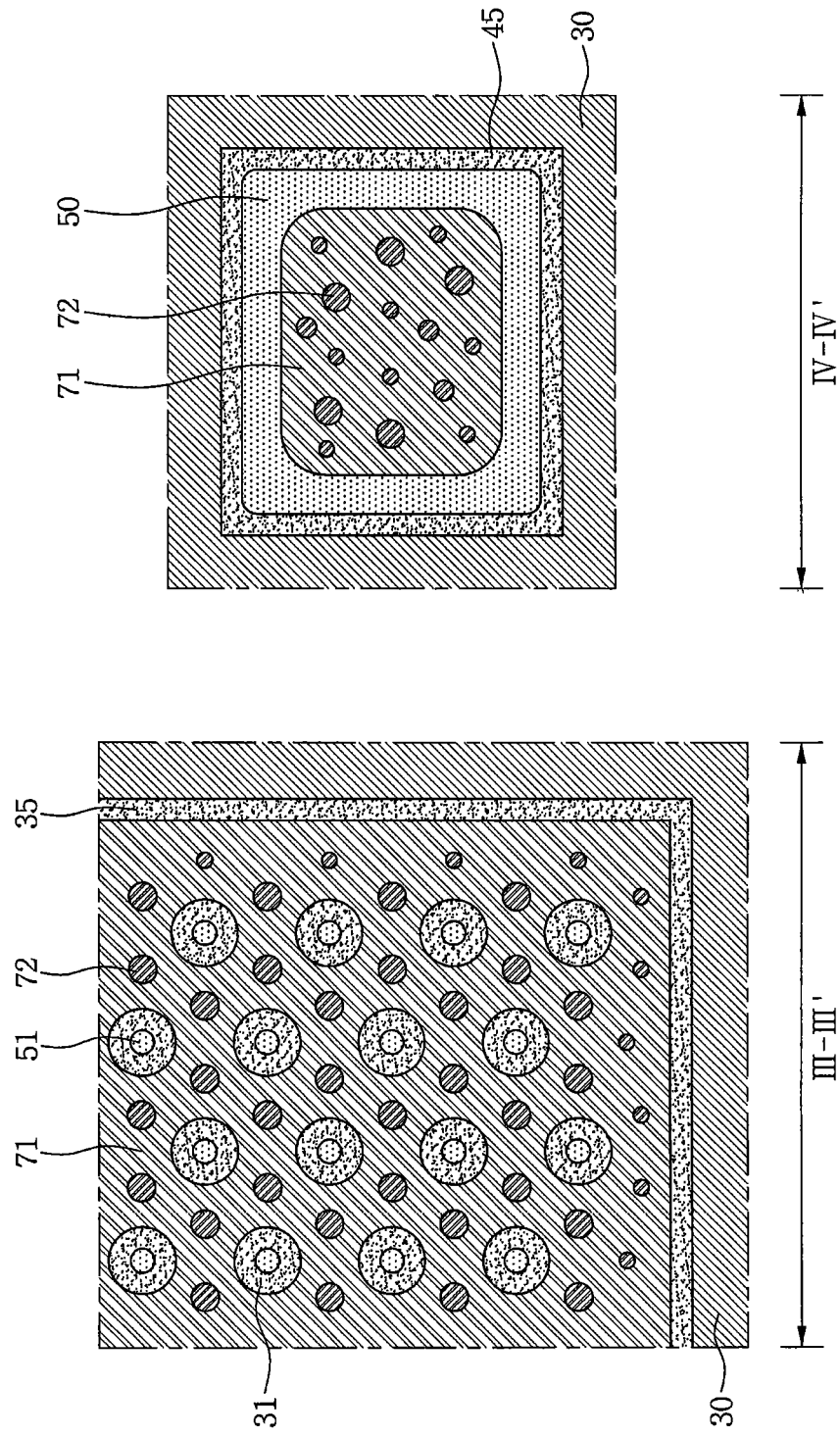

Referring to FIGS. 8A, 8B, and 8C, the method may include performing an annealing process and/or a hard bake process to separate and cure the block copolymer layer 70 thereby forming first polymer blocks 71 and second polymer blocks 72. The second polymer blocks 72 may be formed in island shapes between the pillar patterns 51. For example, the second polymer blocks 72 may be regularly spaced and may be spaced apart from the pillar patterns 51 by the same or similar distance in the cell area CA, and the second polymer blocks 72 may be geometrically irregularly spaced in the edge area EA and/or the peripheral area PA as illustrated in FIG. 8A.

The first polymer blocks 71 may be formed between the pillar patterns 51, between the pillar patterns 51 and the dam pattern 35 and may surround the second polymer blocks 72. The phenomena may occur in accordance with the affinity of polymers included in the block copolymer layer 70 and the adjacent pillar patterns 51 and the adjacent pillar material layer 50.

Volumes or vertical heights of the first polymer blocks 71 and the second polymer blocks 72 may be reduced. For example, the pillar patterns 51 may protrude from upper surfaces of the first polymer blocks 71 and the second polymer blocks 72. An upper portion of the air space AS may not be filled by the first polymer blocks 71 and the second polymer blocks 72 and may remain.

In the peripheral area PA, lower portions of the second polymer blocks 72 may be non-uniformly spaced apart from the pillar material layer 50 as illustrated in FIG. 8B. Lowermost surfaces of the second polymer blocks 72 may be disposed at different levels relative to an upper surface of the pillar material layer 50 in the peripheral area PA.

Figure 8D:
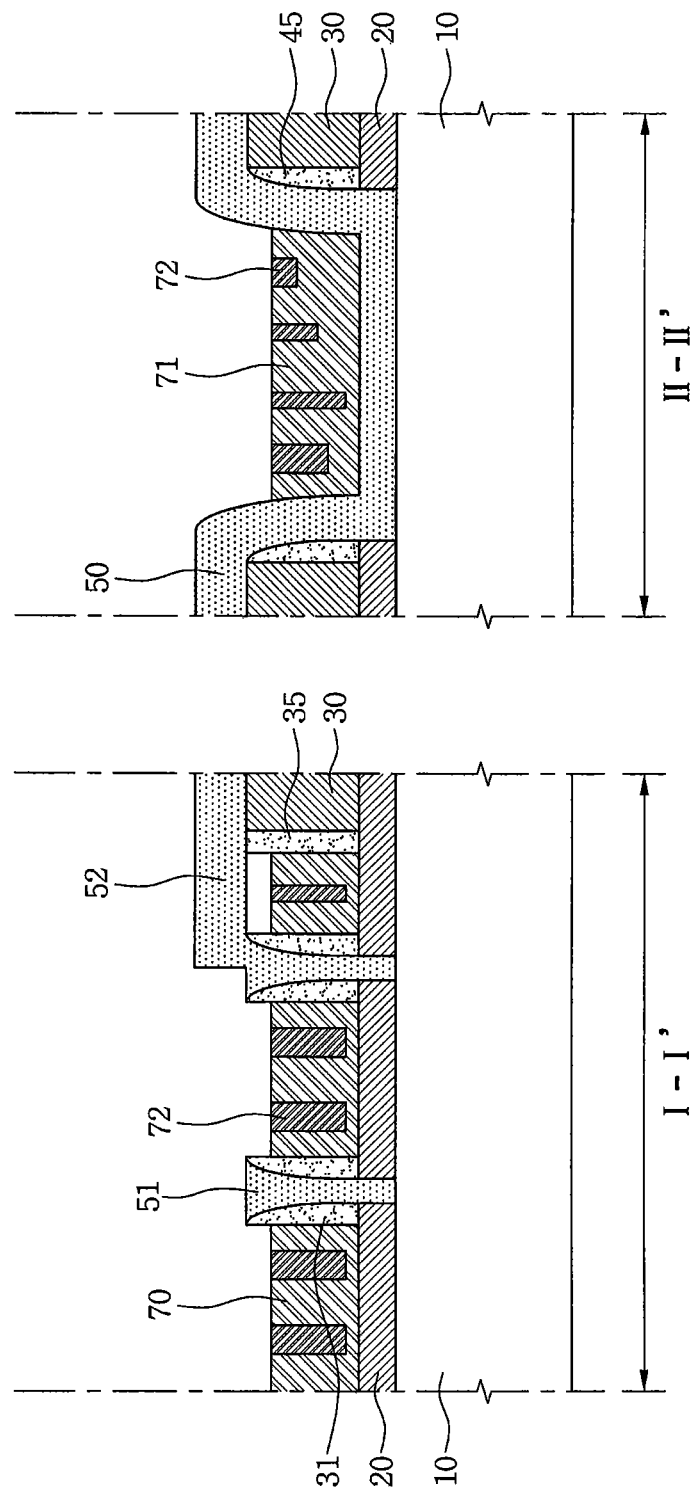

Referring to FIG. 8D, the lower portions of the second polymer blocks 72 may be spaced apart from the stopper layer 20. In FIGS. 8A to 8D, the neutralizing layer 75 in FIG. 7C is omitted.

Figure 9B:
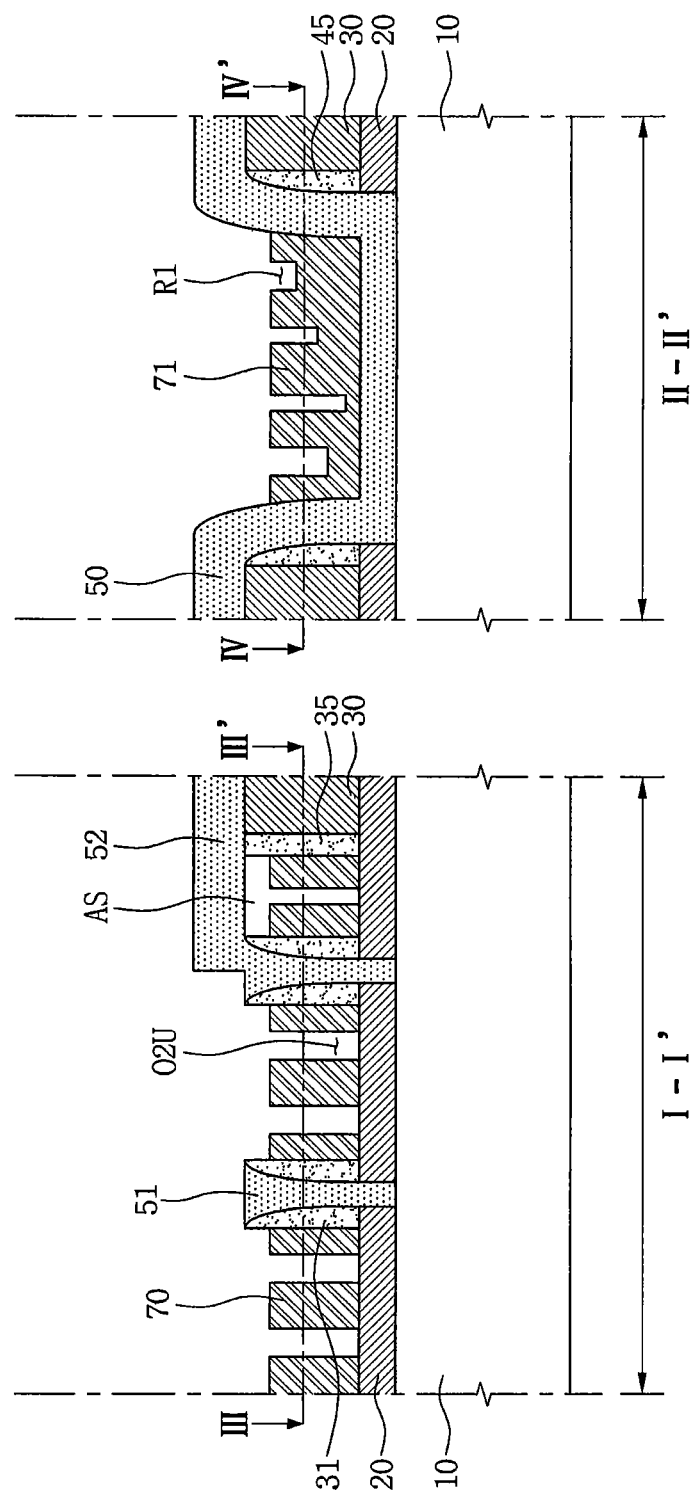

Referring to FIGS. 9A to 9C, the method may include performing a developing process to remove the second polymer blocks 72 and to form second upper openings (e.g., polymer block openings) O2U exposing the upper surface of the stopper layer 20. In the peripheral area PA, the first polymer blocks 71 may have upper recesses R1.

Figure 10A:
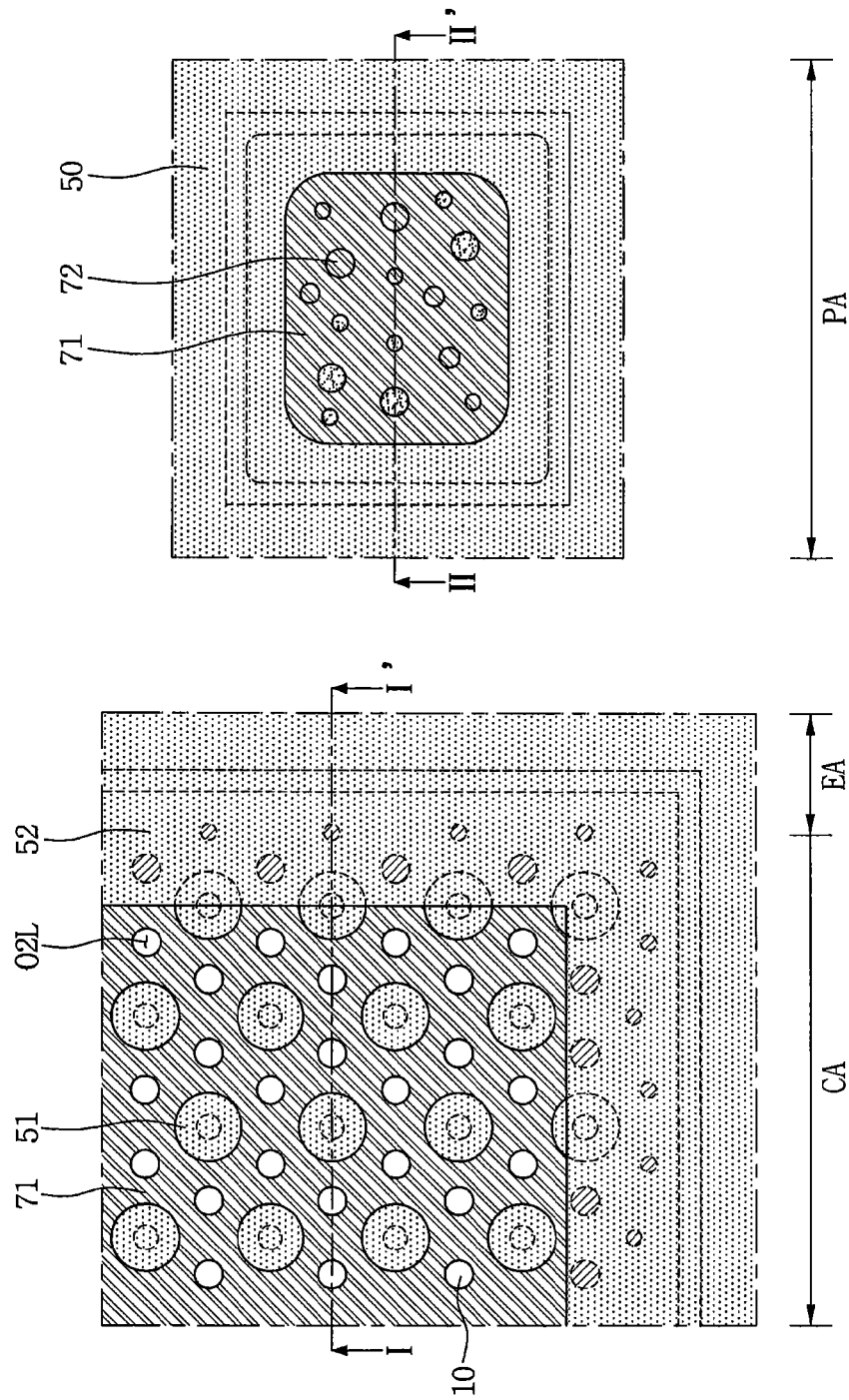
Figure 10B:
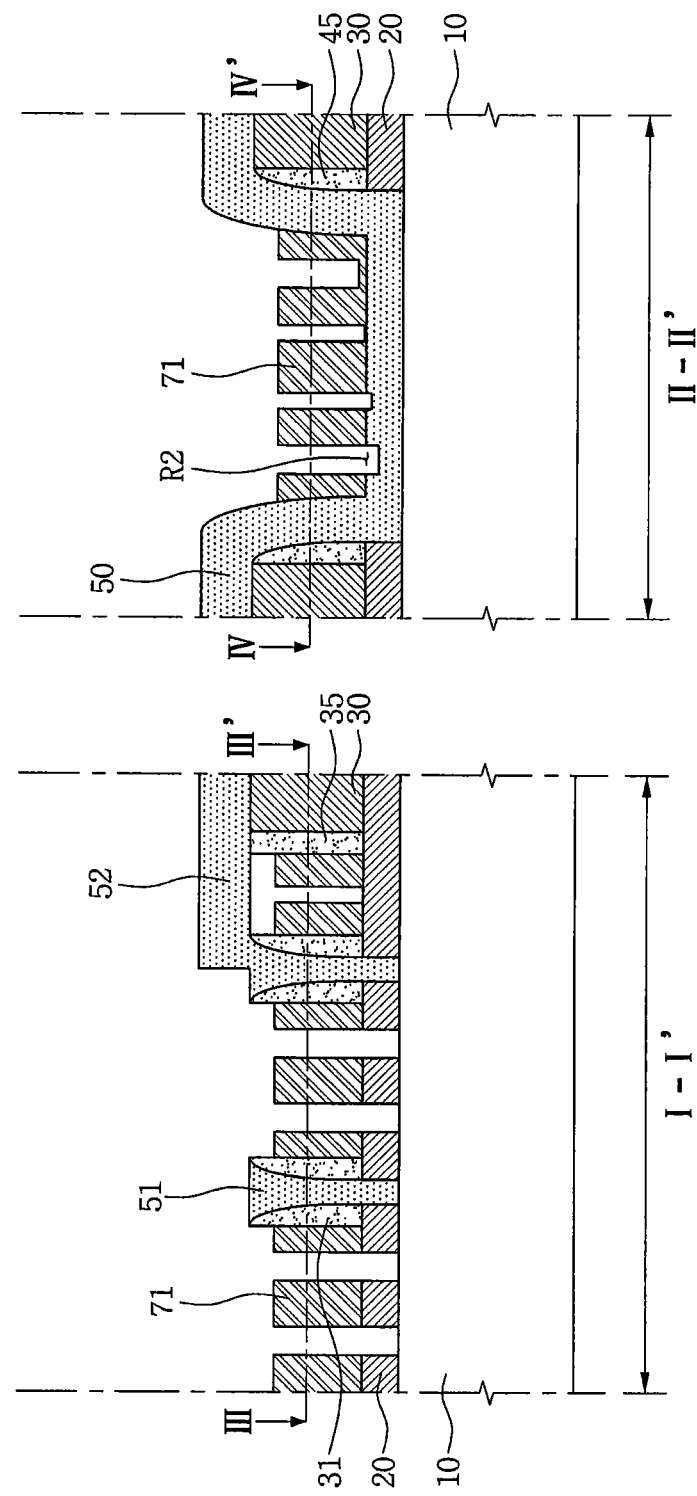
Figure 10C:
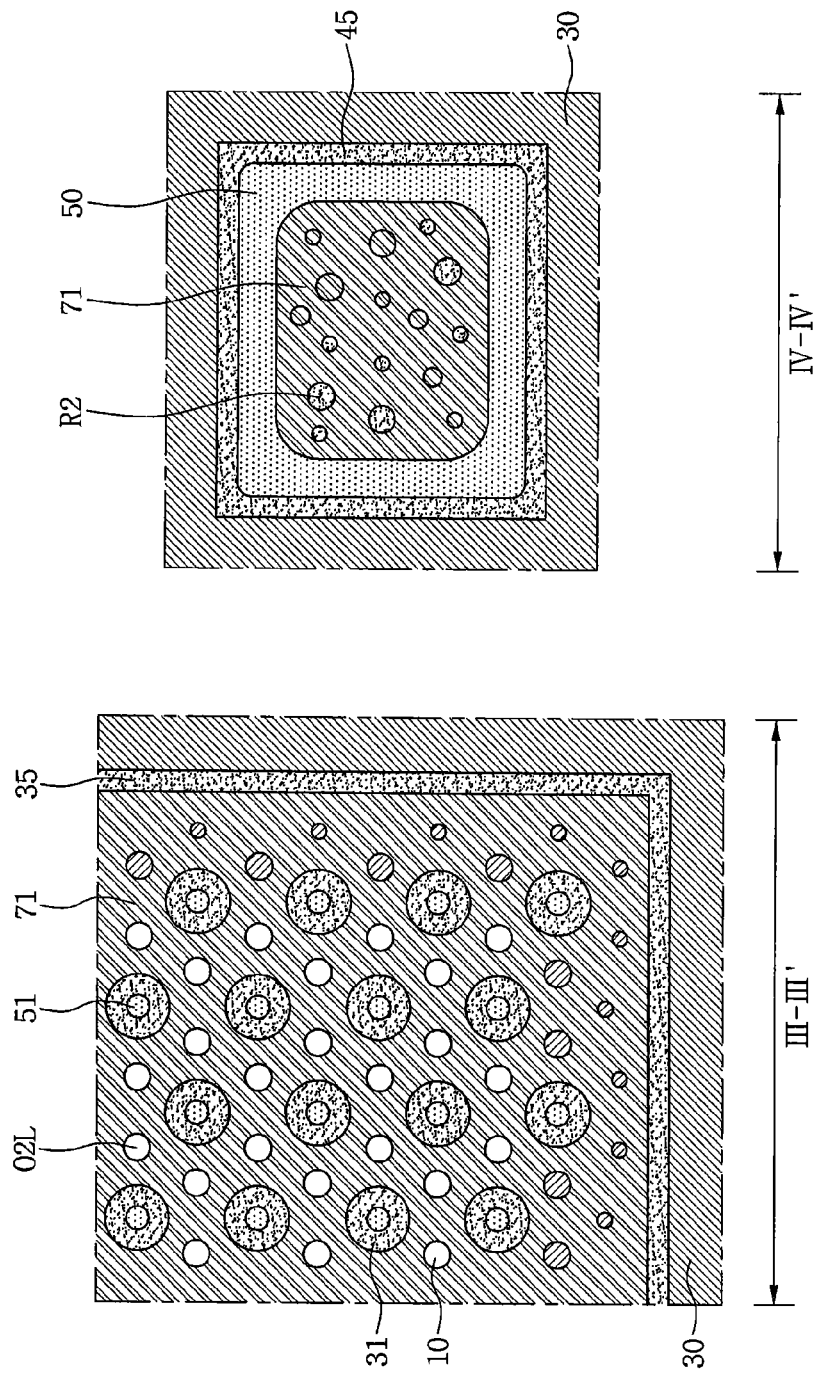

Referring to FIGS. 10A to 10C, the method may include selectively removing the stopper layer 20 exposed in the second upper openings O2U to form second lower openings (e.g., first stopper openings) O2L exposing the target layer 10 by performing, for example, an etch process. In the edge area EA, the second lower openings O2L may not be formed below the eaves pattern 52. In the peripheral area PA, lower recesses R2 aligned with the upper recesses R1 may be formed on the pillar material layer 50. In the air space AS covered by the eaves pattern 52, the stopper layer 20 exposed by the second upper openings O2U may not be removed.

Figure 11A:
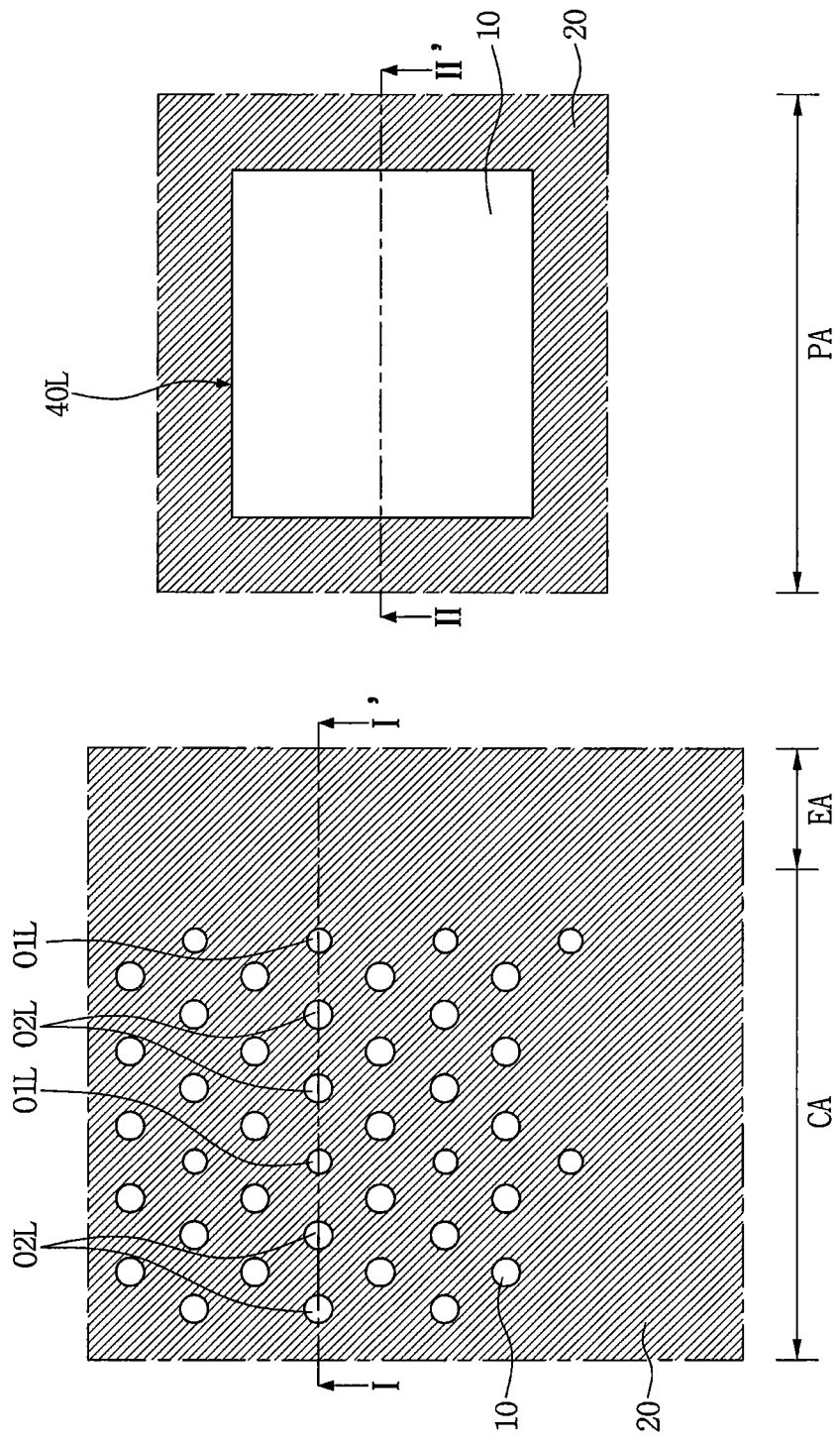

Referring to FIGS. 11A and 11B, the method may include removing the first polymer blocks 71, the pillar patterns 51, the eaves pattern 52, the dam pattern 35, the pillar material layer 50, and the trench spacer 45, and further removing the hard mask 30. The stopper layer 20 may include the first lower openings O1L and the second lower openings O2L exposing the target layer 10 in the cell area CA, and the lower peripheral trench 40L exposing the target layer 10 in the peripheral area PA.

Figure 11C:
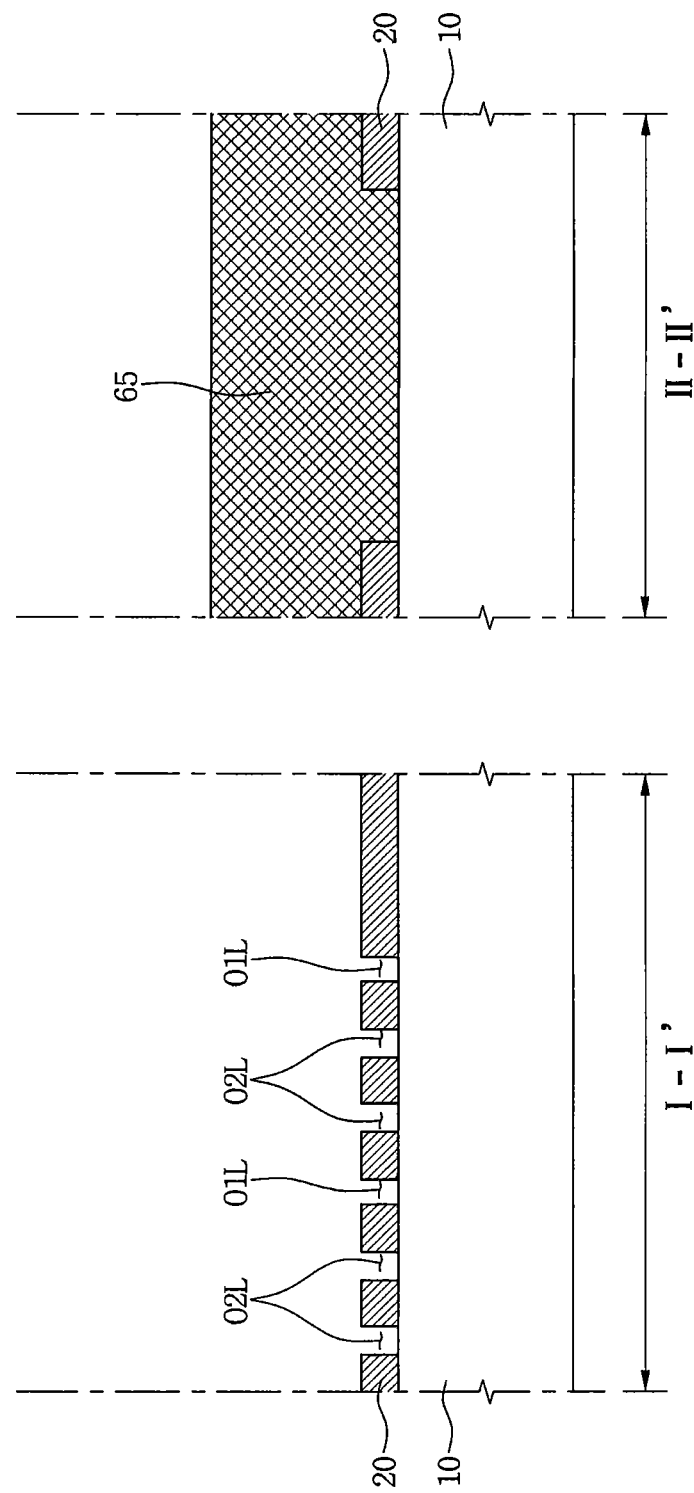

Referring to FIG. 11C, the method may further include forming a peripheral mask 65 on the peripheral area PA. The peripheral mask 65 may include a photoresist.

Figure 12A:
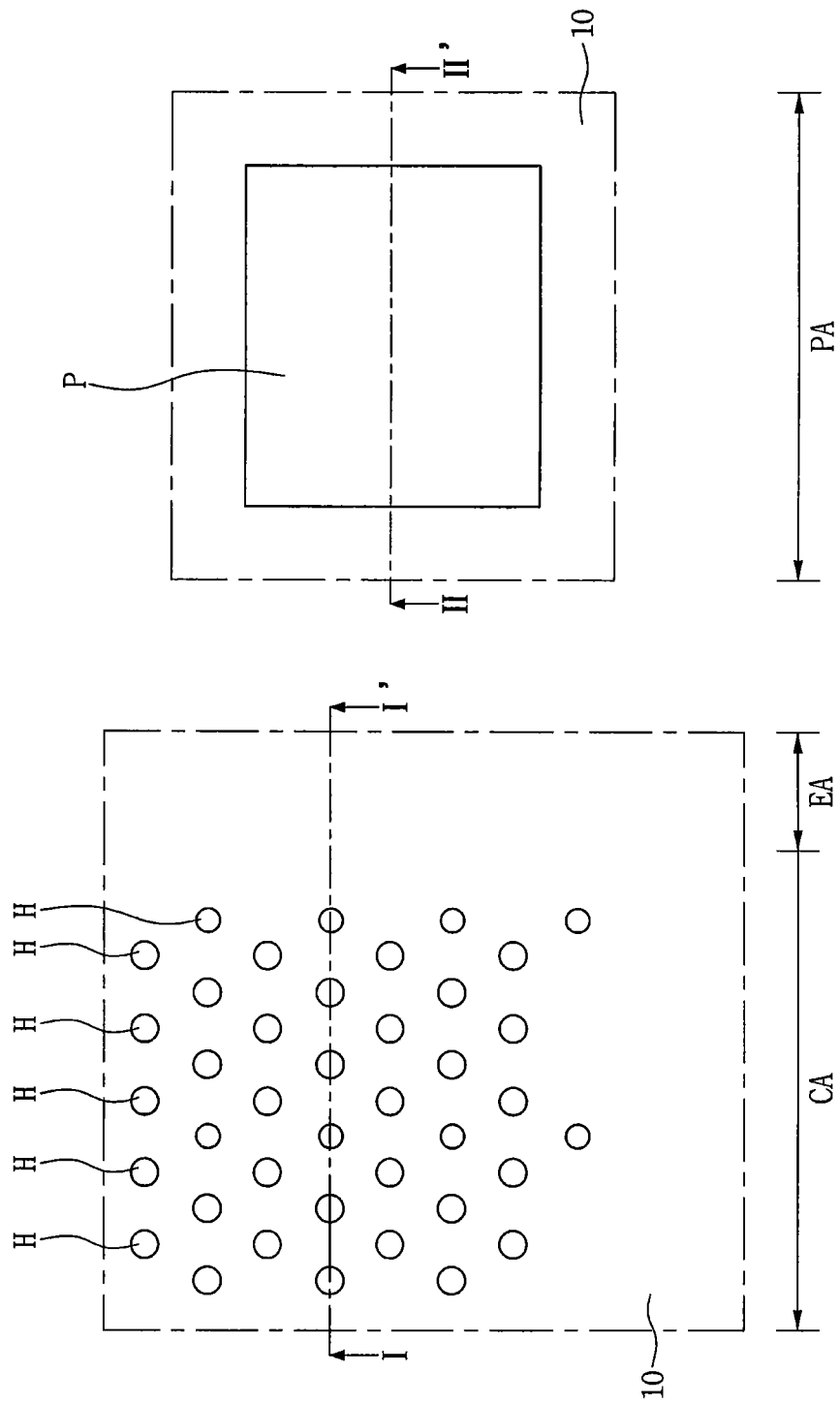
Figure 12B:
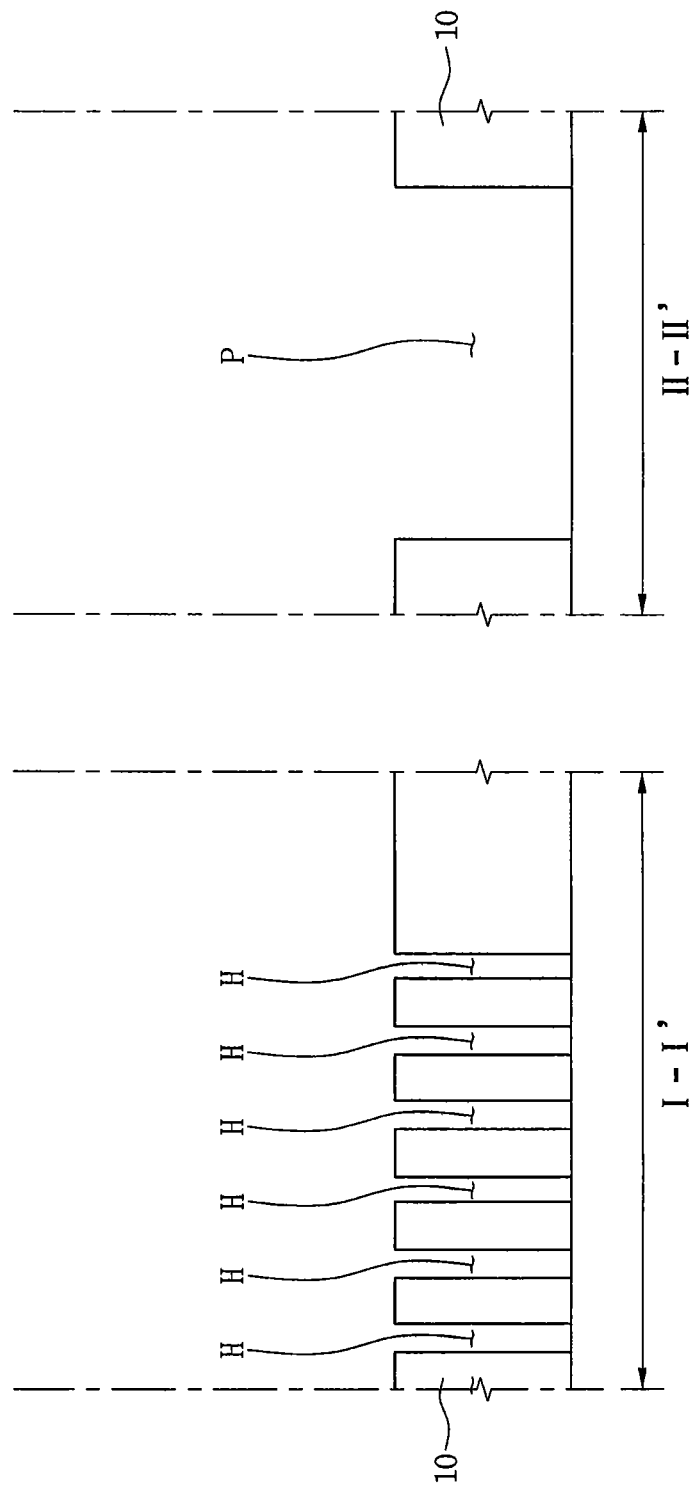

Referring to FIGS. 12A and 12B, the method may include etching the target layer 10 using the stopper layer 20 as an etch mask to form contact holes H, and removing the stopper layer 20. The contact holes H may be regularly spaced in a honeycomb pattern in the cell area CA, and no contact holes H may be formed in the edge area EA. The peripheral pattern P may be formed in the peripheral area PA.

Figure 12C:
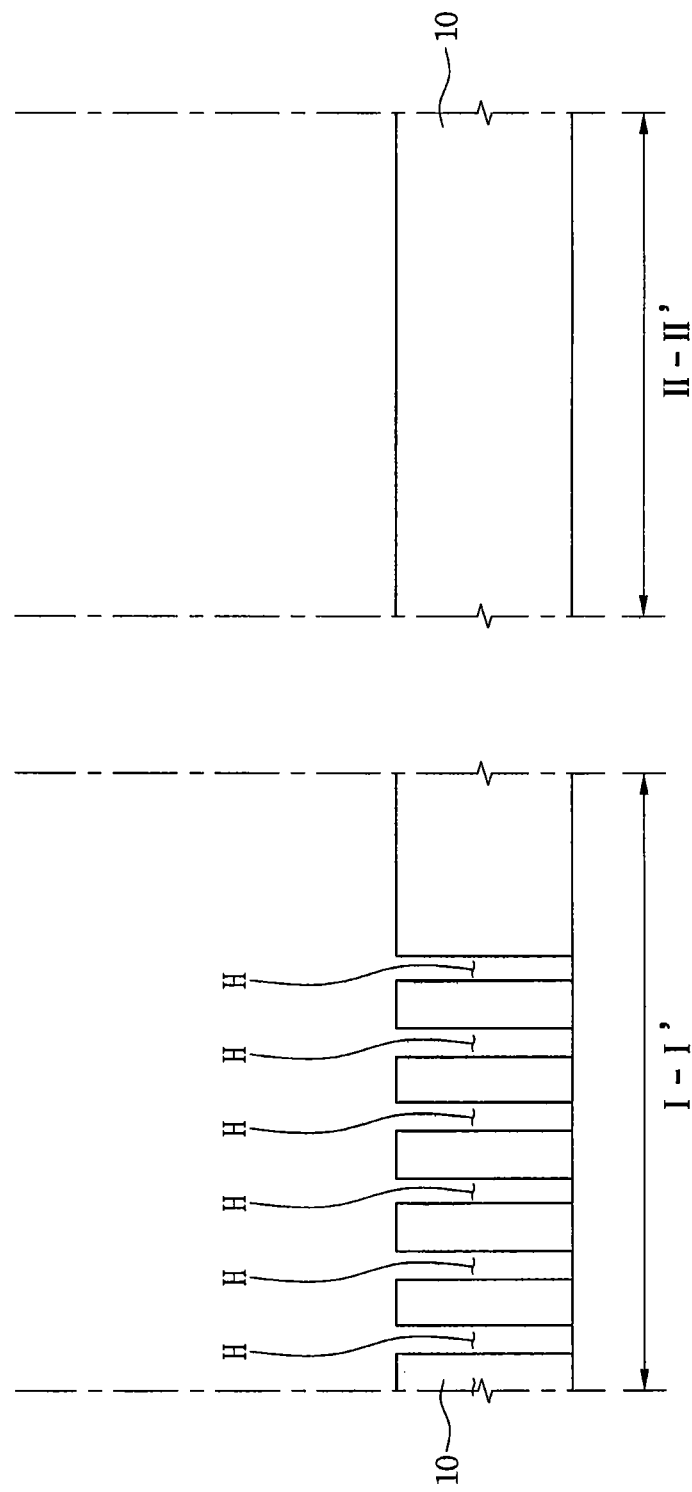

Referring to FIG. 12C, no patterns may be formed in the peripheral area PA due to the peripheral mask 65.

According to some embodiments of the inventive concepts, due to the dam pattern 35, the eaves pattern 52, and the pillar material layer 50, no openings or recess patterns in the first polymer blocks 71 of the block copolymer layer 70 may be transferred to the stopper layer 20 in the edge area EA and the peripheral area PA.

FIGS. 13A, 14A, 15A, 16A, 17A, 18A and 19A are plan views and FIGS. 13B, 14B, 15B, 16B, 17B, 18B, 18C, 19B and 19C are cross-sectional views illustrating a method of forming contact holes of semiconductor devices in accordance with some embodiments of the inventive concepts.

Figure 13A:
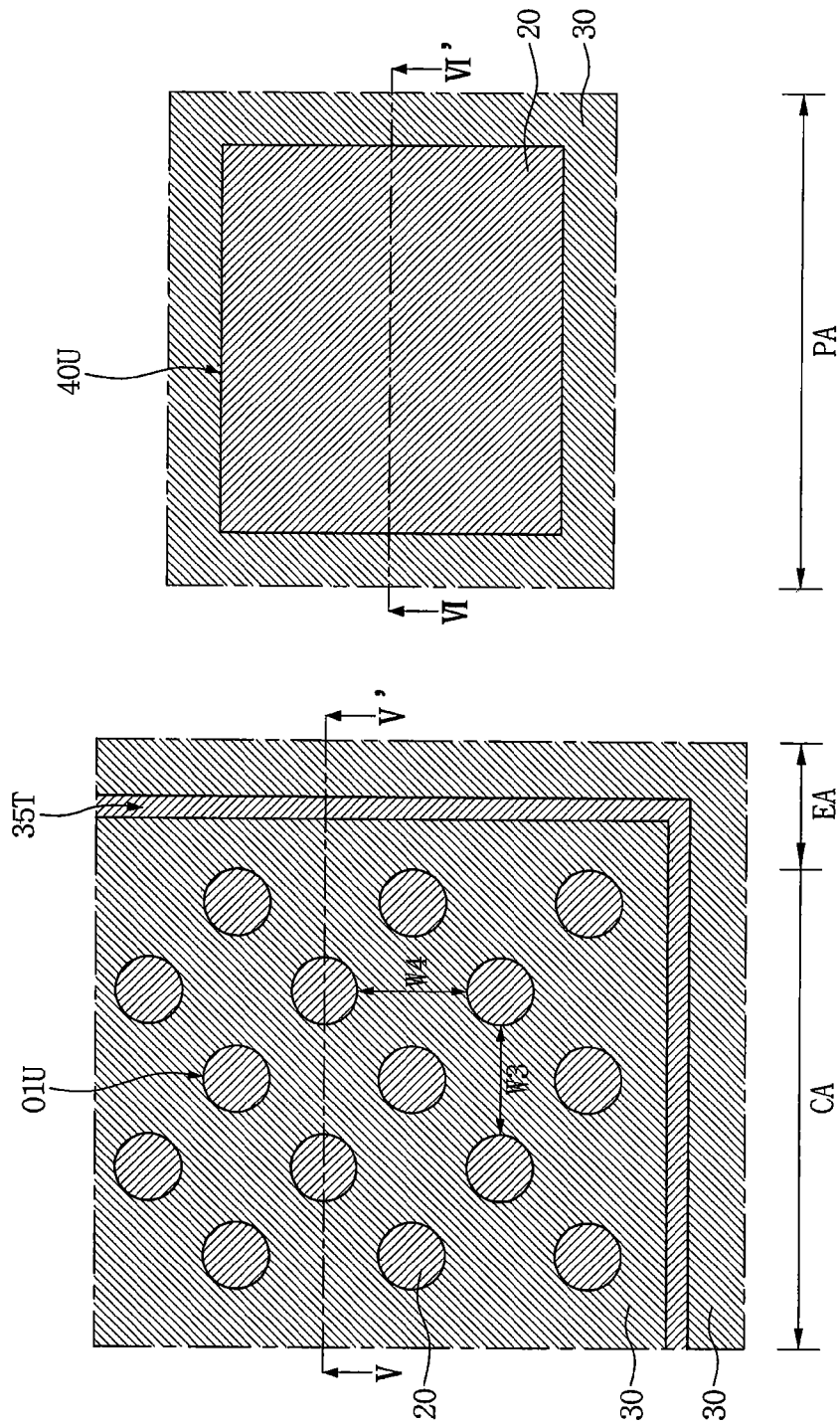
Figure 13B:
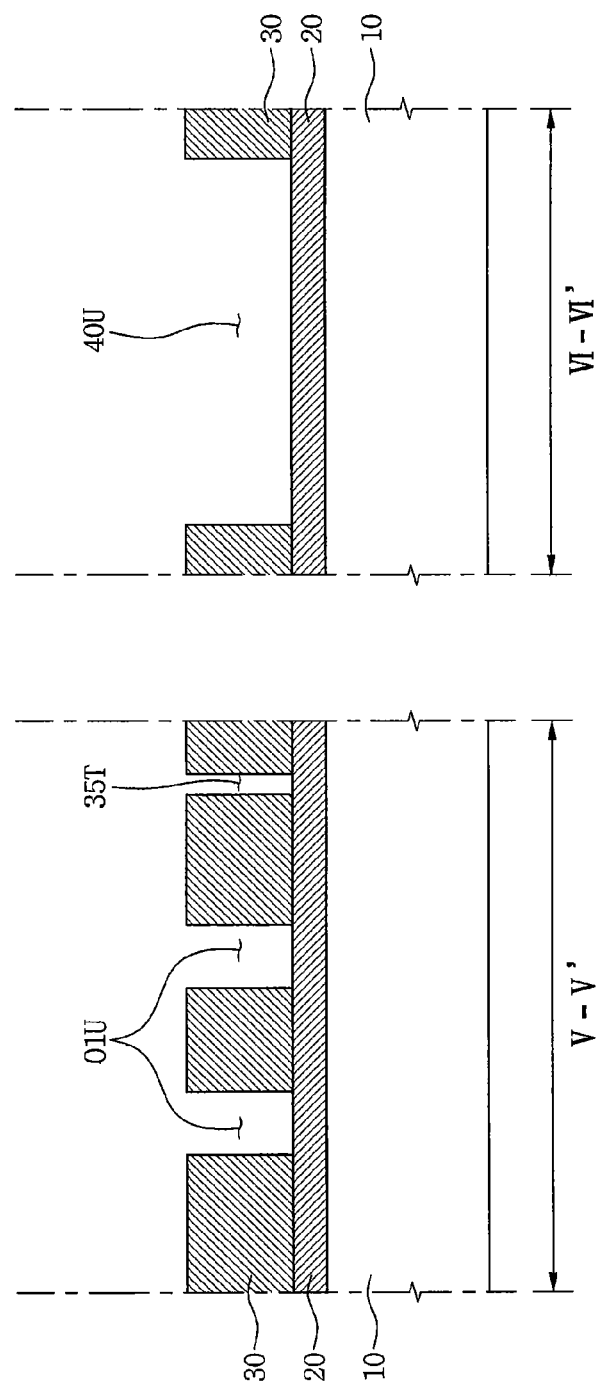

Referring to FIGS. 13A and 13B, a method of forming contact holes of a semiconductor device in accordance with some embodiments of the inventive concepts may include forming a stopper layer 20 on a target layer 10, and forming a hard mask 30 having first upper openings O1U, a dam trench 35T, and an upper peripheral trench 40U on the stopper layer 20.

The first upper openings O1U may be disposed in a zigzag pattern in a cell area CA. For example, a transverse interval W3 between the two first upper openings O1U and a longitudinal interval W4 between the two first upper openings O1U may be similar or substantially the same as illustrated in FIG. 13A.

Figure 14A:
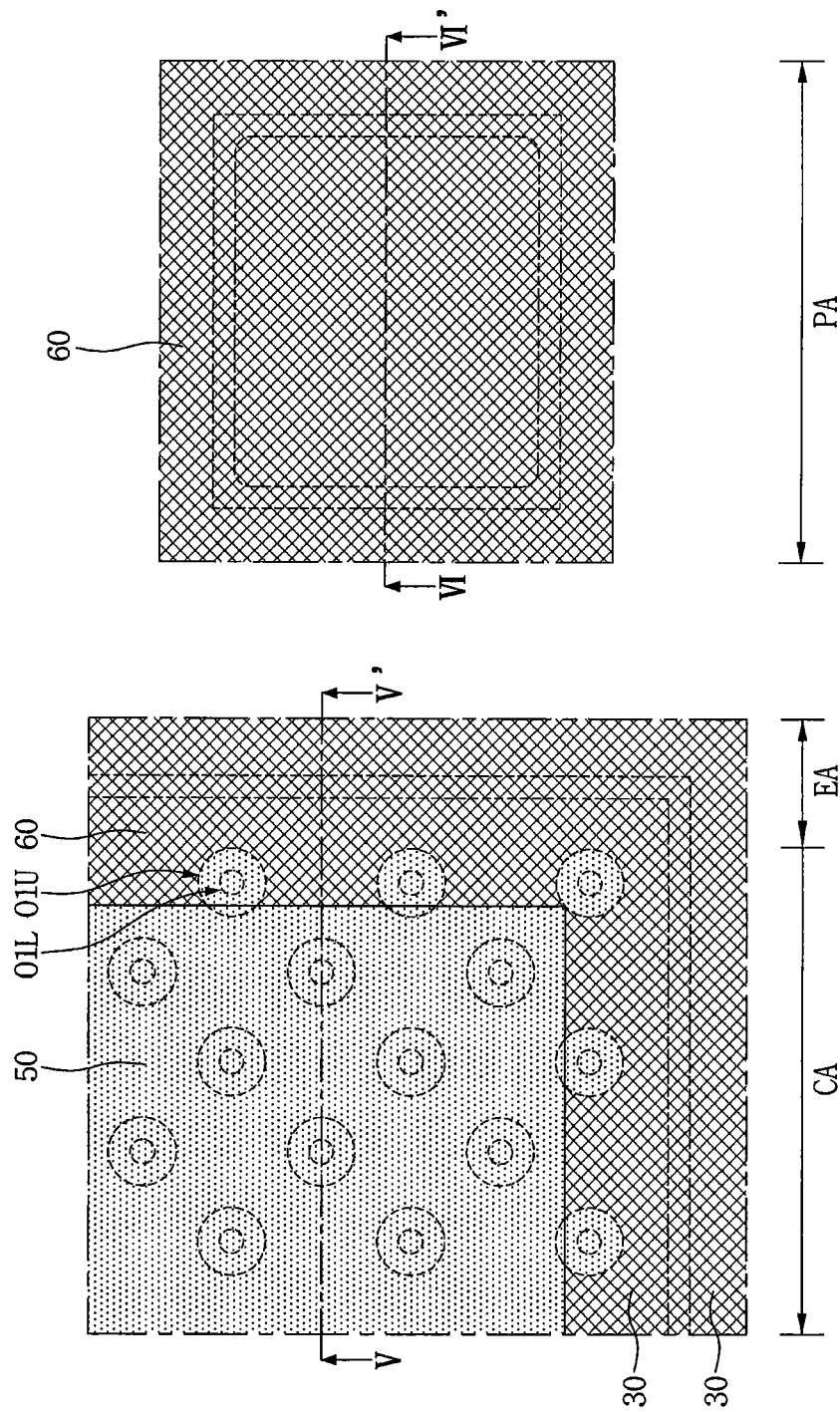
Figure 14B:
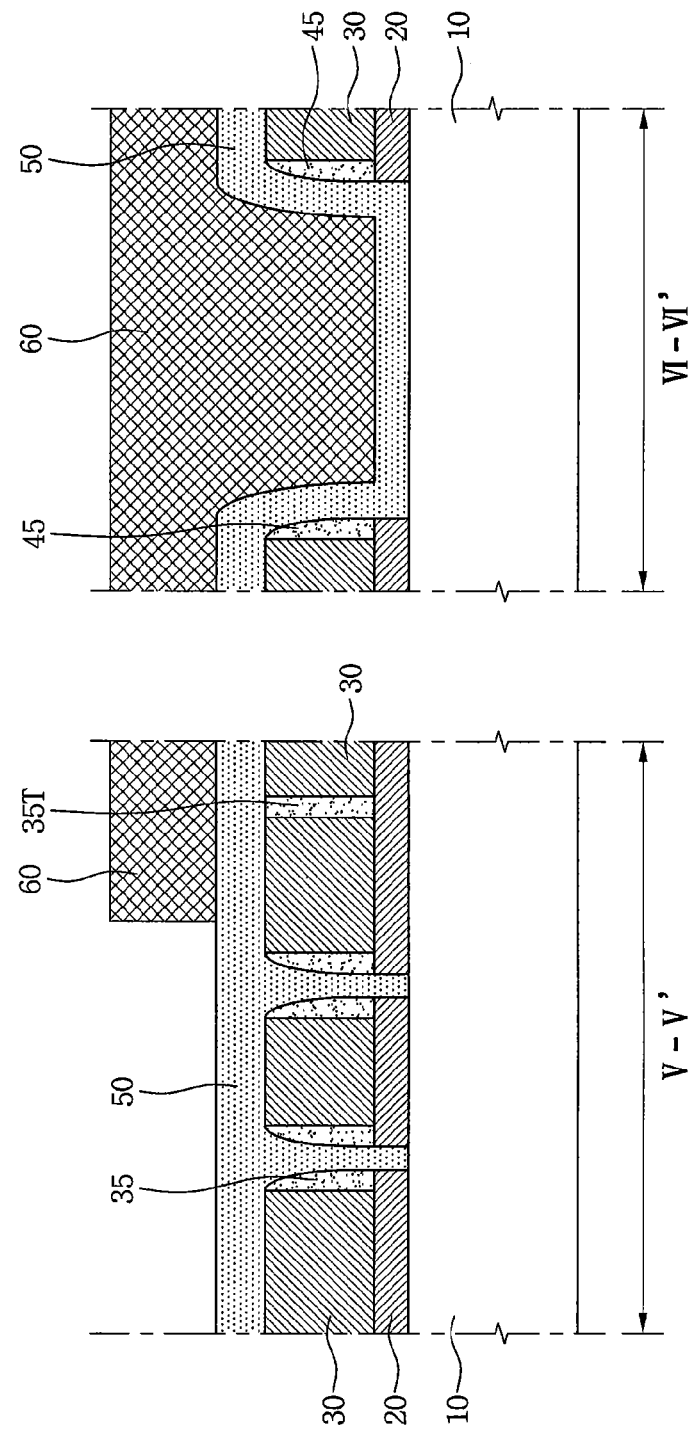

Referring to FIGS. 14A and 14B, the method may include performing processes similar to the processes described with reference to FIGS. 2A, 3A and 4A: forming opening spacers 31 on inner walls of the first upper openings O1U, forming a dam pattern 35 in the dam trench 35T and forming a trench spacer 45 on an inner wall of the upper peripheral trench 40U; selectively etching the stopper layer 20 using the hard mask 30, the opening spacers 31, the dam pattern 35 and the trench spacer 45 as an etch mask to form first lower openings O1L and a lower peripheral trench 40L; forming a pillar material layer 50 on the trench spacer 45 and in the lower peripheral trench 40L; and forming a trimming mask 60 on the edge area EA and the peripheral area PA and exposing the pillar material layer 50 in the cell area CA.

Referring to FIG. 14A, an inner perimeter of the trimming mask 60 may cross the first upper openings O1U but may not cross the first lower openings O1L.

Figure 15B:
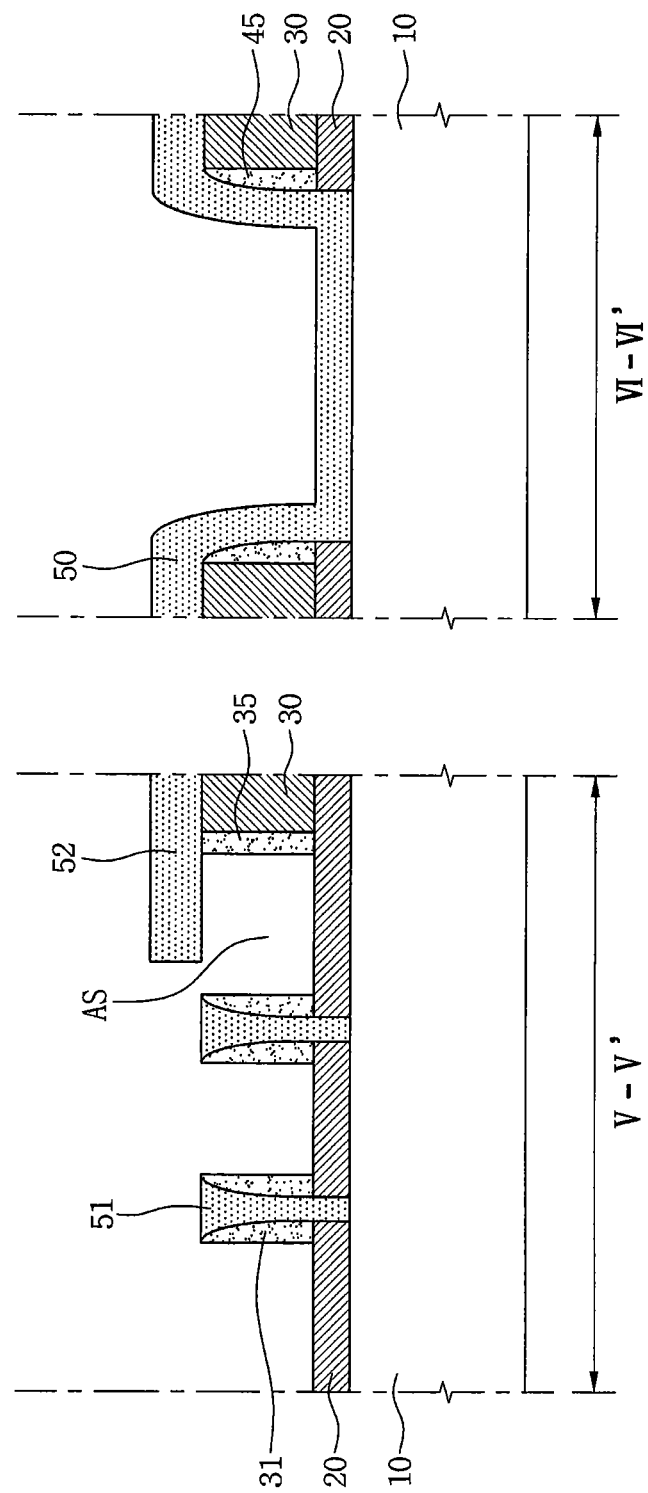

Referring to FIGS. 15A and 15B, the method may include performing processes similar to the processes described with reference to FIGS. 5A and 6A: removing an upper portion of the pillar material layer 50 in the cell area CA using the trimming mask 60 to form pillar patterns 51 in the cell area CA and an eaves pattern 52 in the edge area EA; and removing the trimming mask 60 and the hard mask 30 exposed in the cell area CA.

In the cell area CA, the stopper layer 20 between the pillar patterns 51 may be exposed, and in the edge area EA, an air space AS may be formed below the eaves pattern 52. The dam pattern 35 may possibly prevent expansion of air space AS to an outside of the edge area EA. Accordingly, the hard mask 30 in the outside of the dam pattern 35 in the edge area EA and the peripheral area PA may remain.

Figure 16B:
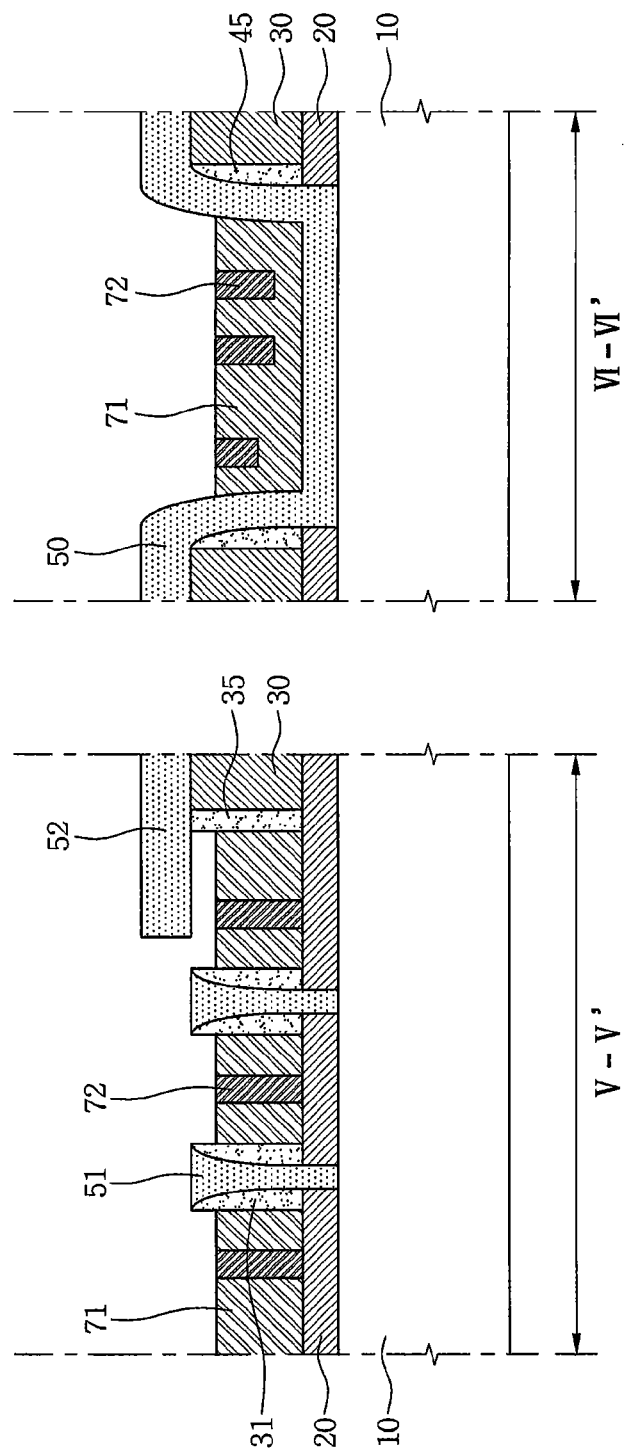

Referring to FIGS. 16A and 16B, the method may include performing processes similar to the processes described in FIGS. 7A and 8A to form first polymer blocks 71 and second polymer blocks 72 between the pillar patterns 51. Further referring again to FIG. 7C, the method may include conformally forming a neutralizing layer 75 before forming the block copolymer layer 70.

Figure 17B:
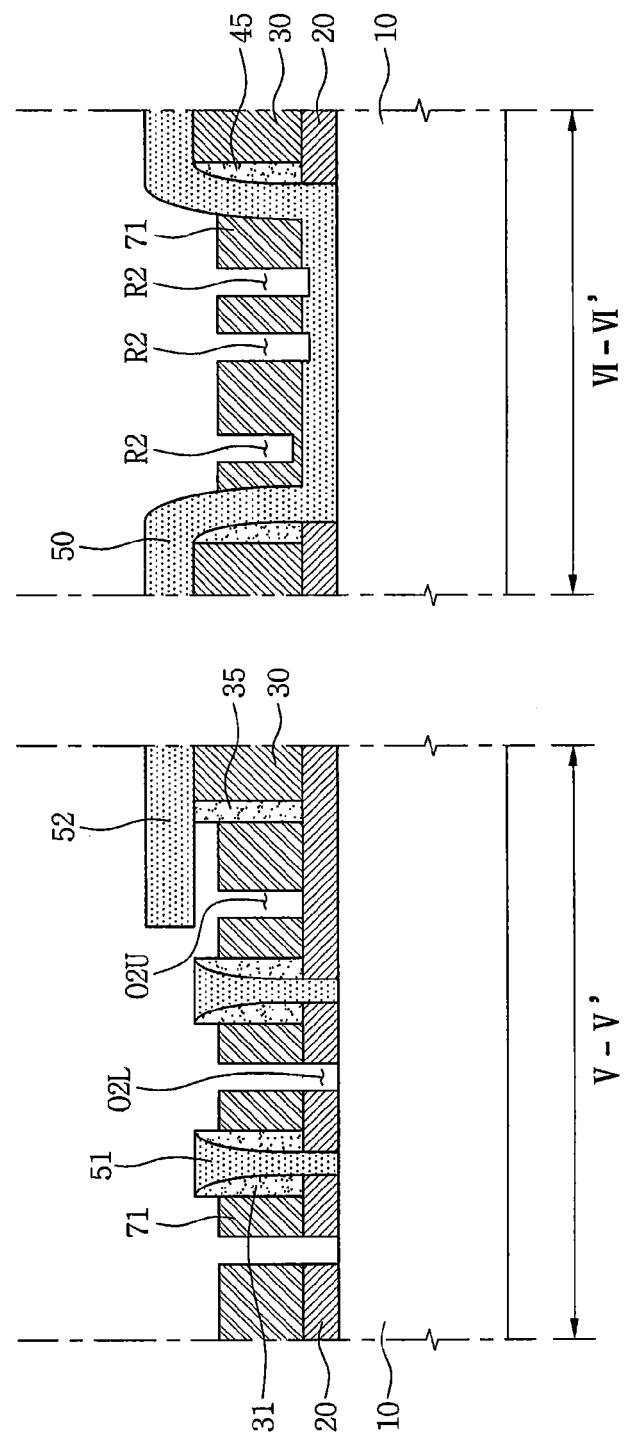

Referring to FIGS. 17A and 17B, the method may include performing processes similar to the processes described in FIGS. 9A and 10A: removing the second polymer blocks 72 to form second upper openings O2U exposing a surface of the stopper layer 20 in the cell area CA; and selectively removing the stopper layer 20 exposed in the second upper openings O2U using the first polymer blocks 71 as an etch mask to form second lower openings O2L exposing the target layer 10. The second lower openings O2L may not be formed below the eaves pattern 52 in the edge area EA. In the peripheral area PA, recesses R2 may be formed in the first polymer block 71 or the pillar material layer 50.

Referring to FIGS. 18A and 18B, the method may include performing process similar to the processes described in FIG. 11A to remove the first polymer blocks 71, the pillar patterns 51, the eaves pattern 52, the dam pattern 35, the pillar material layer 50, and the trench spacer 45, and further remove the hard mask 30. The stopper layer 20 may include the first lower openings O1L and the second lower openings O2L exposing the target layer 10 in the cell area CA, and the peripheral trench 40L exposing the target layer 10 in the peripheral area PA.

Referring to FIG. 18C, the method may further include forming a peripheral mask 65 on the peripheral area PA. The peripheral mask 65 may include a photoresist.

Figure 19A:
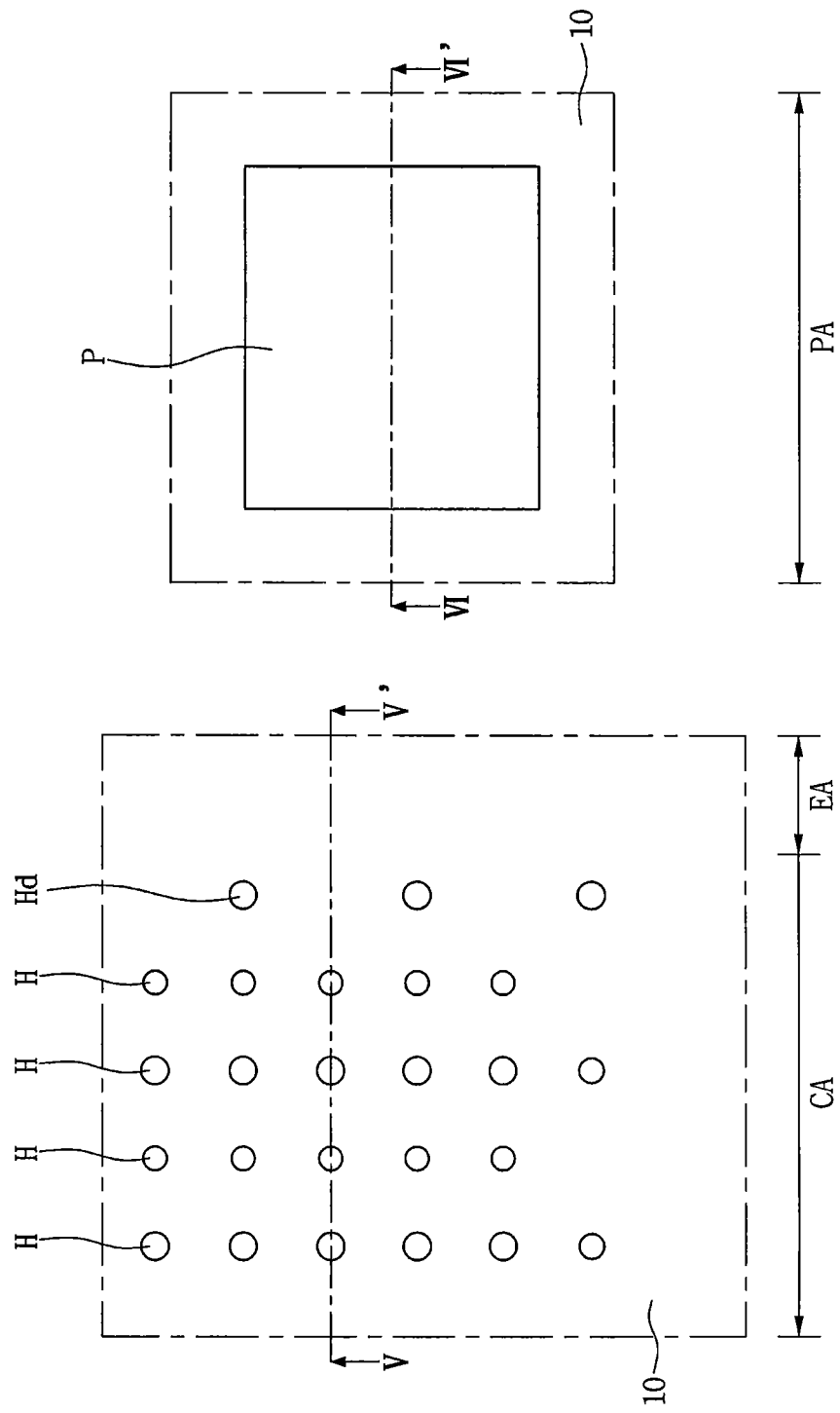
Figure 19B:
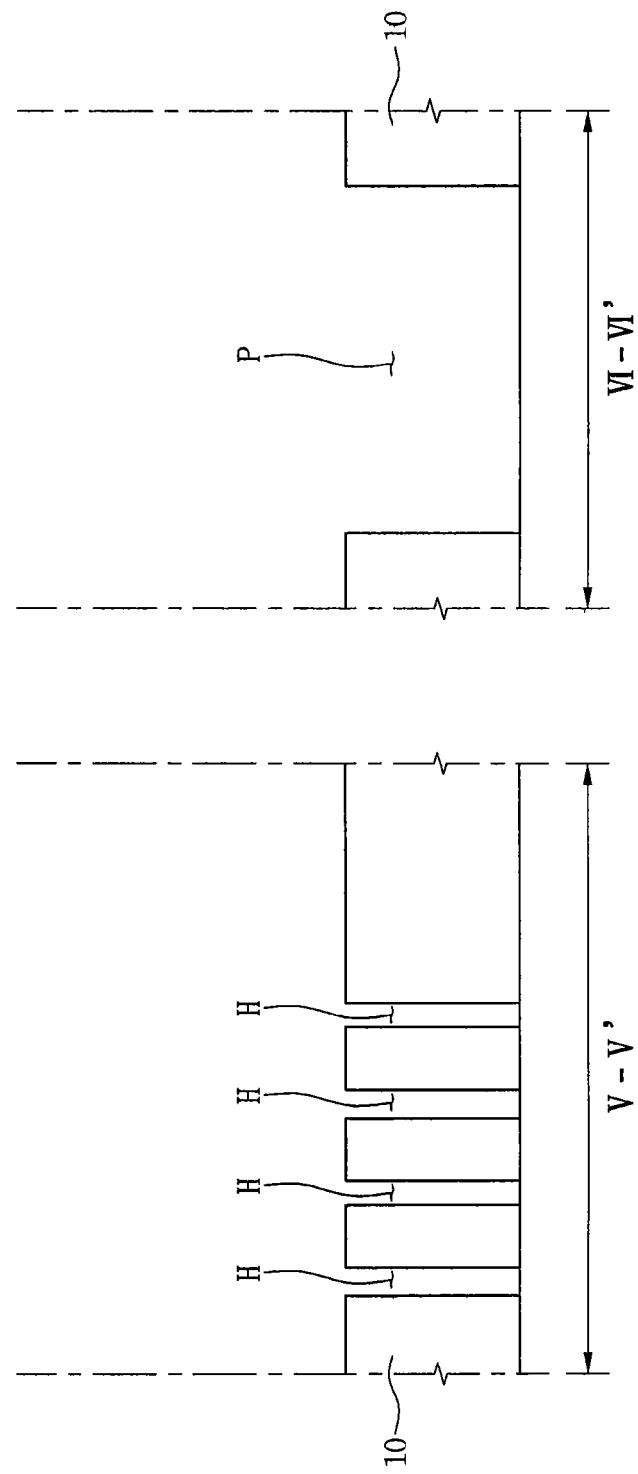

Referring to FIGS. 19A and 19B, the method may include performing process similar to the processes described with reference to FIG. 12A, etching the target layer 10 using the stopper layer 20 as an etch mask to form contact holes H, and removing the stopper layer 20. The contact holes H may be regularly spaced in a lattice pattern in the cell area CA, dummy contact holes Hd may be disposed every two rows and/or every two columns in the edge area EA, and a peripheral pattern P may be disposed in the peripheral area PA.

Figure 19C:
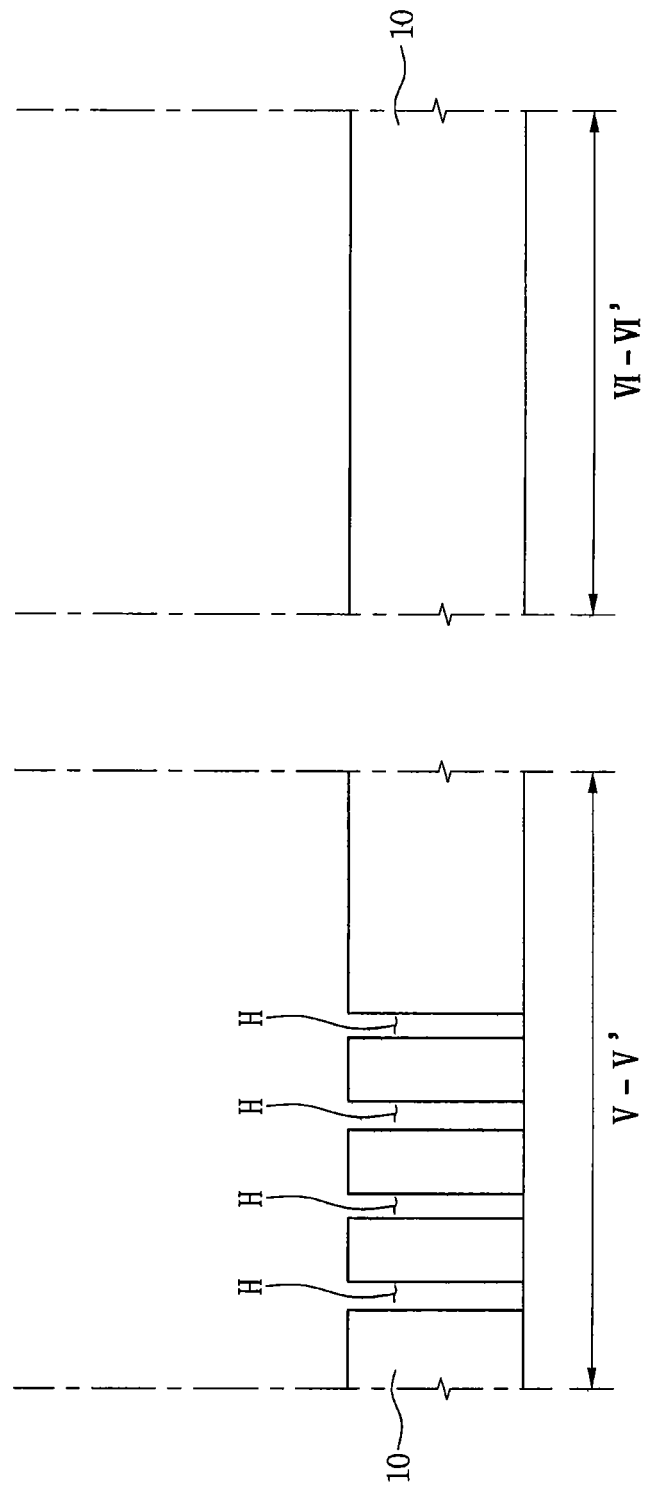

Referring to FIG. 19C, no patterns may be formed in the peripheral area PA due to the peripheral mask 65.

FIGS. 20A, 21A, 22A, 23A, 24A, 25A and 26A are plan views and FIGS. 20B, 21B, 22B, 23B, 24B, 25B, 25C, 26B and 26C are cross-sectional views illustrating a method of forming contact holes of semiconductor devices in accordance with some embodiments of the inventive concepts.

Figure 20A:
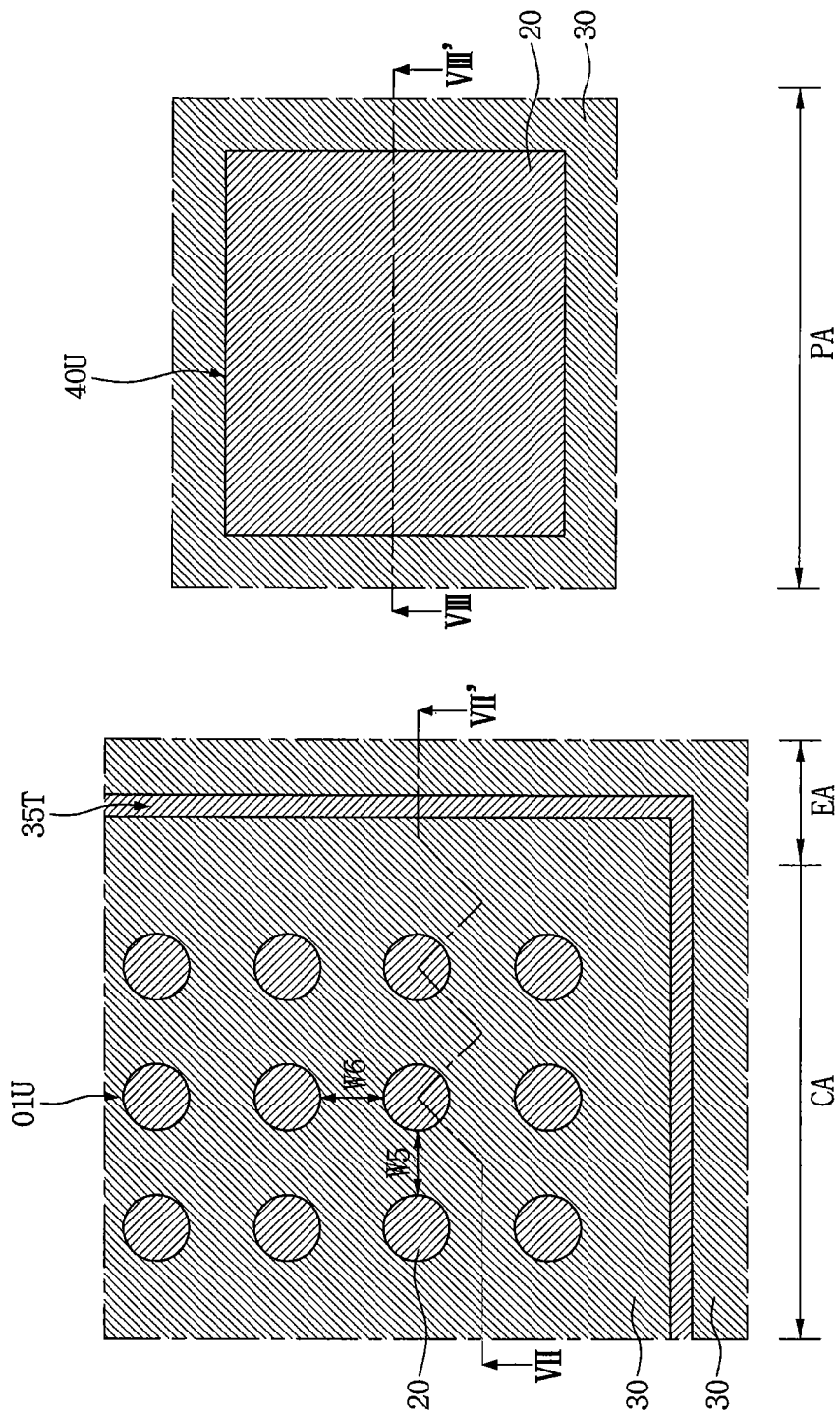
Figure 20B:
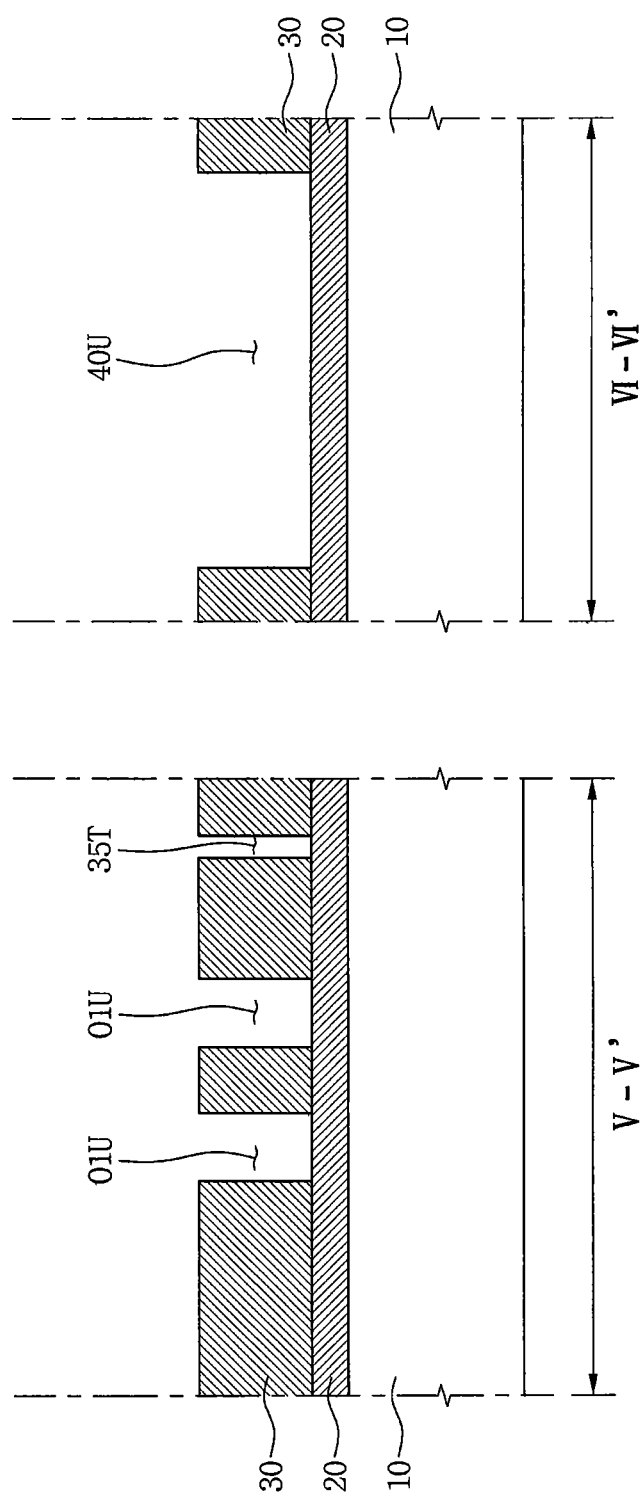

Referring to FIGS. 20A and 20B, a method of forming contact holes in accordance with some embodiments of the inventive concepts may include forming a stopper layer 20 on a target layer 10, and forming a hard mask 30 having first upper openings O1U, a dam trench 35T, and an upper peripheral trench 40U on the stopper layer 20.

The first upper openings O1U may be regularly spaced in a lattice pattern. For example, a traverse interval W5 between the two first upper openings O1U and a longitudinal interval W6 between the two first upper openings O1U may be similar or substantially the same as illustrated in FIG. 20A.

Figure 21B:
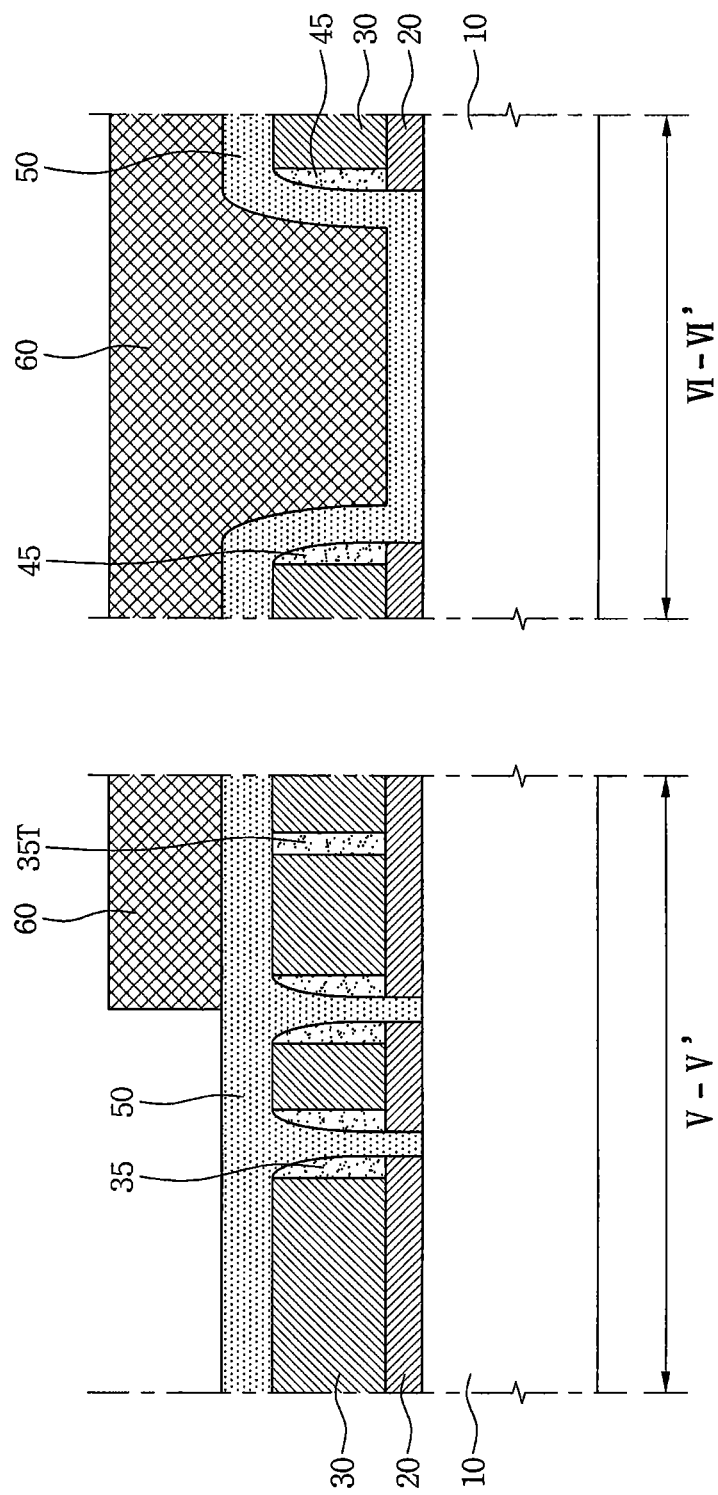

Referring to FIGS. 21A and 21B, the method may include performing process similar to the processes described in FIGS. 2A, 3A and 4A: forming opening spacers 31 on inner walls of the first upper openings O1U, forming a dam pattern 35 in the dam trench 35T, forming trench spacer 45 on an inner wall of the upper peripheral trench 40U; selectively etching the stopper layer 29 using the hard mask 30, the opening spacers 31, the dam pattern 35, and the trench spacer 45 as an etch mask to form first lower openings O1L and a lower peripheral trench 40L; forming a pillar material layer 50 on the trench spacer 45 and in the lower peripheral trench 40L; and forming a trimming mask 60 on the edge area EA and the peripheral area PA and exposing the pillar material layer 50 in the cell area CA.

Figure 22B:
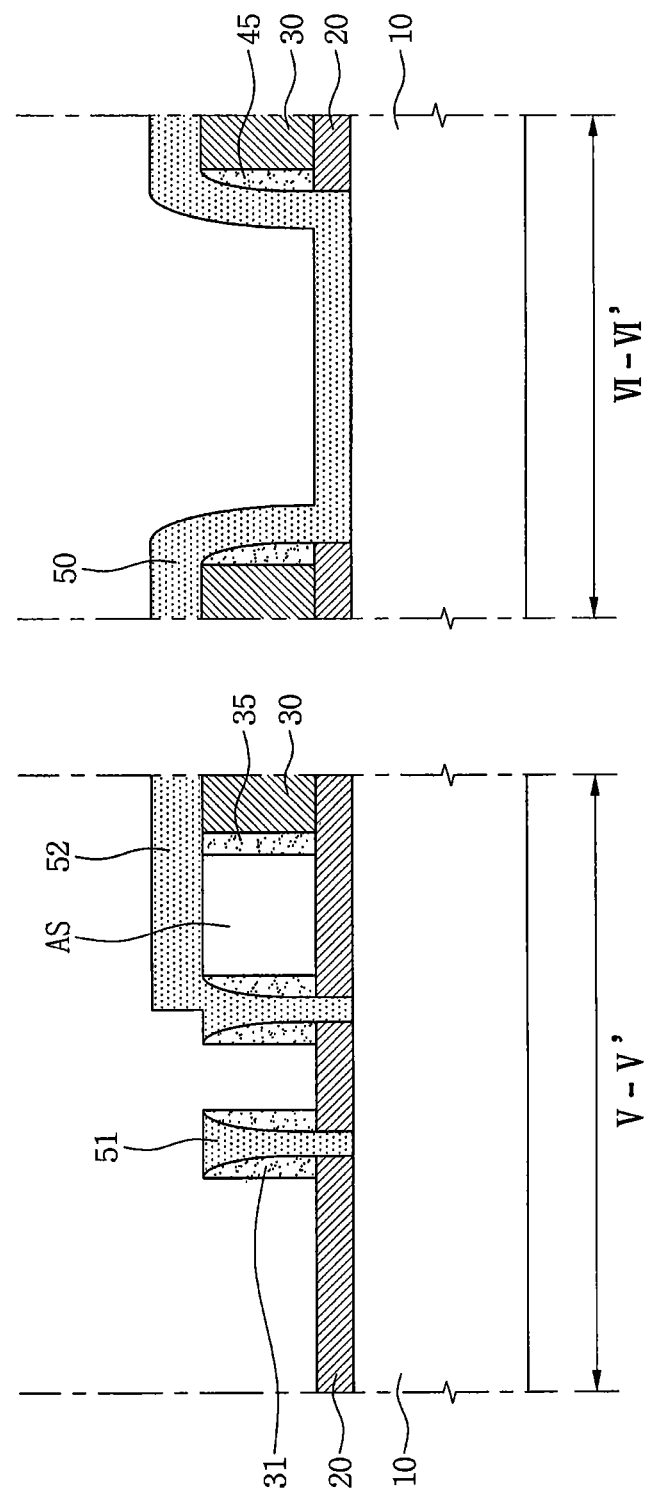

Referring to FIGS. 22A and 22B, the method may include performing processes similar to the processes described with reference to FIGS. 5A and 6A: removing an upper portion of the pillar material layer 50 in the cell area CA using the trimming mask 60 as an etch mask to form pillar patterns 51 in the cell area CA and an eaves pattern 52 in the edge area EA; and removing the trimming mask 60 and the hard mask 30 exposed in the cell area CA.

In the cell area CA, the stopper layer 20 between the pillar patterns 51 may be exposed, and an air space AS may be formed below the eaves pattern 52 in the edge area EA. The hard mask 30 in the edge area EA of an outside of the dam pattern 35 and in the peripheral area PA may remain because of the dam pattern 35.

Figure 23A:
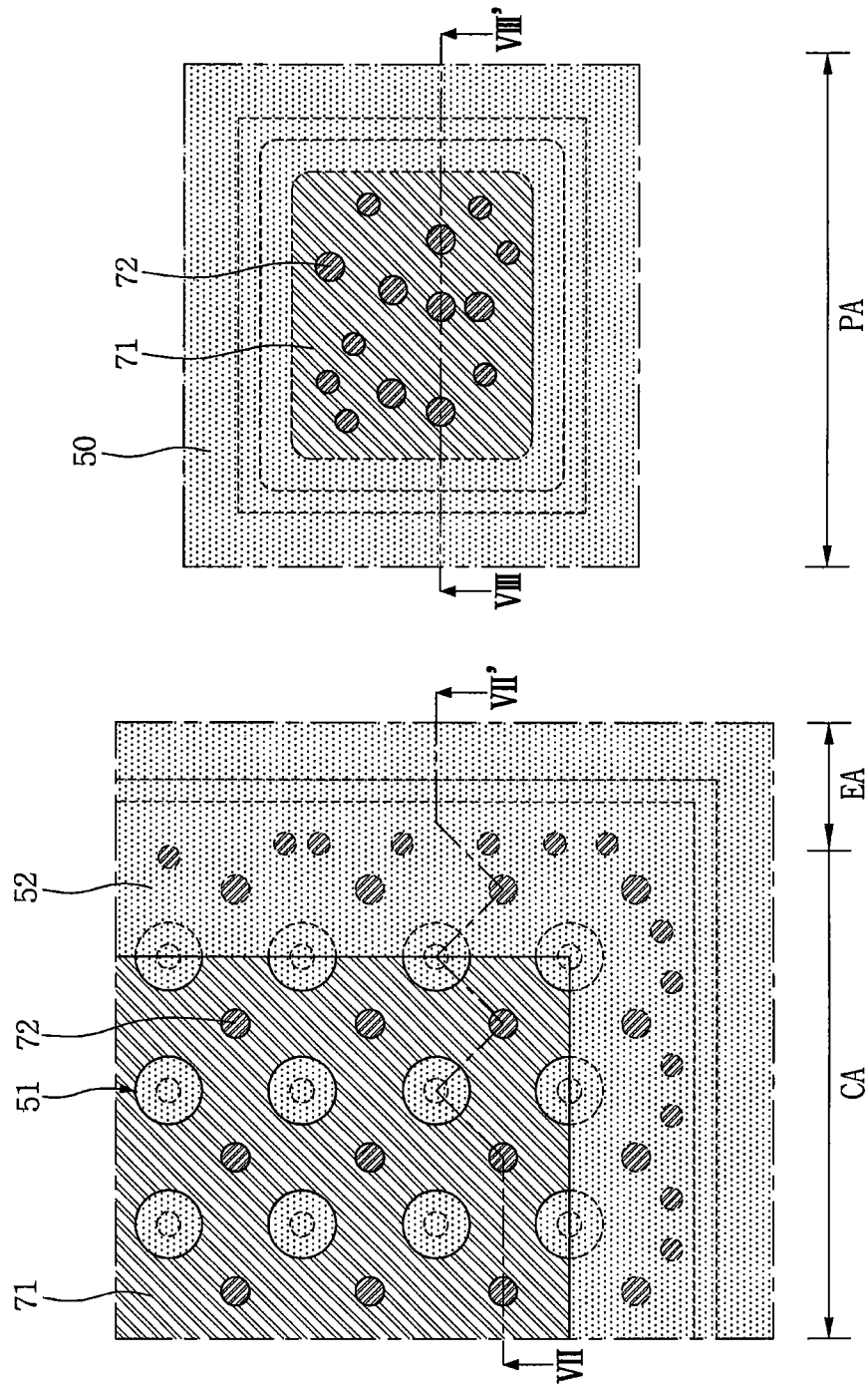
Figure 23B:
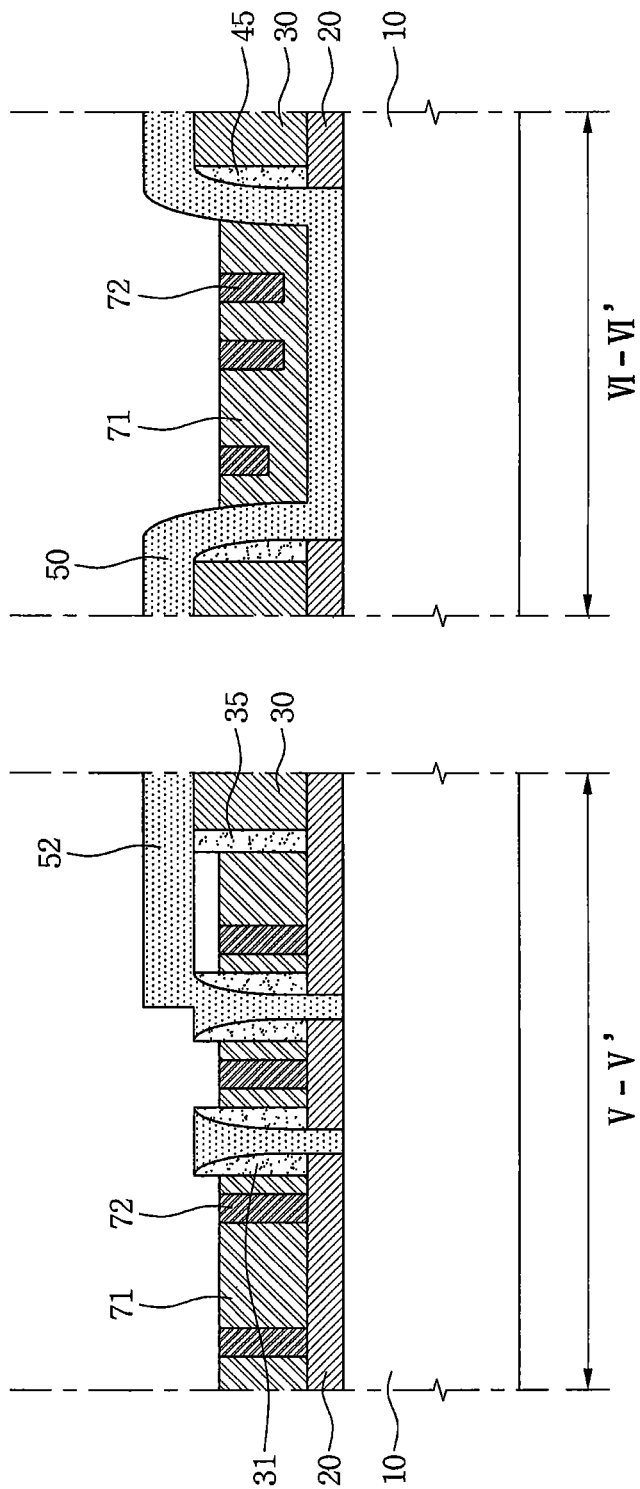

Referring to FIGS. 23A and 23B, the method may include performing processes similar to the processes described with reference to FIGS. 7A and 8A, forming first polymer blocks 71 and second polymer blocks 72 between the pillar patterns 51. Further referring to FIG. 7C, the method may further include conformally forming a neutralizing layer 75 before forming the block copolymer layer 70.

Figure 24B:
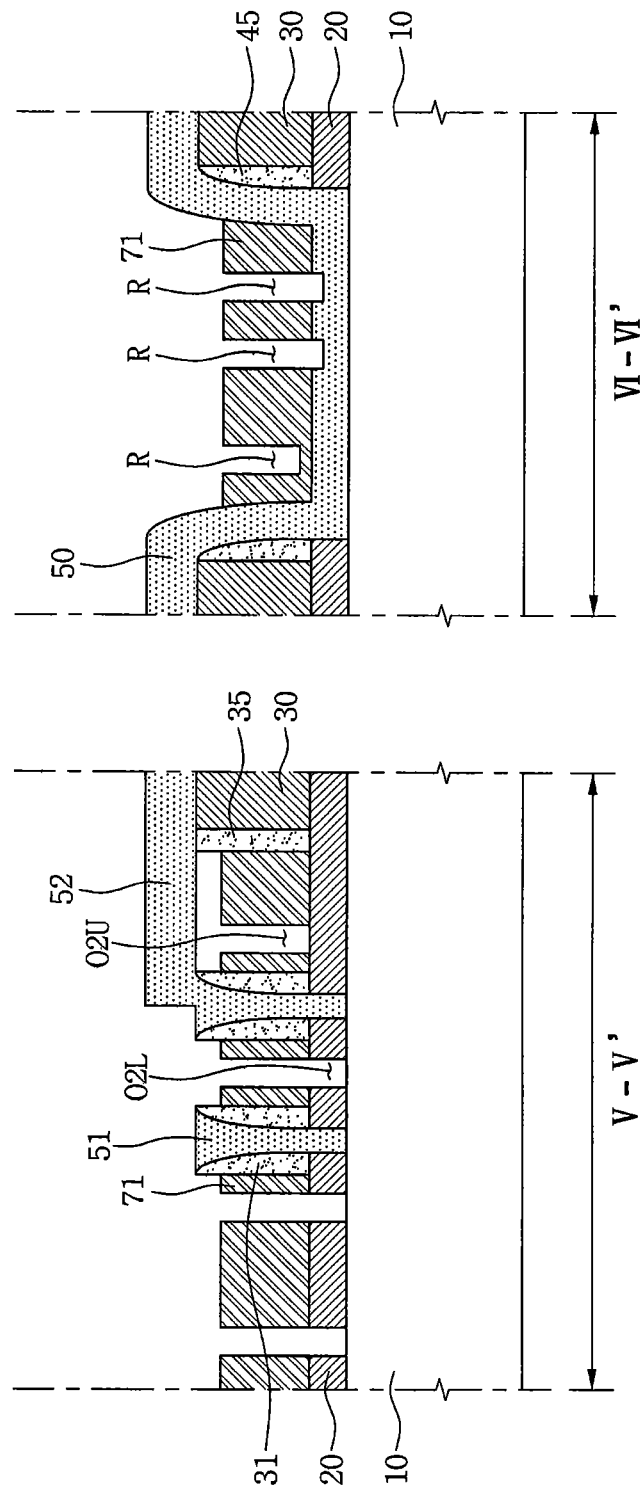

Referring to FIGS. 24A and 24B, the method may include performing processes similar to the processes described with reference to FIGS. 9A and 10A: removing the second polymer blocks 72 to form second upper openings O2U exposing a surface of the stopper layer 20 in the cell area CA; and selectively removing the stopper layer 20 exposed in the second upper openings O2U using the first polymer blocks 71 as an etch mask to form second lower openings O2L exposing the target layer 10. The second lower openings O2L may not be formed below the eaves pattern 52 in the edge area EA. In the peripheral area PA, recesses R may be formed in the first polymer block 71 and the pillar material layer 50.

Figure 25A:
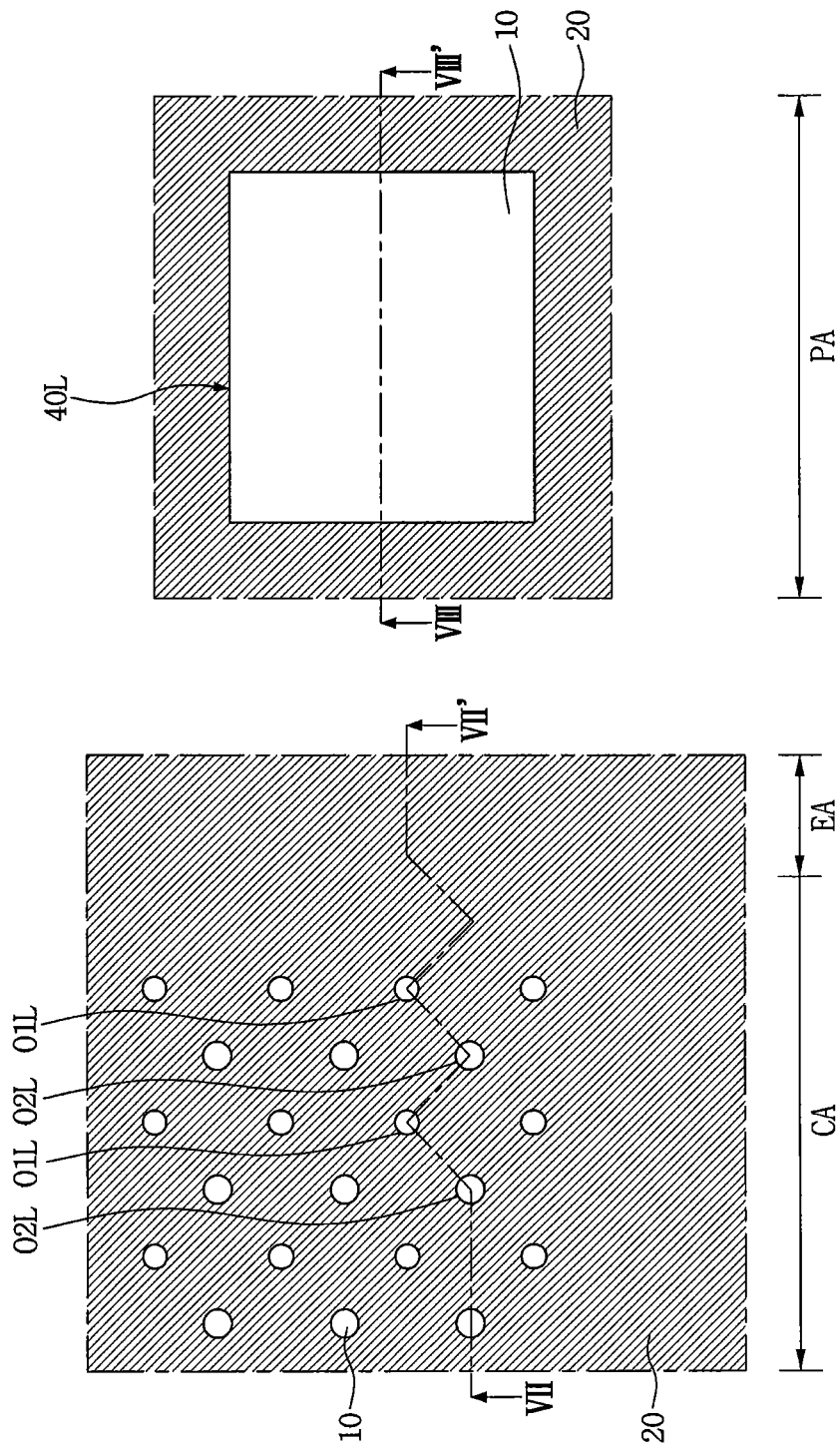

Referring to FIGS. 25A and 25B, the method may include performing processes similar to the processes described with reference to FIG. 11A to remove the first polymer blocks 71, the pillar patterns 51, the eaves pattern 52, the dam pattern 35, the pillar material layer 50, and the trench spacer 45, and further remove the hard mask 30. The stopper layer 20 may include the first lower openings O1L exposing the target layer 10 and the second lower openings O2L in the cell area CA, and the lower peripheral trench 40L exposing the target layer 10 in the peripheral area PA.

Figure 25C:
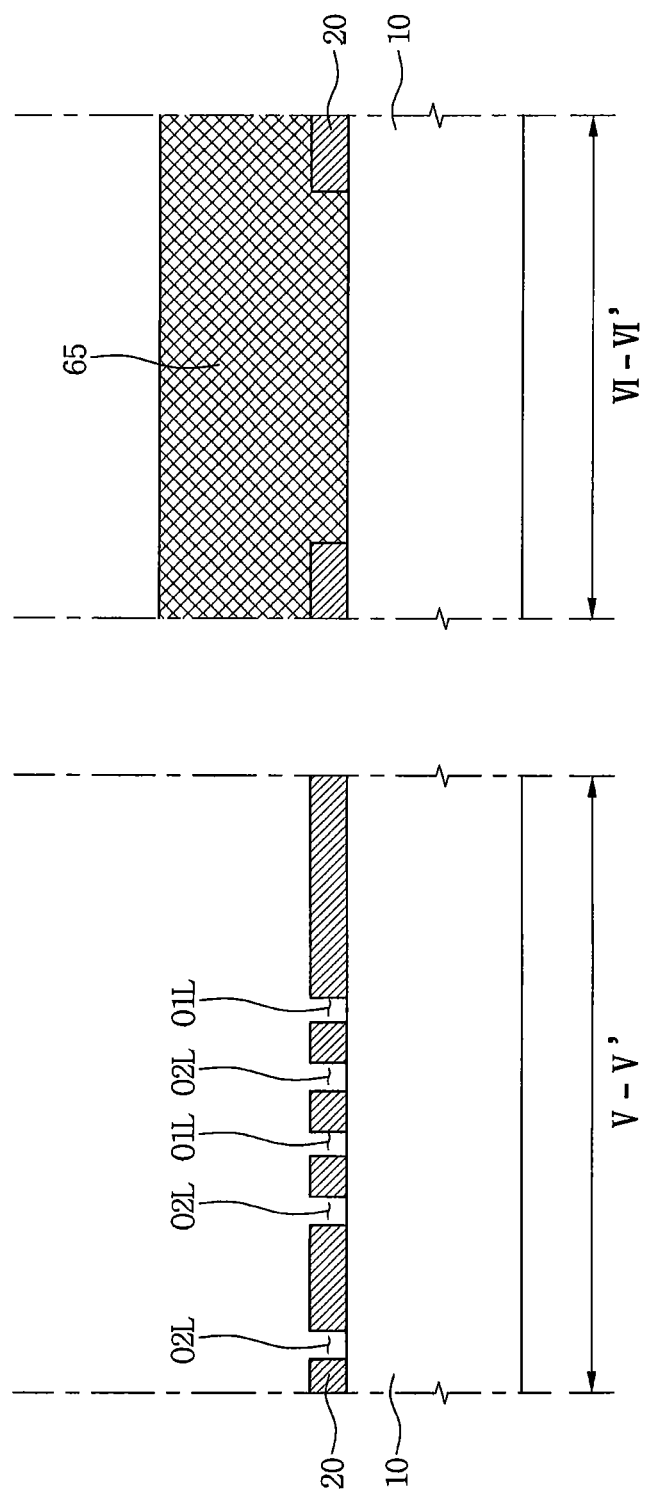

Referring to FIG. 25C, the method may further include forming a peripheral mask 65 covering the peripheral area PA. The peripheral mask may include a photoresist.

Figure 26A:
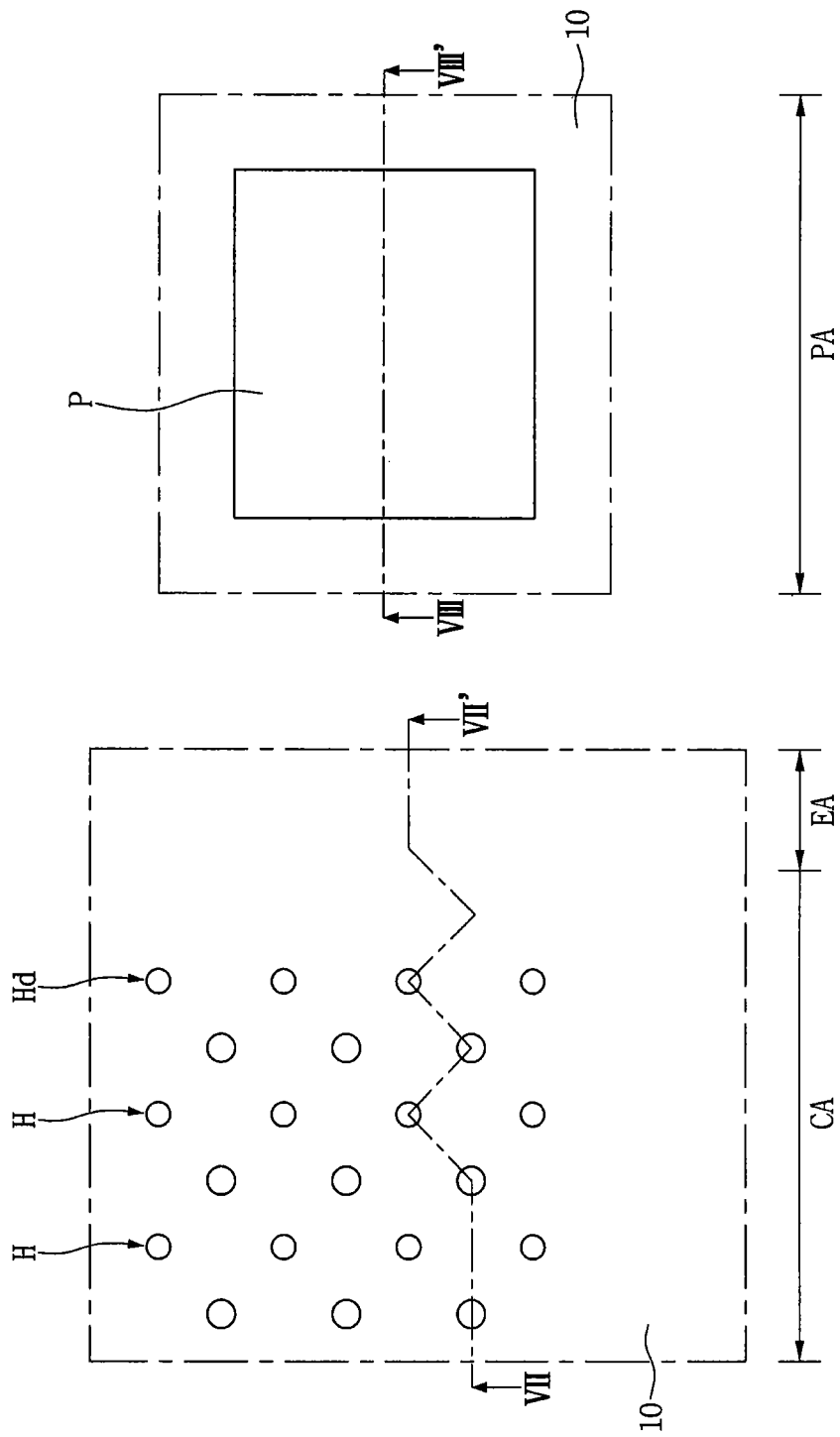
Figure 26B:
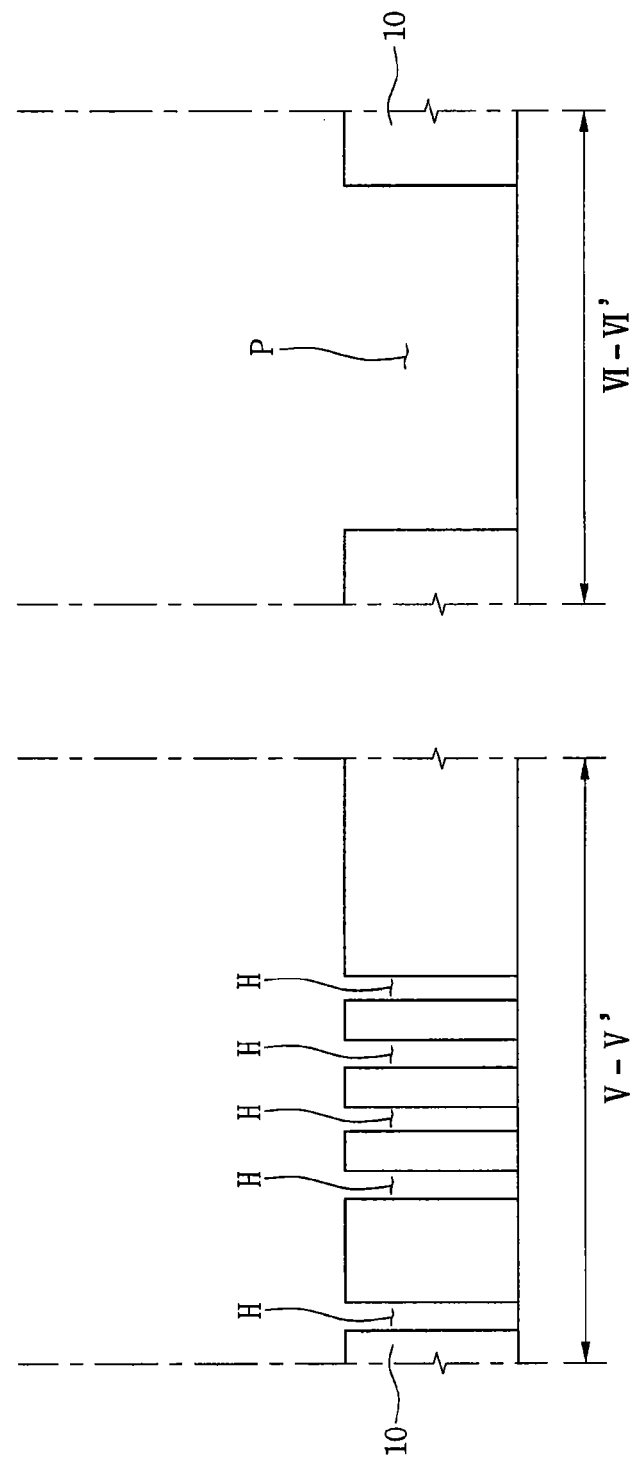

Referring to FIGS. 26A and 26B, the method may include performing processes similar to the processes described with reference to FIG. 12A, etching the target layer 10 using the stopper layer 20 as an etch mask to form contact holes H, and removing the stopper layer 20. The contact holes H may be regularly spaced in a lattice pattern in the cell area CA, dummy contact holes Hd may be disposed every two rows and/or every two columns in the edge area EA, and a peripheral pattern P may be disposed in the peripheral area PA.

Figure 26C:
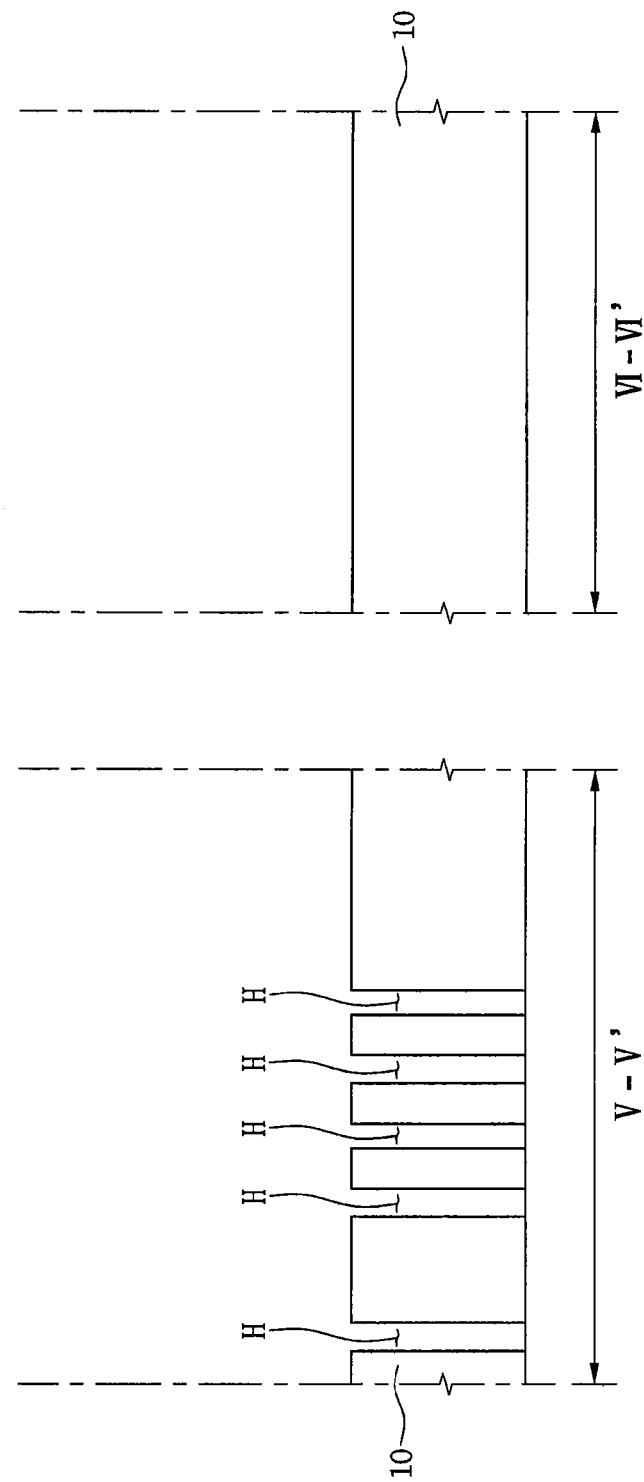

Referring to FIG. 26C, no patterns may be disposed in the peripheral area PA due to the peripheral mask 65.

Figure 27:
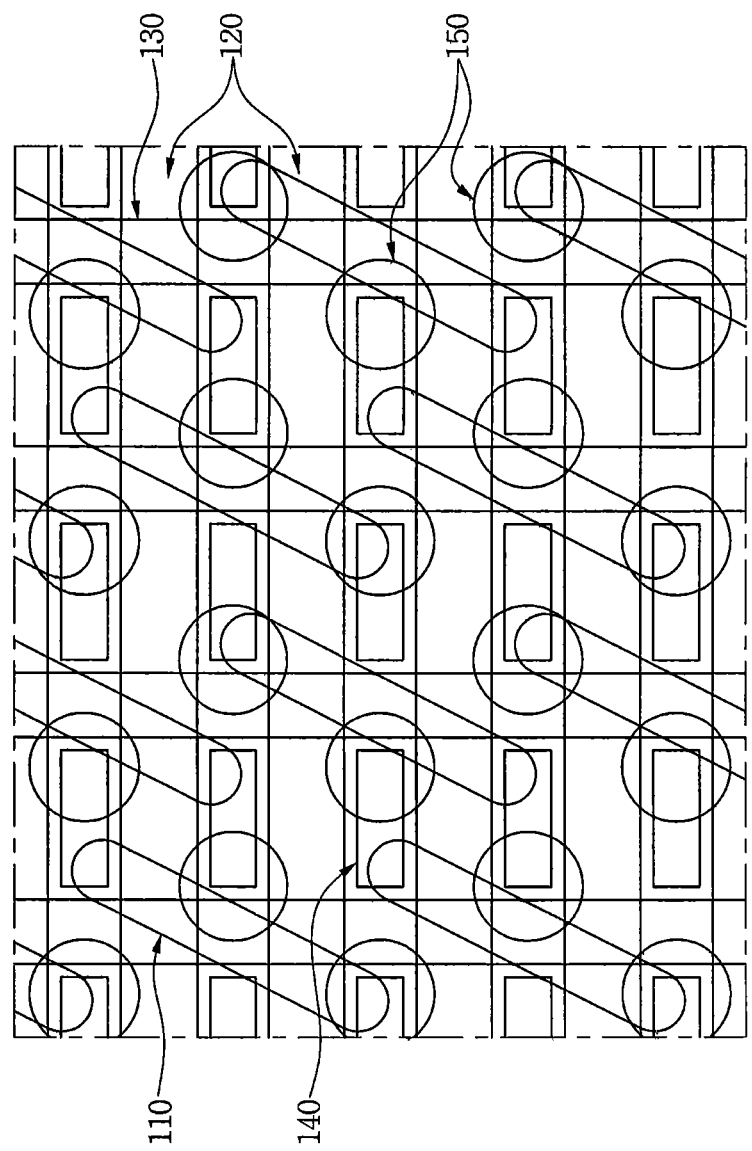
FIGS. 27 and 28 illustrate layouts of semiconductor devices formed using methods according to some embodiments of the inventive concepts.
Figure 28:
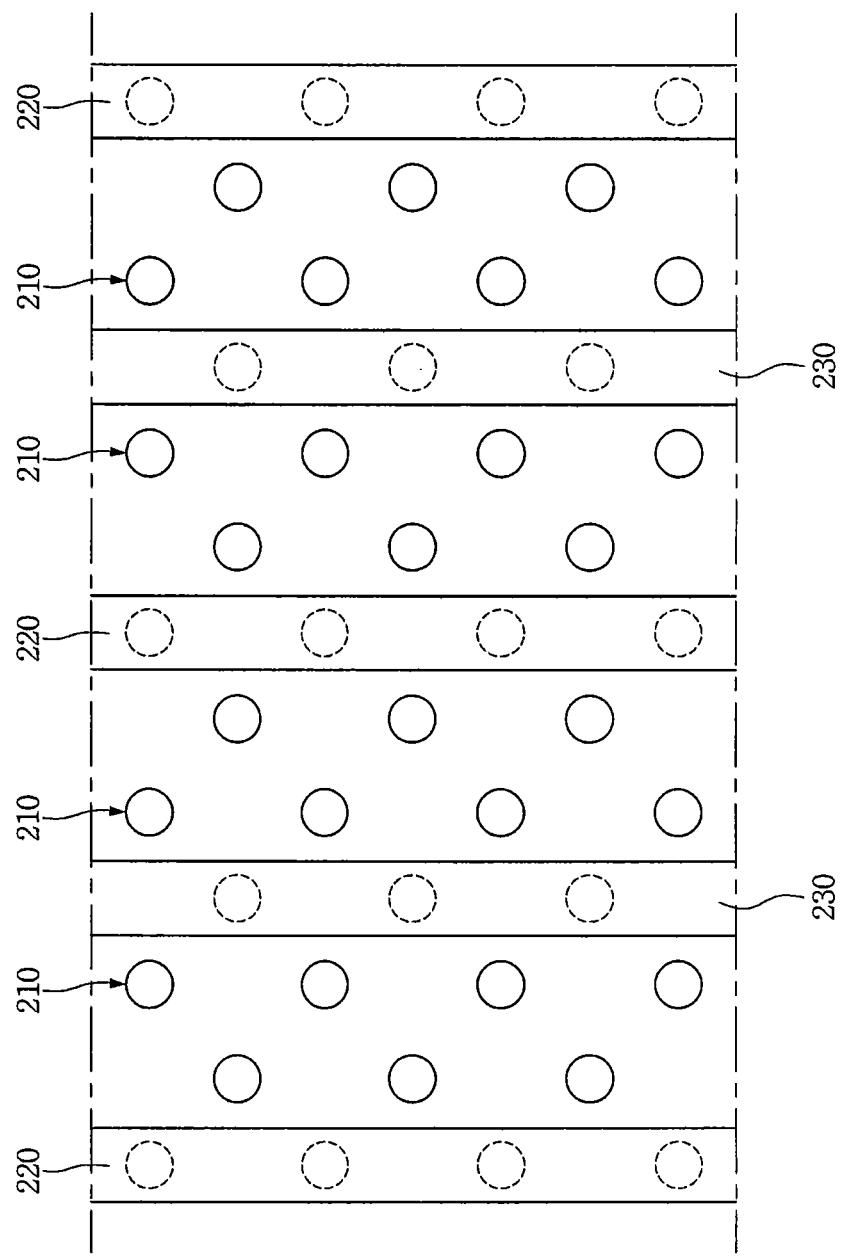

FIGS. 27 and 28 illustrate layouts of the semiconductor devices fabricated by a method according to some embodiments of the inventive concepts. For example, FIG. 27 illustrates a layout of a DRAM semiconductor device, and FIG. 28 illustrates a layout of vertical channel holes of a vertical NAND memory device.

Referring to FIG. 27, a semiconductor device in accordance with some embodiments of the inventive concepts may include active regions 110 having bar shapes arranged diagonally, gate lines 120 crossing the active regions 110 and extending in a first direction, bit lines 130 crossing the active regions 110 and extending in a second direction, contact pads 140 overlapping both end portions of the active regions 110, and storage contacts 150 overlapping both end portions of the active regions 110 or at least one of the contact pads 140. The storage contacts 150 may have the honeycomb type arrangement in accordance with the embodiment of the inventive concepts.

Referring to FIG. 28, a vertical NAND memory device in accordance with some embodiments of the inventive concepts may include channel holes 210 arranged in a zigzag pattern, word line cuts 220 overlapping first portions of the channel holes 210 and extending in a first direction, and string select line cuts 230 disposed between the word line cuts 220, overlapping second portions of the channel holes 210, and extending in parallel with the word line cuts 220. The channel holes 210 may be formed to be arranged in a zigzag pattern in accordance with some embodiments of the inventive concepts.

Figure 29A:
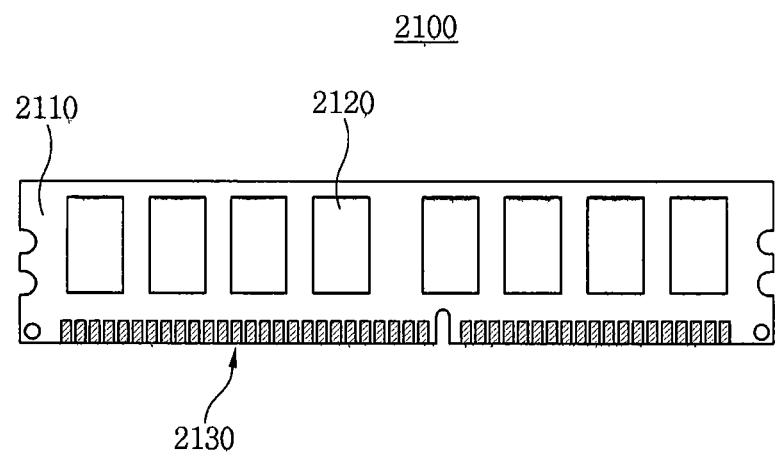
FIG. 29A is a diagram conceptually showing a memory module including at least one semiconductor device in accordance with various embodiments of the inventive concepts.

FIG. 29A is a diagram conceptually showing a memory module 2100 including at least one semiconductor device in accordance with various embodiments of the inventive concepts. Referring to FIG. 29A, the memory module 2100 in accordance with some embodiments of the inventive concepts may include a module substrate 2110, a plurality of memory devices 2120 disposed on the module substrate 2110, and a plurality of terminals 2130 arranged on a side of the module substrate 2110. The module substrate 2110 may include, for example, a printed circuit board (PCB). The memory devices 2120 may include at least one semiconductor device formed using a method in accordance with various embodiments of the inventive concepts. The plurality of terminals 2130 may include a metal such as copper. Each of the terminals 2130 may be electrically connected with each of the memory devices 2120.

Figure 29B:
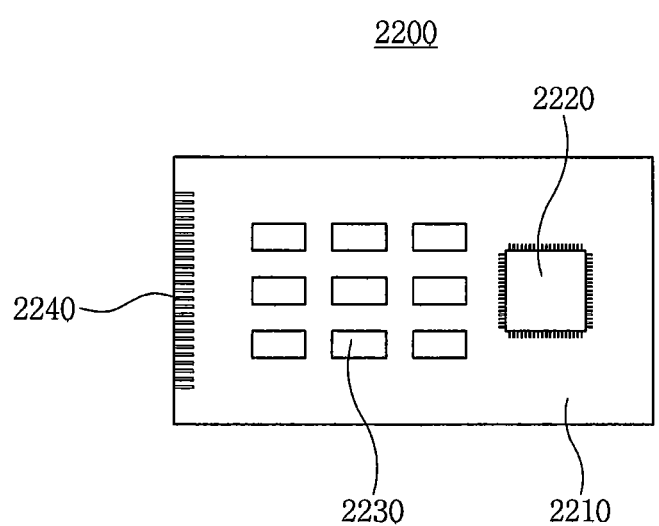
FIG. 29B is a diagram conceptually showing a semiconductor module in accordance with some embodiments of the inventive concepts.

FIG. 29B is a diagram conceptually showing a semiconductor module 2200 in accordance with some embodiments of the inventive concepts. Referring to FIG. 29B, the semiconductor module 2200 in accordance with some embodiments of the inventive concepts may include a processor 2220 mounted on a module substrate 2210, and semiconductor devices 2230. The processor 2220 or the semiconductor devices 2230 may include at least one semiconductor device formed using a method in accordance with various embodiments of the inventive concepts. Conductive input/output terminals 2240 may be disposed on at least one side of the module substrate 2210.

Figure 29C:
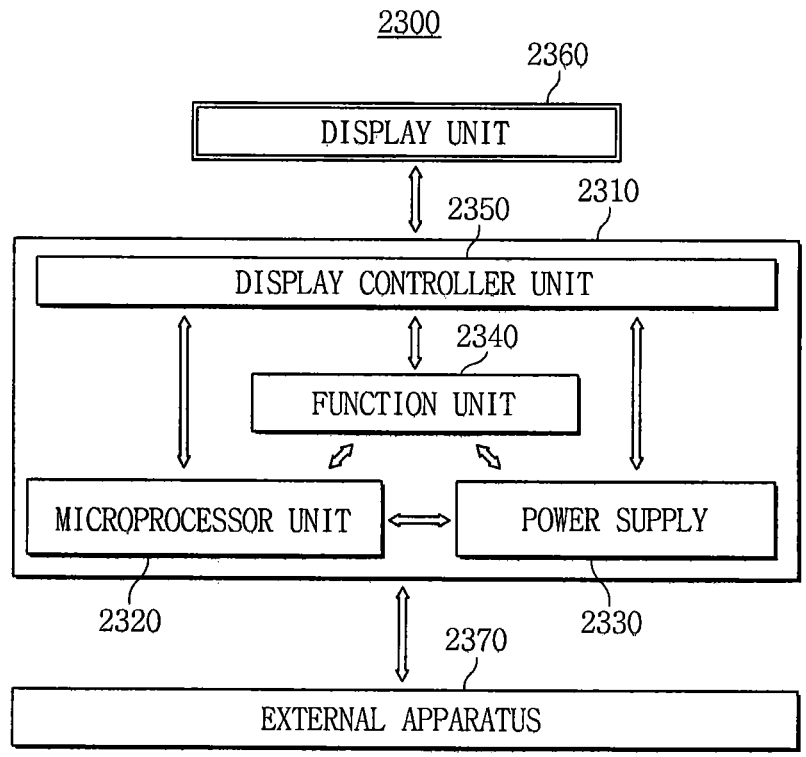
FIGS. 29C and 29D are block diagrams conceptually showing electronic systems in accordance with some embodiments of the inventive concepts.

FIG. 29C is a block diagram conceptually showing an electronic system 2300 in accordance with some embodiments of the inventive concepts. Referring to FIG. 29C, the electronic system 2300 in accordance with some embodiments of the inventive concepts may include a body 2310, a display unit 2360, and an external apparatus 2370. The body 2310 may include a microprocessor unit 2320, a power supply 2330, a function unit 2340, and/or a display controller unit 2350. The body 2310 may include a system board or motherboard including a PCB and/or a case. The microprocessor unit 2320, the power supply 2330, the function unit 2340, and the display controller unit 2350 may be mounted or disposed on an upper surface or an inside of the body 2310. The display unit 2360 may be disposed on the upper surface of the body 2310 or inside/outside of the body 2310. The display unit 2360 may display an image processed by the display controller unit 2350. For example, the display unit 2360 may include a liquid crystal display (LCD), an active matrix organic light emitting diode (AMOLED), or various display panels. The display unit 2360 may include a touch screen. Accordingly, the display unit 2360 may include an input/output function. The power supply 2330 may supply a current and/or voltage to the microprocessor unit 2320, the function unit 2340, the display controller unit 2350, etc. The power supply 2330 may include a rechargeable battery, a socket for the battery, or a voltage/current converter. The microprocessor unit 2320 may receive a voltage from the power supply 2330 to control the function unit 2340 and the display unit 2360. For example, the microprocessor unit 2320 may include a CPU or an application processor (AP). The function unit 2340 may include a touch-pad, a touch-screen, a volatile/nonvolatile memory, a memory card controller, a camera, a lighting, an audio and video playback processor, a wireless transmission/reception antenna, a speaker, a microphone, a USB port, and other units having various functions. The microprocessor unit 2320 or the function unit 2340 may include at least one semiconductor device formed using a method in accordance with various embodiments of the inventive concepts.

Figure 29D:
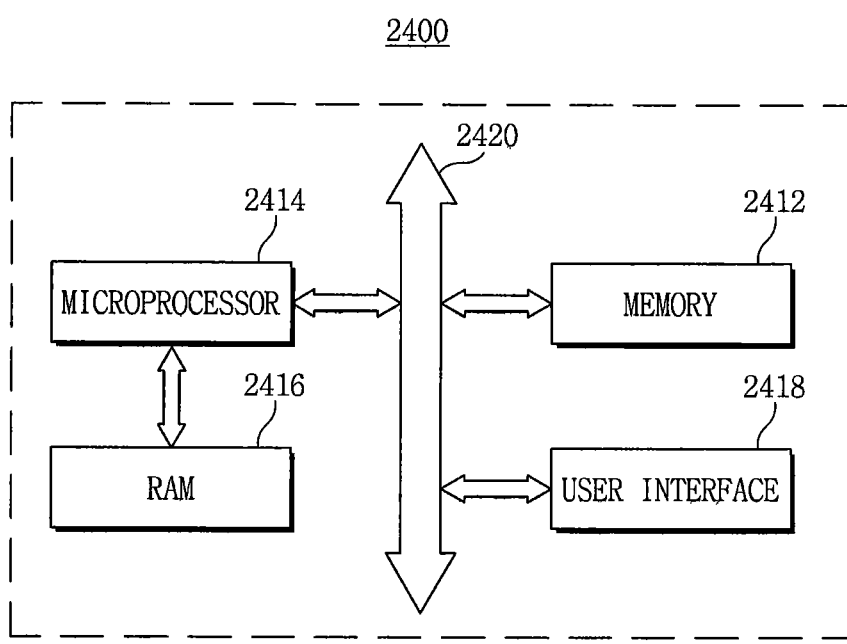

FIG. 29D is a block diagram conceptually showing an electronic system 2400 in accordance with some embodiments of the inventive concepts. Referring to FIG. 29D, the electronic system 2400 in accordance with some embodiments of the inventive concepts may include a microprocessor 2414, a memory 2412, and a user interface 2418 which performs data communication using a bus 2420. The microprocessor 2414 may include a CPU or an AP. The electronic system 2400 may further include a random access memory (RAM) 2416 which directly communicates with the microprocessor 2414. The microprocessor 2414 and/or the RAM 2416 may be assembled in a single package. The user interface 2418 may be used to input data to or output data from the electronic system 2400. For example, the user interface 2418 may include a touch-pad, a touch-screen, a keyboard, a mouse, a scanner, a voice detector, a cathode ray tube (CRT) monitor, an LCD, an AMOLED, a plasma display panel (PDP), a printer, a lighting, or various other input/output devices. The memory 2412 may store codes for operating the microprocessor 2414, data processed by the microprocessor 2414, or external input data. The memory 2412 may include a memory controller, a hard disk, or a solid state drive (SSD). The microprocessor 2414, the RAM 2416, and/or the memory 2412 may include at least one semiconductor device formed using a method in accordance with various embodiments of the inventive concepts.

Although a few example embodiments have been described, those skilled in the art will readily appreciate that many modifications are possible without materially departing from the inventive concepts. Accordingly, all such modifications are intended to be included within the scope of the inventive concepts as defined in the claims.

According to some embodiments of the inventive concepts, the contact hole may be formed in the cell area but may not be formed in the edge area and peripheral area.

According to some embodiments of the inventive concepts, unnecessary patterns may not be formed in the edge area and the peripheral area.

The above-disclosed subject matter is to be considered illustrative, and not restrictive, and the appended claims are intended to cover all such modifications, enhancements, and other embodiments, which fall within the true spirit and scope of the inventive concepts. Thus, to the maximum extent allowed by law, the scope is to be determined by the broadest permissible interpretation of the following claims and their equivalents, and shall not be restricted or limited by the foregoing detailed description.

What is claimed is:

1. A method of fabricating a semiconductor device, the method comprising:
    forming a target layer comprising a cell area and an edge area on a side of the cell area;
    forming a stopper layer on the target layer;
    forming a hard mask comprising first upper openings and a dam trench on the stopper layer;
    forming opening spacers on respective inner walls of the first upper openings and forming a dam pattern in the dam trench;
    removing the stopper layer exposed in the first upper openings to form first lower openings in the stopper layer, the first lower openings exposing the target layer;
    forming pillar patterns in the first lower openings and the first upper openings and forming an eaves pattern on the dam pattern;
    removing the hard mask in the cell area;
    forming a first polymer block and second polymer blocks between the pillar patterns;
    removing the second polymer blocks to form second upper openings;
    etching the stopper layer exposed in the second upper openings to form second lower openings in the stopper layer; and
    removing the first polymer block, the pillar patterns, the dam pattern, and the eaves pattern.

2. The method of claim 1, wherein the first upper openings are formed in the cell area, and the dam trench is formed in the edge area.

3. The method of claim 1, wherein the opening spacers, the pillar patterns, the dam pattern and the eaves pattern comprise the same material.

4. The method of claim 1, wherein the dam pattern comprises a first side facing the cell area and a second side that is opposite the first side, and
    wherein removing the hard mask in the cell area leaves the hard mask formed on the second side of the dam pattern.

5. The method of claim 1, wherein the eaves pattern extends from the dam pattern to the cell area.

6. The method of claim 5, wherein the second lower openings are not formed in the stopper layer below the eaves pattern.

7. The method of claim 5, wherein the first upper openings are formed between the dam pattern and the pillar patterns.

8. The method of claim 5, wherein the second lower openings are not formed between the dam pattern and the pillar patterns.

9. A method of forming contact holes, the method comprising:
    forming a target layer comprising a cell area, an edge area on a side of the cell area and a peripheral area spaced apart from the edge area;
    forming a stopper layer on the target layer;
    forming a hard mask on the stopper layer, the hard mask comprising first upper openings exposing the stopper layer in the cell area, a dam trench in the edge area, and an upper peripheral trench in the peripheral area;
    etching the stopper layer exposed in the first upper openings to form first lower openings in the stopper layer;
    forming pillar patterns in the first upper openings and the first lower openings, forming a dam pattern in the dam trench and forming a pillar material layer in the upper peripheral trench;
    removing the hard mask in the cell area to expose the stopper layer;
    forming a block copolymer layer on the stopper layer between the pillar patterns and between the dam pattern and the pillar patterns and on the pillar material layer in the upper peripheral trench;
    annealing the block copolymer layer to form a first polymer block and second polymer blocks;
    removing the second polymer blocks to form second upper openings in the first polymer block;
    etching the stopper layer using the first polymer block and the pillar patterns as an etch mask to form second lower openings in the stopper layer; and
    removing the first polymer block, the pillar patterns, the dam pattern, the pillar material layer and the hard mask.

10. The method of claim 9, wherein the upper peripheral trench is wider than the dam trench.

11. The method of claim 9, wherein the pillar patterns, the dam pattern, and the pillar material layer comprise the same material.

12. The method of claim 9, wherein the second polymer blocks are regularly spaced between the pillar patterns in the cell area and irregularly spaced on the pillar material layer in the upper peripheral trench.

13. A method of forming a semiconductor device comprising:
    forming a target layer;
    forming a stopper layer on the target layer, the stopper layer comprising a first portion and a second portion adjacent the first portion;
    forming pillar patterns on the first portion of the stopper layer;
    forming a mask layer on the second portion of the stopper layer;
    forming a polymer block between the pillar patterns, the polymer block comprising polymer block openings that expose the stopper layer;
    etching the stopper layer using the pillar patterns, the polymer block and the mask layer as an etch mask to form stopper openings in the first portion of the stopper layer;
    removing the pillar patterns, the polymer block and the mask layer; and
    etching the target layer using the stopper layer comprising the stopper openings to form an opening in the target layer.

14. The method of claim 13, wherein the pillar patterns and the mask layer are formed concurrently and comprise a same material.

15. The method of claim 13, wherein forming the polymer block comprises:
forming a block copolymer layer between the pillar patterns;
separating the block copolymer layer into the polymer block and a plurality of polymer block patterns; and
removing the plurality of polymer block patterns to form the polymer block openings in the polymer block.

16. The method of claim 13, wherein the mask layer comprises a first mask layer, and the stopper openings comprise first stopper openings, and
wherein forming the pillar patterns and forming the first mask layer comprises:
forming a second mask layer on the stopper layer, the second mask layer comprising mask openings that expose the stopper layer;
forming spacers on respective sides of the mask openings;
etching the stopper layer using the second mask layer and the spacers as an etch mask to form second stopper openings in the stopper layer;
forming a pillar material layer in the mask openings and the second stopper openings;
forming a third mask layer on the pillar material layer that is formed on the second portion of the stopper layer;
etching the pillar material layer until the second mask layer is exposed using the third mask layer as an etch mask to form the pillar patterns in the mask openings and to form the first mask layer on the second portion of the stopper layer; and
removing the second mask layer.

17. The method of claim 16, further comprising removing the spacers before etching the target layer,
wherein the opening in the target layer comprises first openings, and
wherein etching the target layer comprises etching the target layer using the stopper layer comprising the first and second stopper openings to form the first openings and second openings in the target layer.

18. The method of claim 16, wherein the second mask layer further comprises a dam trench that is disposed on and exposes the second portion of the stopper layer,
wherein the method further comprises forming a dam pattern in the dam trench concurrently with forming the spacers, and the dam pattern comprises a first side facing the first portion of the stopper layer and a second side opposite the first side,
wherein the first mask layer is formed on the dam pattern, and
wherein removing the second mask layer comprises removing the second mask layer formed on the first side of the dam pattern and leaving the second mask layer formed on the second side of the dam pattern.

19. The method of claim 18, wherein removing the second mask layer formed on the first side of the dam pattern comprises forming a space defined by the dam pattern and the first mask layer, and
wherein the polymer block is formed in the space defined by the dam pattern and the first mask layer.

20. The method of claim 16, wherein the stopper layer comprises a third portion that is different from the first and second portions of the stopper layer,
wherein the second mask layer comprises an upper trench that is disposed on and exposes the third portion of the stopper layer,
wherein the method further comprises:
forming a trench spacer on a side of the upper trench concurrently with forming the spacers; and
etching the stopper layer using the second mask layer and the trench spacer as an etch mask to form a lower trench in the third portion of the stopper layer concurrently with forming the second stopper openings in the stopper layer,
wherein forming the pillar material layer comprises forming the pillar material layer in the lower trench, and
wherein forming the polymer block comprises forming the polymer block on the pillar material layer formed in the lower trench such that the pillar material layer is between the polymer block and the target layer.

* * * * *